United States Patent
Bryzek et al.

(10) Patent No.: US 9,856,132 B2
(45) Date of Patent: *Jan. 2, 2018

(54) SEALED PACKAGING FOR MICROELECTROMECHANICAL SYSTEMS

(75) Inventors: Janusz Bryzek, Oakland, CA (US); John Gardner Bloomsburgh, Oakland, CA (US); Cenk Acar, Newport Coast, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/821,589

(22) PCT Filed: Sep. 18, 2011

(86) PCT No.: PCT/US2011/052060
§ 371 (c)(1),
(2), (4) Date: Jun. 24, 2013

(87) PCT Pub. No.: WO2012/037537
PCT Pub. Date: Mar. 22, 2012

(65) Prior Publication Data
US 2013/0270660 A1   Oct. 17, 2013

Related U.S. Application Data

(60) Provisional application No. 61/384,242, filed on Sep. 18, 2010, provisional application No. 61/384,243, (Continued)

(51) Int. Cl.
*B81B 3/00* (2006.01)
*H01L 29/84* (2006.01)
(Continued)

(52) U.S. Cl.
CPC .......... *B81B 3/0021* (2013.01); *B81B 3/0072* (2013.01); *B81B 7/0016* (2013.01);
(Continued)

(58) Field of Classification Search
CPC ... B81B 3/0021; B81B 3/0071; B81B 7/0016; B81B 7/0051; B81C 1/00238;
(Continued)

(56) References Cited

U.S. PATENT DOCUMENTS 3,231,729 A   1/1966   Stern
4,511,848 A   4/1985   Watson
(Continued)

FOREIGN PATENT DOCUMENTS

CN   1068444 A   1/1993
CN   1198587 A   11/1998
(Continued)

OTHER PUBLICATIONS

"U.S. Appl. No. 12/849,742, Notice of Allowance dated Nov. 29, 2013", 7 pgs.
(Continued)

*Primary Examiner* — Fernando L Toledo
*Assistant Examiner* — Lawrence-Linh T Nguyen
(74) *Attorney, Agent, or Firm* — Brake Hughes Bellermann LLP

(57) ABSTRACT

One example includes an integrated circuit including at least one electrical interconnects disposed on an elongate are extending away from a main portion of the integrated circuit and a microelectromechanical layer including an oscillating portion, the microelectromechanical layer coupled to the main portion of the integrated circuit, wherein the microelectromechanical layer includes a cap comprising a membrane that extends to the integrated circuit.

20 Claims, 27 Drawing Sheets

Related U.S. Application Data filed on Sep. 18, 2010, provisional application No. 61/384,244, filed on Sep. 18, 2010.

(51) Int. Cl.
  *B81C 1/00* (2006.01)
  *B81B 7/00* (2006.01)

(52) U.S. Cl.
  CPC ........ *B81B 7/0051* (2013.01); *B81C 1/00238* (2013.01); *B81C 1/00301* (2013.01); *H01L 29/84* (2013.01); *B81C 2201/019* (2013.01); *B81C 2203/0785* (2013.01); *H01L 2224/16145* (2013.01); *H01L 2224/16245* (2013.01); *H01L 2224/32145* (2013.01); *H01L 2224/32245* (2013.01); *H01L 2224/48247* (2013.01); *H01L 2224/73204* (2013.01); *H01L 2224/73265* (2013.01); *H01L 2924/181* (2013.01)

(58) Field of Classification Search
  CPC .......... B81C 1/00301; B81C 2201/019; B81C 2203/0785; H01L 29/84; H01L 2224/16145; H01L 2224/16245; H01L 2224/32245; H01L 2224/48247; H01L 2224/73204; H01L 2224/73265
  USPC .......... 257/678–733, E23.001–E23.194, 704, 257/924, E23.128, E23.18–E23.193, 693, 257/700–705, 708–710, 37, 774, E21.32, 257/E21.561, E21.564, E21.7, E21.703
  See application file for complete search history.

(56) References Cited

U.S. PATENT DOCUMENTS

| | | | |
|---|---|---|---|
| 4,896,156 | A | 1/1990 | Garverick |
| 5,481,914 | A | 1/1996 | Ward |
| 5,487,305 | A | 1/1996 | Ristic et al. |
| 5,491,604 | A | 2/1996 | Nguyen et al. |
| 5,600,064 | A | 2/1997 | Ward |
| 5,656,778 | A | 8/1997 | Roszhart |
| 5,659,195 | A | 8/1997 | Kaiser et al. |
| 5,703,292 | A | 12/1997 | Ward |
| 5,723,790 | A | 3/1998 | Andersson |
| 5,751,154 | A | 5/1998 | Tsugai |
| 5,760,465 | A | 6/1998 | Alcoe et al. |
| 5,765,046 | A | 6/1998 | Watanabe et al. |
| 5,894,091 | A | 4/1999 | Kubota |
| 5,912,499 | A | 6/1999 | Diem et al. |
| 5,992,233 | A | 11/1999 | Clark |
| 6,131,457 | A | 10/2000 | Sato |
| 6,214,644 | B1 | 4/2001 | Glenn |
| 6,230,566 | B1 | 5/2001 | Lee et al. |
| 6,236,096 | B1 | 5/2001 | Chang et al. |
| 6,250,157 | B1 | 6/2001 | Touge |
| 6,253,612 | B1 | 7/2001 | Lemkin et al. |
| 6,301,965 | B1 | 10/2001 | Chu et al. |
| 6,351,996 | B1 | 3/2002 | Nasiri et al. |
| 6,366,468 | B1 | 4/2002 | Pan |
| 6,370,937 | B2 | 4/2002 | Hsu |
| 6,390,905 | B1 | 5/2002 | Korovin et al. |
| 6,501,282 | B1 | 12/2002 | Dummermuth et al. |
| 6,504,385 | B2 | 1/2003 | Hartwell |
| 6,516,651 | B1 | 2/2003 | Geen |
| 6,553,835 | B1 | 4/2003 | Hobbs et al. |
| 6,629,448 | B1 | 10/2003 | Cvancara |
| 6,654,424 | B1 | 11/2003 | Thomae et al. |
| 6,664,941 | B2 | 12/2003 | Itakura et al. |
| 6,722,206 | B2 | 4/2004 | Takada |
| 6,725,719 | B2 | 4/2004 | Cardarelli |
| 6,737,742 | B2 | 5/2004 | Sweterlitsch |
| 6,781,231 | B2 | 8/2004 | Minervini et al. |
| 6,848,304 | B2 | 2/2005 | Geen |
| 7,051,590 | B1 | 5/2006 | Lemkin et al. |
| 7,054,778 | B2 | 5/2006 | Geiger et al. |
| 7,093,487 | B2 | 8/2006 | Mochida |
| 7,166,910 | B2 | 1/2007 | Minervini et al. |
| 7,173,402 | B2 | 2/2007 | Chen et al. |
| 7,202,552 | B2 | 4/2007 | Zhe et al. |
| 7,210,351 | B2 | 5/2007 | Lo et al. |
| 7,216,525 | B2 | 5/2007 | Schroeder |
| 7,221,767 | B2 | 5/2007 | Mullenborn et al. |
| 7,240,552 | B2 | 7/2007 | Acar et al. |
| 7,258,011 | B2 | 8/2007 | Nasiri et al. |
| 7,258,012 | B2 | 8/2007 | Xie et al. |
| 7,266,349 | B2 | 9/2007 | Kappes |
| 7,293,460 | B2 | 11/2007 | Zarabadi et al. |
| 7,301,212 | B1 | 11/2007 | Mian et al. |
| 7,305,880 | B2 | 12/2007 | Caminada et al. |
| 7,339,384 | B2 | 3/2008 | Peng et al. |
| 7,358,151 | B2 | 4/2008 | Araki et al. |
| 7,436,054 | B2 | 10/2008 | Zhe |
| 7,444,869 | B2 | 11/2008 | Johnson et al. |
| 7,449,355 | B2 | 11/2008 | Lutz et al. |
| 7,451,647 | B2 | 11/2008 | Matsuhisa et al. |
| 7,454,967 | B2 | 11/2008 | Skurnik |
| 7,481,110 | B2 | 1/2009 | Handrich et al. |
| 7,518,493 | B2 | 4/2009 | Bryzek et al. |
| 7,539,003 | B2 | 5/2009 | Curtis |
| 7,544,531 | B1 | 6/2009 | Grosjean |
| 7,565,839 | B2 | 7/2009 | Stewart et al. |
| 7,595,648 | B2 | 9/2009 | Ungaretti et al. |
| 7,600,428 | B2 | 10/2009 | Robert et al. |
| 7,616,078 | B2 | 11/2009 | Prandi et al. |
| 7,622,782 | B2 | 11/2009 | Chu et al. |
| 7,694,563 | B2 | 4/2010 | Durante et al. |
| 7,706,149 | B2 | 4/2010 | Yang et al. |
| 7,781,249 | B2 | 8/2010 | Laming et al. |
| 7,795,078 | B2 | 9/2010 | Ramakrishna et al. |
| 7,817,331 | B2 | 10/2010 | Moidu |
| 7,851,925 | B2 | 12/2010 | Theuss et al. |
| 7,859,352 | B2 | 12/2010 | Sutton |
| 7,950,281 | B2 | 5/2011 | Hammerschmidt |
| 7,965,067 | B2 | 6/2011 | Grönthal et al. |
| 8,004,354 | B1 | 8/2011 | Pu et al. |
| 8,006,557 | B2 | 8/2011 | Yin et al. |
| 8,026,771 | B2 | 9/2011 | Kanai et al. |
| 8,037,755 | B2 | 10/2011 | Nagata et al. |
| 8,113,050 | B2 | 2/2012 | Acar et al. |
| 8,171,792 | B2 | 5/2012 | Sameshima |
| 8,201,449 | B2 | 6/2012 | Ohuchi et al. |
| 8,250,921 | B2 | 8/2012 | Nasiri et al. |
| 8,256,290 | B2 | 9/2012 | Mao |
| 8,375,789 | B2 | 2/2013 | Prandi et al. |
| 8,378,756 | B2 | 2/2013 | Huang et al. |
| 8,421,168 | B2 | 4/2013 | Allen et al. |
| 8,476,970 | B2 | 7/2013 | Mokhtar et al. |
| 8,497,746 | B2 | 7/2013 | Visconti et al. |
| 8,508,290 | B2 | 8/2013 | Elsayed et al. |
| 8,643,382 | B2 | 2/2014 | Steele et al. |
| 8,661,898 | B2 | 3/2014 | Watson |
| 8,710,599 | B2 | 4/2014 | Marx et al. |
| 8,739,626 | B2 | 6/2014 | Acar |
| 8,742,964 | B2 | 6/2014 | Kleks et al. |
| 8,754,694 | B2 | 6/2014 | Opris et al. |
| 8,763,459 | B2 | 7/2014 | Brand et al. |
| 8,813,564 | B2 | 8/2014 | Acar |
| 8,978,475 | B2 | 3/2015 | Acar |
| 9,003,882 | B1 | 4/2015 | Ayazi et al. |
| 9,006,846 | B2 | 4/2015 | Bryzek et al. |
| 9,052,335 | B2 | 6/2015 | Coronato et al. |
| 9,062,972 | B2 | 6/2015 | Acar et al. |
| 9,069,006 | B2 | 6/2015 | Opris et al. |
| 9,094,027 | B2 | 7/2015 | Tao et al. |
| 9,095,072 | B2 | 7/2015 | Bryzek et al. |
| 9,156,673 | B2 * | 10/2015 | Bryzek .................. H01L 29/84 |
| 9,246,018 | B2 | 1/2016 | Acar |
| 9,278,845 | B2 | 3/2016 | Acar |
| 9,278,846 | B2 | 3/2016 | Acar |
| 9,352,961 | B2 | 5/2016 | Acar et al. |
| 9,425,328 | B2 | 8/2016 | Marx et al. |
| 9,444,404 | B2 | 9/2016 | Opris et al. |
| 9,455,354 | B2 | 9/2016 | Acar |

(56) References Cited

U.S. PATENT DOCUMENTS

| | | |
|---|---|---|
| 9,488,693 B2 | 11/2016 | Kleks et al. |
| 2001/0022106 A1 | 9/2001 | Kato et al. |
| 2002/0021059 A1 | 2/2002 | Knowles et al. |
| 2002/0083757 A1 | 7/2002 | Geen |
| 2002/0117728 A1 | 8/2002 | Brosnihan et al. |
| 2002/0178831 A1 | 12/2002 | Takada |
| 2002/0189352 A1 | 12/2002 | Reeds, III et al. |
| 2002/0196445 A1 | 12/2002 | Mcclary et al. |
| 2003/0033850 A1 | 2/2003 | Challoner et al. |
| 2003/0038415 A1 | 2/2003 | Anderson et al. |
| 2003/0061878 A1 | 4/2003 | Pinson |
| 2003/0196475 A1 | 10/2003 | Wyse |
| 2003/0200807 A1 | 10/2003 | Hulsing, II |
| 2003/0222337 A1 | 12/2003 | Stewart |
| 2004/0051508 A1 | 3/2004 | Hamon et al. |
| 2004/0056742 A1 | 3/2004 | Dabbaj |
| 2004/0085096 A1 | 5/2004 | Ward et al. |
| 2004/0085784 A1 | 5/2004 | Salama et al. |
| 2004/0088127 A1 | 5/2004 | M'closkey et al. |
| 2004/0119137 A1 | 6/2004 | Leonardi et al. |
| 2004/0177689 A1 | 9/2004 | Cho et al. |
| 2004/0211258 A1 | 10/2004 | Geen |
| 2004/0219340 A1 | 11/2004 | McNeil et al. |
| 2004/0231420 A1 | 11/2004 | Xie et al. |
| 2004/0251793 A1 | 12/2004 | Matushisa |
| 2005/0005698 A1 | 1/2005 | McNeil et al. |
| 2005/0097957 A1 | 5/2005 | Mcneil et al. |
| 2005/0127499 A1 | 6/2005 | Harney et al. |
| 2005/0139005 A1 | 6/2005 | Geen |
| 2005/0189635 A1 | 9/2005 | Humpston et al. |
| 2005/0274181 A1 | 12/2005 | Kutsuna et al. |
| 2006/0032308 A1 | 2/2006 | Acar et al. |
| 2006/0034472 A1 | 2/2006 | Bazarjani et al. |
| 2006/0043608 A1 | 3/2006 | Bernier et al. |
| 2006/0097331 A1 | 5/2006 | Hattori |
| 2006/0112764 A1 | 6/2006 | Higuchi |
| 2006/0137457 A1 | 6/2006 | Zdeblick |
| 2006/0141786 A1 | 6/2006 | Boezen et al. |
| 2006/0207328 A1 | 9/2006 | Zarabadi et al. |
| 2006/0213265 A1 | 9/2006 | Weber et al. |
| 2006/0213266 A1 | 9/2006 | French et al. |
| 2006/0213268 A1 | 9/2006 | Asami et al. |
| 2006/0246631 A1 | 11/2006 | Lutz et al. |
| 2006/0283245 A1 | 12/2006 | Konno et al. |
| 2006/0284979 A1 | 12/2006 | Clarkson |
| 2007/0013052 A1 | 1/2007 | Zhe et al. |
| 2007/0034005 A1 | 2/2007 | Acar et al. |
| 2007/0040231 A1 | 2/2007 | Harney et al. |
| 2007/0042606 A1 | 2/2007 | Wang et al. |
| 2007/0047744 A1 | 3/2007 | Karney et al. |
| 2007/0071268 A1* | 3/2007 | Harney et al. ............... 381/355 |
| 2007/0085544 A1 | 4/2007 | Viswanathan |
| 2007/0099327 A1 | 5/2007 | Hartzell et al. |
| 2007/0113653 A1 | 5/2007 | Nasiri et al. |
| 2007/0114643 A1 | 5/2007 | DCamp et al. |
| 2007/0165888 A1 | 7/2007 | Weigold |
| 2007/0180908 A1 | 8/2007 | Seeger et al. |
| 2007/0205492 A1 | 9/2007 | Wang |
| 2007/0214883 A1 | 9/2007 | Durante et al. |
| 2007/0214891 A1 | 9/2007 | Robert et al. |
| 2007/0220973 A1 | 9/2007 | Acar |
| 2007/0222021 A1 | 9/2007 | Yao |
| 2007/0240486 A1 | 10/2007 | Moore et al. |
| 2007/0284682 A1 | 12/2007 | Laming et al. |
| 2008/0022762 A1 | 1/2008 | Skurnik |
| 2008/0049230 A1 | 2/2008 | Chin et al. |
| 2008/0079120 A1* | 4/2008 | Foster et al. ................. 257/619 |
| 2008/0079444 A1 | 4/2008 | Denison |
| 2008/0081398 A1 | 4/2008 | Lee et al. |
| 2008/0083958 A1 | 4/2008 | Wei et al. |
| 2008/0083960 A1 | 4/2008 | Chen et al. |
| 2008/0092652 A1* | 4/2008 | Acar .............................. 73/504.02 |
| 2008/0122439 A1 | 5/2008 | Burdick et al. |
| 2008/0157238 A1 | 7/2008 | Hsiao |
| 2008/0157301 A1 | 7/2008 | Ramakrishna et al. |
| 2008/0169811 A1 | 7/2008 | Viswanathan |
| 2008/0202237 A1 | 8/2008 | Hammerschmidt |
| 2008/0245148 A1 | 10/2008 | Fukumoto |
| 2008/0247585 A1 | 10/2008 | Leidl et al. |
| 2008/0251866 A1 | 10/2008 | Belt et al. |
| 2008/0253057 A1 | 10/2008 | Rijks et al. |
| 2008/0284365 A1 | 11/2008 | Sri-Jayantha et al. |
| 2008/0290756 A1 | 11/2008 | Huang |
| 2008/0302559 A1 | 12/2008 | Leedy |
| 2008/0314147 A1 | 12/2008 | Nasiri |
| 2009/0007661 A1 | 1/2009 | Nasiri et al. |
| 2009/0056443 A1 | 3/2009 | Netzer |
| 2009/0064780 A1 | 3/2009 | Coronato et al. |
| 2009/0064781 A1 | 3/2009 | Ayazi et al. |
| 2009/0072663 A1 | 3/2009 | Ayazi et al. |
| 2009/0085191 A1* | 4/2009 | Najafi ................... B81B 7/0058 257/698 |
| 2009/0114016 A1 | 5/2009 | Nasiri et al. |
| 2009/0140606 A1* | 6/2009 | Huang .......................... 310/322 |
| 2009/0166827 A1 | 7/2009 | Foster et al. |
| 2009/0175477 A1 | 7/2009 | Suzuki et al. |
| 2009/0183570 A1 | 7/2009 | Acar et al. |
| 2009/0194829 A1 | 8/2009 | Chung et al. |
| 2009/0217757 A1 | 9/2009 | Nozawa |
| 2009/0263937 A1 | 10/2009 | Ramakrishna et al. |
| 2009/0266163 A1 | 10/2009 | Ohuchi et al. |
| 2009/0272189 A1 | 11/2009 | Acar et al. |
| 2010/0019393 A1 | 1/2010 | Hsieh et al. |
| 2010/0024548 A1 | 2/2010 | Cardarelli |
| 2010/0038733 A1 | 2/2010 | Minervini |
| 2010/0044853 A1 | 2/2010 | Dekker et al. |
| 2010/0052082 A1 | 3/2010 | Lee |
| 2010/0058864 A1 | 3/2010 | Hsu et al. |
| 2010/0072626 A1* | 3/2010 | Theuss et al. ................ 257/774 |
| 2010/0077858 A1 | 4/2010 | Kawakubo et al. |
| 2010/0089154 A1 | 4/2010 | Ballas et al. |
| 2010/0122579 A1* | 5/2010 | Hsu ...................... G01P 15/125 73/514.32 |
| 2010/0126269 A1 | 5/2010 | Coronato et al. |
| 2010/0132461 A1 | 6/2010 | Hauer et al. |
| 2010/0155863 A1 | 6/2010 | Weekamp |
| 2010/0194615 A1 | 8/2010 | Lu |
| 2010/0206074 A1 | 8/2010 | Yoshida et al. |
| 2010/0212425 A1 | 8/2010 | Hsu et al. |
| 2010/0224004 A1 | 9/2010 | Suminto et al. |
| 2010/0231452 A1 | 9/2010 | Babakhani et al. |
| 2010/0236327 A1 | 9/2010 | Mao et al. |
| 2010/0263445 A1 | 10/2010 | Hayner et al. |
| 2010/0284553 A1* | 11/2010 | Conti ................... B81B 7/0061 381/174 |
| 2010/0294039 A1 | 11/2010 | Geen |
| 2011/0023605 A1 | 2/2011 | Tripoli et al. |
| 2011/0030473 A1 | 2/2011 | Acar |
| 2011/0030474 A1 | 2/2011 | Kuang et al. |
| 2011/0031565 A1* | 2/2011 | Marx et al. ................... 257/417 |
| 2011/0074389 A1 | 3/2011 | Knierim et al. |
| 2011/0094302 A1 | 4/2011 | Schofield et al. |
| 2011/0120221 A1 | 5/2011 | Yoda |
| 2011/0121413 A1 | 5/2011 | Allen et al. |
| 2011/0146403 A1 | 6/2011 | Rizzo Piazza Roncoroni et al. |
| 2011/0147859 A1 | 6/2011 | Tanaka et al. |
| 2011/0179868 A1 | 7/2011 | Kaino et al. |
| 2011/0192226 A1 | 8/2011 | Hayner et al. |
| 2011/0201197 A1 | 8/2011 | Nilsson et al. |
| 2011/0234312 A1 | 9/2011 | Lachhwani et al. |
| 2011/0265564 A1 | 11/2011 | Acar et al. |
| 2011/0285445 A1 | 11/2011 | Huang et al. |
| 2011/0316048 A1 | 12/2011 | Ikeda et al. |
| 2012/0126349 A1 | 5/2012 | Horning et al. |
| 2012/0162947 A1 | 6/2012 | O'donnell et al. |
| 2012/0191398 A1 | 7/2012 | Murakami et al. |
| 2012/0326248 A1 | 12/2012 | Daneman et al. |
| 2013/0051586 A1* | 2/2013 | Stephanou ............... C03C 27/08 381/173 |
| 2013/0098153 A1 | 4/2013 | Trusov et al. |
| 2013/0139591 A1 | 6/2013 | Acar |
| 2013/0139592 A1 | 6/2013 | Acar |
| 2013/0192364 A1 | 8/2013 | Acar |
| 2013/0192369 A1 | 8/2013 | Acar et al. |

(56) References Cited

U.S. PATENT DOCUMENTS

| | | |
|---|---|---|
| 2013/0199263 A1 | 8/2013 | Egretzberger et al. |
| 2013/0199294 A1 | 8/2013 | Townsend et al. |
| 2013/0221457 A1 | 8/2013 | Conti et al. |
| 2013/0247666 A1 | 9/2013 | Acar |
| 2013/0247668 A1 | 9/2013 | Bryzek |
| 2013/0250532 A1 | 9/2013 | Bryzek et al. |
| 2013/0257487 A1 | 10/2013 | Opris et al. |
| 2013/0263641 A1 | 10/2013 | Opris et al. |
| 2013/0263665 A1 | 10/2013 | Opris et al. |
| 2013/0265070 A1 | 10/2013 | Kleks et al. |
| 2013/0265183 A1 | 10/2013 | Kleks et al. |
| 2013/0268227 A1 | 10/2013 | Opris et al. |
| 2013/0268228 A1 | 10/2013 | Opris et al. |
| 2013/0269413 A1 | 10/2013 | Tao et al. |
| 2013/0270657 A1 | 10/2013 | Acar et al. |
| 2013/0271228 A1 | 10/2013 | Tao et al. |
| 2013/0277772 A1 | 10/2013 | Bryzek et al. |
| 2013/0277773 A1 | 10/2013 | Bryzek et al. |
| 2013/0283911 A1 | 10/2013 | Ayazi et al. |
| 2013/0298671 A1 | 11/2013 | Acar et al. |
| 2013/0328139 A1 | 12/2013 | Acar |
| 2013/0341737 A1 | 12/2013 | Bryzek et al. |
| 2014/0070339 A1 | 3/2014 | Marx |
| 2014/0190258 A1 | 7/2014 | Donadel et al. |
| 2014/0275857 A1 | 9/2014 | Toth et al. |
| 2014/0306773 A1 | 10/2014 | Kim |
| 2015/0059473 A1 | 3/2015 | Jia |
| 2015/0114112 A1 | 4/2015 | Valzasina et al. |
| 2015/0185012 A1 | 7/2015 | Acar |
| 2015/0321904 A1 | 11/2015 | Bryzek et al. |
| 2016/0003618 A1 | 1/2016 | Boser et al. |
| 2016/0264404 A1 | 9/2016 | Acar |
| 2016/0332868 A1 | 11/2016 | Marx |

FOREIGN PATENT DOCUMENTS

| | | |
|---|---|---|
| CN | 1206110 A | 1/1999 |
| CN | 1221210 A | 6/1999 |
| CN | 1272622 A | 11/2000 |
| CN | 102156201 A | 8/2001 |
| CN | 1389704 A | 1/2003 |
| CN | 1532524 A | 9/2004 |
| CN | 1595062 A | 3/2005 |
| CN | 1595063 A | 3/2005 |
| CN | 1603842 A | 4/2005 |
| CN | 1617334 A | 5/2005 |
| CN | 1659810 A | 8/2005 |
| CN | 1693181 A | 11/2005 |
| CN | 1780732 A | 5/2006 |
| CN | 1813192 A | 8/2006 |
| CN | 1816747 A | 8/2006 |
| CN | 1818552 A | 8/2006 |
| CN | 1886669 A | 12/2006 |
| CN | 1905167 A | 1/2007 |
| CN | 1948906 A | 4/2007 |
| CN | 101038299 A | 9/2007 |
| CN | 101044684 A | 9/2007 |
| CN | 101059530 A | 10/2007 |
| CN | 101067555 A | 11/2007 |
| CN | 101069099 A | 11/2007 |
| CN | 101078736 A | 11/2007 |
| CN | 101171665 A | 4/2008 |
| CN | 101180516 A | 5/2008 |
| CN | 101198874 A | 6/2008 |
| CN | 101213461 A | 7/2008 |
| CN | 101217263 A | 7/2008 |
| CN | 101239697 A | 8/2008 |
| CN | 101257000 A | 9/2008 |
| CN | 101270988 A | 9/2008 |
| CN | 101316462 A | 12/2008 |
| CN | 101329446 A | 12/2008 |
| CN | 101426718 A | 5/2009 |
| CN | 101459866 A | 6/2009 |
| CN | 101519183 A | 9/2009 |
| CN | 101520327 A | 9/2009 |
| CN | 101561275 A | 10/2009 |
| CN | 101634662 A | 1/2010 |
| CN | 101638211 A | 2/2010 |
| CN | 101639487 A | 2/2010 |
| CN | 101666813 A | 3/2010 |
| CN | 101738496 A | 6/2010 |
| CN | 101813480 A | 8/2010 |
| CN | 101839718 A | 9/2010 |
| CN | 101055180 A | 10/2010 |
| CN | 101855516 A | 10/2010 |
| CN | 101858928 A | 10/2010 |
| CN | 101916754 A | 12/2010 |
| CN | 101922934 A | 12/2010 |
| CN | 201688848 U | 12/2010 |
| CN | 102109345 A | 6/2011 |
| CN | 102332894 A | 1/2012 |
| CN | 102337541 A | 2/2012 |
| CN | 102364671 A | 2/2012 |
| CN | 102597699 A | 7/2012 |
| CN | 103209922 A | 7/2013 |
| CN | 103210278 A | 7/2013 |
| CN | 103221331 A | 7/2013 |
| CN | 103221332 A | 7/2013 |
| CN | 103221333 A | 7/2013 |
| CN | 103221778 A | 7/2013 |
| CN | 103221779 A | 7/2013 |
| CN | 103221795 A | 7/2013 |
| CN | 103238075 A | 8/2013 |
| CN | 103363969 A | 10/2013 |
| CN | 103363983 A | 10/2013 |
| CN | 103364590 A | 10/2013 |
| CN | 103364593 A | 10/2013 |
| CN | 103368503 A | 10/2013 |
| CN | 103368562 A | 10/2013 |
| CN | 103368577 A | 10/2013 |
| CN | 103376099 A | 10/2013 |
| CN | 103376102 A | 10/2013 |
| CN | 203261317 U | 10/2013 |
| CN | 103403495 A | 11/2013 |
| CN | 203275441 U | 11/2013 |
| CN | 203275442 U | 11/2013 |
| CN | 203301454 U | 11/2013 |
| CN | 203349832 U | 12/2013 |
| CN | 203349834 U | 12/2013 |
| CN | 103663344 A | 3/2014 |
| CN | 203683082 U | 7/2014 |
| CN | 203719664 U | 7/2014 |
| CN | 104094084 A | 10/2014 |
| CN | 104105945 A | 10/2014 |
| CN | 104220840 A | 12/2014 |
| CN | 104272062 A | 1/2015 |
| CN | 103221778 B | 3/2016 |
| CN | 104272062 B | 5/2016 |
| DE | 112011103124 T5 | 12/2013 |
| DE | 102013014881 A1 | 3/2014 |
| EP | 0638782 A1 | 2/1995 |
| EP | 1055910 A1 | 11/2000 |
| EP | 1335185 A1 | 8/2003 |
| EP | 1460380 A1 | 9/2004 |
| EP | 1521086 A1 | 4/2005 |
| EP | 1688705 A2 | 8/2006 |
| EP | 1832841 A1 | 9/2007 |
| EP | 1860402 A1 | 11/2007 |
| EP | 2053413 A1 | 4/2009 |
| EP | 2096759 A1 | 9/2009 |
| EP | 2259019 A1 | 12/2010 |
| EP | 2466257 A1 | 6/2012 |
| EP | 2616772 B1 | 6/2016 |
| EP | 2647593 B1 | 8/2016 |
| EP | 2619536 B1 | 11/2016 |
| JP | 0989927 A | 4/1997 |
| JP | 09089927 A | 4/1997 |
| JP | 10239347 A | 9/1998 |
| JP | 1164002 A | 3/1999 |
| JP | 2000046560 A | 2/2000 |
| JP | 2005024310 A | 1/2005 |
| JP | 2005114394 A | 4/2005 |
| JP | 2005294462 A | 10/2005 |
| JP | 3882972 B2 | 2/2007 |

(56) References Cited

FOREIGN PATENT DOCUMENTS

| | | | |
|---|---|---|---|
| JP | 2007024864 A | 2/2007 | |
| JP | 2008294455 A | 12/2008 | |
| JP | 2009075097 A | 4/2009 | |
| JP | 2009186213 A | 8/2009 | |
| JP | 2009192458 A | 8/2009 | |
| JP | 2009260348 A | 11/2009 | |
| JP | 2010025898 A | 2/2010 | |
| JP | 2010506182 A | 2/2010 | |
| KR | 1020110055449 A1 | 5/2011 | |
| KR | 1020130052652 A | 5/2013 | |
| KR | 1020130052653 A | 5/2013 | |
| KR | 1020130054441 A | 5/2013 | |
| KR | 1020130055693 A | 5/2013 | |
| KR | 1020130057485 A | 5/2013 | |
| KR | 1020130060338 A | 6/2013 | |
| KR | 1020130061181 A | 6/2013 | |
| KR | 101311966 B1 | 9/2013 | |
| KR | 1020130097209 A | 9/2013 | |
| KR | 101318810 B1 | 10/2013 | |
| KR | 1020130037462 A | 10/2013 | |
| KR | 1020130112789 A | 10/2013 | |
| KR | 1020130112792 A | 10/2013 | |
| KR | 1020130112804 A | 10/2013 | |
| KR | 1020130113385 A | 10/2013 | |
| KR | 1020130113386 A | 10/2013 | |
| KR | 1020130113391 A | 10/2013 | |
| KR | 1020130116189 A | 10/2013 | |
| KR | 1020130116212 A | 10/2013 | |
| KR | 101332701 B1 | 11/2013 | |
| KR | 1020130139914 A | 12/2013 | |
| KR | 1020130142116 A | 12/2013 | |
| KR | 101352827 B1 | 1/2014 | |
| KR | 1020140034713 A | 3/2014 | |
| TW | I255341 B | 5/2006 | |
| WO | WO-9311415 A1 | 6/1993 | |
| WO | WO-9503534 A1 | 2/1995 | |
| WO | WO-0107875 A1 | 2/2001 | |
| WO | WO-0175455 A2 | 10/2001 | |
| WO | WO-2008014246 A1 | 1/2008 | |
| WO | WO-2008059757 A1 | 5/2008 | |
| WO | WO-2008087578 A2 | 7/2008 | |
| WO | WO-2009038924 A2 | 3/2009 | |
| WO | WO-2009050578 A2 | 4/2009 | |
| WO | WO-2009156485 A1 | 12/2009 | |
| WO | WO-2011016859 A2 | 2/2011 | |
| WO | WO-2011016859 A3 | 2/2011 | |
| WO | WO-2011107542 A2 | 9/2011 | |
| WO | WO-2012037492 A2 | 3/2012 | |
| WO | WO-2012037492 A3 | 3/2012 | |
| WO | WO-2012037501 A2 | 3/2012 | |
| WO | WO-2012037501 A3 | 3/2012 | |
| WO | WO-2012037536 A2 | 3/2012 | |
| WO | WO-2012037537 A2 | 3/2012 | |
| WO | WO-2012037538 A2 | 3/2012 | |
| WO | WO-2012037539 A1 | 3/2012 | |
| WO | WO-2012037539 A9 | 3/2012 | |
| WO | WO-2012037540 A2 | 3/2012 | |
| WO | WO-2012040194 A1 | 3/2012 | |
| WO | WO-2012040211 A2 | 3/2012 | |
| WO | WO-2012040245 A2 | 3/2012 | |
| WO | WO-2012040245 A3 | 3/2012 | |
| WO | WO-2013115967 A1 | 8/2013 | |
| WO | WO-2013116356 A1 | 8/2013 | |
| WO | WO-2013116514 A1 | 8/2013 | |
| WO | WO-2013116522 A1 | 8/2013 | |

OTHER PUBLICATIONS

"U.S. Appl. No. 12/849,787, Notice of Allowance dated Nov. 11, 2013", 9 pgs.
"U.S. Appl. No. 13/362,955, Response filed Feb. 17, 2014 to Restriction Requirement dated Dec. 17, 2013", 9 pgs.
"U.S. Appl. No. 13/362,955, Restriction Requirement dated Dec. 17, 2013", 6 pgs.
"U.S. Appl. No. 13/363,537, Non Final Office Action dated Feb. 6, 2014", 10 pgs.
"U.S. Appl. No. 13/742,942, Notice of Allowance dated Jan. 28, 2014", 9 pgs.
"U.S. Appl. No. 13/746,016, Notice of Allowance dated Jan. 17, 2014", 10 pgs.
"U.S. Appl. No. 13/755,841, Restriction Requirement dated Feb. 21, 2014", 6 pgs.
"Chinese Application Serial No. 201180053926.1, Office Action dated Jan. 13, 2014", 7 pgs.
"Chinese Application Serial No. 201180054796.3, Office Action dated Jan. 16, 2014", 8 pgs.
"Chinese Application Serial No. 201180055029.4, Office Action dated Jan. 13, 2014", 7 pgs.
"Chinese Application Serial No. 201320172366.8, Office Action dated Oct. 25, 2013", 8 pgs.
"Chinese Application Serial No. 201320172366.8, Response filed Dec. 24, 2013 to Office Action dated Oct. 25, 2013", 11 pgs.
"Chinese Application Serial No. 201320565239.4, Office Action dated Jan. 16, 2014", w/English Translation, 3 pgs.
"European Application Serial No. 10806751.3, Extended European Search Report dated Jan. 7, 2014", 7 pgs.
"Korean Application Serial No. 10-2013-0109990, Amendment filed Dec. 10, 2013", 4 pgs.
"Korean Application Serial No. 10-2013-7009775, Office Action dated Dec. 27, 2013", 8 pgs.
"Korean Application Serial No. 10-2013-7009775, Response filed Oct. 29, 2013 to Office Action dated Sep. 17, 2013", w/English Claims, 23 pgs.
"Korean Application Serial No. 10-2013-7009777, Office Action dated Jan. 27, 2014", 5 pgs.
"Korean Application Serial No. 10-2013-7009777, Response filed Nov. 5, 2013 to Office Action dated Sep. 17, 2013", 11 pgs.
"Korean Application Serial No. 10-2013-7009788, Office Action dated Dec. 7, 2013", w/English Translation, 10 pgs.
"Korean Application Serial No. 10-2013-7009788, Response filed Oct. 29, 2013 to Office Action dated Aug. 29, 2013", w/English Claims, 22 pgs.
"U.S. Appl. No. 12/849,742, Non Final Office Action dated Mar. 28, 2013", 9 pgs.
"U.S. Appl. No. 12/849,742, Non Final Office Action dated Aug. 23, 2012", 9 pgs.
"U.S. Appl. No. 12/849,742, Response filed Jan. 23, 2012 to Non Final Office Action dated Aug. 23, 2012", 10 pgs.
"U.S. Appl. No. 12/849,787, Non Final Office Action dated May 28, 2013", 18 pgs.
"U.S. Appl. No. 12/849,787, Response filed Feb. 4, 2013 to Restriction Requirement dated Oct. 4, 2012", 7 pgs.
"U.S. Appl. No. 12/849,787, Restriction Requirement dated Oct. 4, 2012", 5 pgs.
"U.S. Appl. No. 12/947,543, Notice of Allowance dated Dec. 17, 2012", 11 pgs.
"U.S. Appl. No. 13/813,443, Preliminary Amendment dated Jan. 31, 2013", 3 pgs.
"U.S. Appl. No. 13/821,586, Preliminary Amendment dated Mar. 8, 2013", 6 pgs.
"U.S. Appl. No. 13/821,598, Preliminary Amendment dated Mar. 8, 2013", 7 pgs.
"U.S. Appl. No. 13/821,609, Preliminary Amendment dated Mar. 8, 2013", 3 pgs.
"U.S. Appl. No. 13/821,612, Preliminary Amendment dated Mar. 8, 2013", 3 pgs.
"U.S. Appl. No. 13/821,619, Preliminary Amendment dated Mar. 8, 2013", 3 pgs.
"U.S. Appl. No. 13/821,793, Preliminary Amendment dated Mar. 8, 2013", 3 pgs.
"U.S. Appl. No. 13/821,842, Preliminary Amendment dated Mar. 8, 2013", 3 pgs.
"U.S. Appl. No. 13/821,853, Preliminary Amendment dated Mar. 8, 2013", 3 pgs.
"Application Serial No. PCT/US2011/051994, International Republished Application dated Jun. 7, 2012", 1 pg.

(56) References Cited

OTHER PUBLICATIONS

"Application Serial No. PCT/US2011/052006, International Republished Application dated Jun. 7, 2012", 1 pg.
"Application Serial No. PCT/US2011/052417, International Republished Application dated Jun. 7, 2012", 1 pg.
"DigiSiMic™ Digital Silicon Microphone Pulse Part No. TC100E", TC100E Datasheet version 4.2 DigiSiMic™ Digital Silicon Microphone. (Jan. 2009), 6 pgs.
"EPCOS MEMS Microphone With TSV", 1 pg.
"International Application Serial No. PCT/US2010/002166, International Preliminary Report on Patentability dated Feb. 16, 2012", 6 pgs.
"International Application Serial No. PCT/US2010/002166, International Search Report dated Feb. 28, 2011", 3 pgs.
"International Application Serial No. PCT/US2010/002166, Written Opinion dated Feb. 28, 2011", 4 pgs.
"International Application Serial No. PCT/US2011/051994, International Preliminary Report on Patentability dated Mar. 28, 2013", 8 pgs.
"International Application Serial No. PCT/US2011/051994, International Search Report dated Apr. 16, 2012", 3 pgs.
"International Application Serial No. PCT/US2011/051994, Written Opinion dated Apr. 16, 2012", 6 pgs.
"International Application Serial No. PCT/US2011/052006, International Preliminary Report on Patentability dated Mar. 28, 2013", 7 pgs.
"International Application Serial No. PCT/US2011/052006, Search Report dated Apr. 16, 2012", 3 pgs.
"International Application Serial No. PCT/US2011/052006, Written Opinion dated Apr. 16, 2012", 5 pgs.
"International Application Serial No. PCT/US2011/052059, International Preliminary Report on Patentability dated Jan. 22, 2013", 14 pgs.
"International Application Serial No. PCT/US2011/052059, Search Report dated Apr. 20, 2012", 4 pgs.
"International Application Serial No. PCT/US2011/052059, Written Opinion dated Apr. 20, 2012", 7 pgs.
"International Application Serial No. PCT/US2011/052060, International Preliminary Report on Patentability dated Jan. 22, 2013", 12 pgs.
"International Application Serial No. PCT/US2011/052060, International Search Report Apr. 20, 2012", 3 pgs.
"International Application Serial No. PCT/US2011/052060, Written Opinion dated Apr. 20, 2012", 7 pgs.
"International Application Serial No. PCT/US2011/052061, International Preliminary Report on Patentability dated Mar. 28, 2013", 6 pgs.
"International Application Serial No. PCT/US2011/052061, International Search Report dated Apr. 10, 2012", 3 pgs.
"International Application Serial No. PCT/US2011/052061, Written Opinion dated Apr. 10, 2012", 4 pgs.
"International Application Serial No. PCT/US2011/052064, International Preliminary Report on Patentability dated Mar. 28, 2013", 5 pgs.
"International Application Serial No. PCT/US2011/052064, Search Report dated Feb. 29, 2012", 3 pgs.
"International Application Serial No. PCT/US2011/052064, Written Opinion dated Feb. 29, 2012", 3 pgs.
"International Application Serial No. PCT/US2011/052065, International Preliminary Report on Patentability dated Mar. 28, 2013", 7 pgs.
"International Application Serial No. PCT/US2011/052065, International Search Report dated Apr. 10, 2012", 3 pgs.
"International Application Serial No. PCT/US2011/052065, Written Opinion dated Apr. 10, 2012", 5 pgs.
"International Application Serial No. PCT/US2011/052340, International Preliminary Report on Patentability dated Apr. 4, 2013", 5 pgs.
"International Application Serial No. PCT/US2011/052340, Search Report dated Feb. 29, 2012", 3 pgs.
"International Application Serial No. PCT/US2011/052340, Written Opinion dated Feb. 29, 2012", 3 pgs.
"International Application Serial No. PCT/US2011/052369, International Preliminary Report on Patentability dated Apr. 4, 2013", 5 pgs.
"International Application Serial No. PCT/US2011/052369, International Search Report dated Apr. 24, 2012", 6 pgs.
"International Application Serial No. PCT/US2011/052369, Written Opinion dated Apr. 24, 2012", 3 pgs.
"International Application Serial No. PCT/US2011/052417, International Preliminary Report on Patentability dated Apr. 4, 2013", 6 pgs.
"International Application Serial No. PCT/US2011/052417, International Search Report dated Apr. 23, 2012", 5 pgs.
"International Application Serial No. PCT/US2011/052417, Written Opinion dated Apr. 23, 2012", 4 pgs.
"International Application Serial No. PCT/US2013/021411, International Search Report dated Apr. 30, 2013", 5 pgs.
"International Application Serial No. PCT/US2013/021411, Written Opinion dated Apr. 30, 2013", 5 pgs.
"International Application Serial No. PCT/US2013/023877, International Search Report dated May 14, 2013", 3 pgs.
"International Application Serial No. PCT/US2013/023877, Written Opinion dated May 14, 2013", 5 pgs.
"International Application Serial No. PCT/US2013/024149, Written Opinion mailed", 4 pages.
"International Application Serial No. PCT/US2013/024149, International Search Report mailed", 7 pages.
"T4020 & T4030 MEMS Microphones for Consumer Electronics", Product Brief 2010, Edition Feb. 2010, (2010), 2 pgs.
Acar, Cenk, et al., "Chapter 4: Mechanical Design of MEMS Gyroscopes", MEMS Vibratory Gyroscopes: Structural Approaches to Improve Robustness, Springer, (2009), 73-110.
Acar, Cenk, et al., "Chapter 6: Linear Multi DOF Architecture—Sections 6.4 and 6.5", MEMS Vibratory Gyroscopes: Structural Approaches to Improve Robustness, Springer, (2009), 158-178.
Acar, Cenk, et al., "Chapter 7: Torsional Multi-DOF Architecture", MEMS Vibratory Gyroscopes: Structural Approaches to Improve Robustness, Springer, (209), 187-206.
Acar, Cenk, et al., "Chapter 8: Distributed-Mass Architecture", MEMS Vibratory Gyroscopes: Structural Approaches to Improve Robustness, Springer, (2009), 207-224.
Acar, Cenk, et al., "Chapter 9: Conclusions and Future Trends", MEMS Vibratory Gyroscopes: Structural Approaches to Improve Robustness, Springer, (2009), 225-245.
Beyne, E, et al., "Through-silicon via and die stacking technologies for microsystems-integration", IEEE International Electron Devices Meeting, 2008. IEDM 2008., (Dec. 2008), 1-4.
Cabruja, Enric, et al., "Piezoresistive Accelerometers for MCM-Package-Part II", The Packaging Journal of Microelectromechanical Systems. vol. 14, No. 4, (Aug. 2005), 806-811.
Ezekwe, Chinwuba David, "Readout Techniques for High-Q Micromachined Vibratory Rate Gyroscopes", Electrical Engineering and Computer Sciences University of California at Berkeley, Technical Report No. UCB/EECS-2007-176, http://www.eecs.berkeley.edu/Pubs/TechRpts/2007/EECS-2007-176.html, (Dec. 21, 2007), 94 pgs.
Krishnamurthy, Rajesh, et al., "Drilling and Filling, but not in your Dentist's Chair a look at some recent history of multi-chip and through silicon via (TSV) technology", Chip Design Magazine, (Oct./Nov. 2008), 7 pgs.
Rimskog, Magnus, "Through Wafer via Technology for MEMS and 3D Integration", 32nd IEEE/CPMT International Electronic Manufacturing Technology Symposium, 2007. IEMT '07., (2007), 286-289.
U.S. Appl. No. 12/947,543, filed Nov. 16, 2010, Microelectromechanical Systems Microphone Packaging Systems.
U.S. Appl. No. 12/849,742, filed Aug. 3, 2010, Micromachined Inertial Sensor Devices.
U.S. Appl. No. 12/849,787, filed Aug. 3, 2010, Micromachined Devices and Fabricating the Same.
U.S. Appl. No. 13/821,793, filed Mar. 8, 2013, Micromachined Monolithic 6-Axis Inertial Sensor.

(56) References Cited

OTHER PUBLICATIONS

U.S. Appl. No. 13/821,609, filed Mar. 8, 2013, Multi-Die MEMS Package.
U.S. Appl. No. 13/821,609, filed Mar. 8, 2013, Packaging to Reduce Stress on Microelectromechanical Systems.
U.S. Appl. No. 13/821,853, filed Mar. 8, 2013, Micromachined 3-Axis Accelerometer with a Single Proof-Mass.
U.S. Appl. No. 13/813,443, filed Jan. 31, 2013, Flexure Bearing to Reduce Quadrature for Resonating Micromachined Devices.
U.S. Appl. No. 13/821,842, filed Mar. 8, 2013, Micromachined Monolithic 3-Axis Gyroscope with Single Drive.
U.S. Appl. No. 13/821,612, filed Mar. 8, 2013, Through Silcon via With Reduced Shunt Capacitance.
U.S. Appl. No. 13/821,598, filed Mar. 8, 2013, Microelectromechanical Pressure Sensor Including Reference Capacitor.
U.S. Appl. No. 13/821,619, filed Mar. 8, 2013, Inertial Sensor Mode Tuning Circuit.
U.S. Appl. No. 13/362,955, filed Jan. 31, 2012, MEMS Multi-Axis Accelerometer Electrode Structure.
U.S. Appl. No. 13/363,537, filed Feb. 1, 2012, MEMS Proof Mass With Split Z-Axis Portions.
U.S. Appl. No. 13/755,841, filed Jan. 31, 2013, MEMS Multi-Axis Gyroscope With Central Suspension and Gimbal Structure.
U.S. Appl. No. 13/755,953, filed Jan. 31, 2013, MEMS Multi-Axis Gyroscope Z-Axis Electrode Structure.
U.S. Appl. No. 13/742,942, filed Jan. 16, 2013, Noise Reduction Method With Chopping for a Merged MEMS Accelerometer Sensor.
U.S. Appl. No. 13/742,994, filed Jan. 16, 2013, Self Test of MEMS Accelerometer With Asics Integrated Capacitors.
U.S. Appl. No. 13/746,016, filed Jan. 21, 2013, Accurate Ninety-Degree Phase Shifter.
U.S. Appl. No. 13/857,349, filed Apr. 5, 2013, MEMS Device Front-End Charge Amplifier.
U.S. Appl. No. 13/857,363, filed Apr. 5, 2013, MEMS Device Automatic-Gain Control Loop for Mechanical Amplitude Drive.
U.S. Appl. No. 13/857,377, filed Apr. 5, 2013, MEMS Device Quadrature Shift Cancellation.
U.S. Appl. No. 13/765,068, filed Feb. 12, 2013, Self Test of MEMS Gyroscope With Asics Integrated Capacitors.
U.S. Appl. No. 13/860,761, filed Apr. 11, 2013, Micro-Electro-Mechanical-System (MEMS) Driver.
U.S. Appl. No. 13/860,780, filed Apr. 11, 2013, MEMS Quadrature Cancellation and Signal Demodulation.
"U.S. Appl. No. 12/849,742, Supplemental Notice of Allowability dated Mar. 17, 2014", 3 pgs.
"U.S. Appl. No. 12/849,742, Supplemental Notice of Allowability dated May 5, 2014", 2 pgs.
"U.S. Appl. No. 12/849,787, Supplemental Notice of Allowability dated Mar. 21, 2014", 3 pgs.
"U.S. Appl. No. 13/362,955, Non Final Office Action dated Apr. 15, 2014", 9 pgs.
"U.S. Appl. No. 13/363,537, Response filed Jun. 6, 2014 to Non Final Office Action dated Feb. 6, 2014", 11 pgs.
"U.S. Appl. No. 13/742,942, Supplemental Notice of Allowability dated Apr. 10, 2014", 2 pgs.
"U.S. Appl. No. 13/755,841, Notice of Allowance dated May 7, 2014", 8 pgs.
"U.S. Appl. No. 13/755,841, Preliminary Amendment filed Oct. 10, 2013", 10 pgs.
"U.S. Appl. No. 13/755,841, Response filed Apr. 21, 2014 to Restriction Requirement dated Feb. 21, 2014", 7 pgs.
"Chinese Application Serial No. 2010800423190, Office Action dated Mar. 26, 2014", 10 pgs.
"Chinese Application Serial No. 201180053926.1, Response filed Apr. 29, 2014 to Office Action dated Jan. 13, 2014", w/English Claims, 10 pgs.
"Chinese Application Serial No. 201180055029.4, Response filed May 27, 2014 to Office Action dated Jan. 13, 2014", w/English Claims, 29 pgs.
"Chinese Application Serial No. 201180055309.5, Office Action dated Mar. 31, 2014", w/English Claims, 7 pgs.
"Chinese Application Serial No. 201320172366.8, Office Action dated Jan. 30, 2014", w/English Claims, 3 pgs.
"Chinese Application Serial No. 201320172366.8, Response filed Mar. 18, 2014 to Office Action dated Jan. 30, 2014", w/English Claims, 20 pgs.
"Chinese Application Serial No. 201320565239.4, Response filed Mar. 31, 2014 to Office Action dated Jan. 16, 2014", w/English Claims, 38 pgs.
"European Application Serial No. 11826070.2, Office Action dated Mar. 12, 2014", 1 pg.
"European Application Serial No. 11826070.2, Extended European Search Report dated Feb. 21, 2014", 5 pgs.
"European Application Serial No. 11826071.0, Extended European Search Report dated Feb. 20, 2014", 6 pgs.
"European Application Serial No. 11826071.0, Office Action dated Mar. 12, 2014", 1 pg.
"European Application Serial No. 13001692.6, Response filed Apr. 1, 2014 to Extended European Search Report dated Jul. 24, 2013", 19 pgs.
"European Application Serial No. 13001721.3, Response filed Apr. 7, 2014 to Extended European Search Report dated Jul. 18, 2013", 25 pgs.
"Korean Application Serial No. 10-2013-7009777, Response filed Apr. 28, 2014", w/English Claims, 19 pgs.
U.S. Appl. No. 14/293,747, filed Jun. 2, 2014, Micromachined Inertial Sensor Devices.
"U.S. Appl. No. 12/849,742, Response filed Sep. 30, 2013 to Non-Final Office Action dated Mar. 28, 2013", 12 pgs.
"U.S. Appl. No. 12/849,787, Response filed Oct. 28, 2013 to Non Final Office Action dated May 28, 2013", 12 pgs.
"Chinese Application Serial No. 201180053926.1, Amendment filed Aug. 21, 2013", w/English Translation, 13 pgs.
"Chinese Application Serial No. 201180055309.5, Voluntary Amendment filed Aug. 23, 2013", w/English Translation, 13 pgs.
"Chinese Application Serial No. 201320165465.3, Office Action dated Jul. 22, 2013", w/English Translation, 2 pgs.
"Chinese Application Serial No. 201320165465.3, Response filed Aug. 7, 2013 to Office Action dated Jul. 22, 2013", w/English Translation, 39 pgs.
"Chinese Application Serial No. 201320171504.0, Office Action dated Jul. 22, 2013", w/English Translation, 3 pgs.
"Chinese Application Serial No. 201320171504.0, Response filed Jul. 25, 2013 to Office Action dated Jul. 22, 2013", w/English Translation, 33 pgs.
"Chinese Application Serial No. 201320171616.6, Office Action dated Jul. 10, 2013", w/English Translation, 2 pgs.
"Chinese Application Serial No. 201320171757.8, Office Action dated Jul. 11, 2013", w/English Translation, 2 pgs.
"Chinese Application Serial No. 201320171757.8, Response filed Jul. 25, 2013 to Office Action dated Jul. 11, 2013", w/English Translation, 21 pgs.
"Chinese Application Serial No. 201320171757.8, Response filed Jul. 26, 2013 to Office Action dated Jul. 10, 2013", w/English Translation, 40 pgs.
"Chinese Application Serial No. 201320172128.7, Office Action dated Jul. 12, 2013", w/English Translation, 3 pgs.
"Chinese Application Serial No. 201320172128.7, Response filed Aug. 7, 2013 to Office Action dated Jul. 12, 2013", w/English Translation, 39 pgs.
"Chinese Application Serial No. 201320172366.8, Office Action dated Jul. 9, 2013", w/English Translation, 3 pgs.
"Chinese Application Serial No. 201320172366.8, Response filed Sep. 16, 2013 to Office Action dated Jul. 9, 2013", w/English Translation, 24 pgs.
"Chinese Application Serial No. 201320172367.2, Office Action dated Jul. 9, 2013", w/English Translation, 2 pgs.
"Chinese Application Serial No. 201320172367.2, Response filed Sep. 16, 2013 to Office Action dated Jul. 9, 2013", w/English Translation, 24 pgs.
"Chinese Application Serial No. 201320185461.1, Office Action dated Jul. 23, 2013", w/English Translation, 3 pgs.

(56) References Cited

OTHER PUBLICATIONS

"Chinese Application Serial No. 201320185461.1, Response filed Sep. 10, 2013 to Office Action dated Jul. 23, 2013", w/English Translation, 25 pgs.
"Chinese Application Serial No. 201320186292.3, Office Action dated Jul. 19, 2013", w/English Translation, 2 pgs.
"Chinese Application Serial No. 201320186292.3, Response filed Sep. 10, 2013 to Office Action dated Jul. 19, 2013", w/English Translation, 23 pgs.
"European Application Serial No. 13001692.6, European Search Report dated Jul. 24, 2013", 5 pgs.
"European Application Serial No. 13001696.7, Extended European Search Report dated Aug. 6, 2013", 4 pgs.
"European Application Serial No. 13001721.3, European Search Report dated Jul. 18, 2013", 9 pgs.
"International Application Serial No. PCT/US2013/024138, International Search Report dated May 24, 2013", 3 pgs.
"International Application Serial No. PCT/US2013/024138, Written Opinion dated May 24, 2013", 4 pgs.
"Korean Application Serial No. 10-2013-7009775, Office Action dated Sep. 17, 2013", w/English Translation, 6 pgs.
"Korean Application Serial No. 10-2013-7009777, Office Action dated Sep. 17, 2013", w/English Translation, 8 pgs.
"Korean Application Serial No. 10-2013-7009788, Office Action dated Aug. 29, 2013", w/English Translation, 6 pgs.
"Korean Application Serial No. 10-2013-7009790, Office Action dated Jun. 26, 2013", W/English Translation, 7 pgs.
"Korean Application Serial No. 10-2013-7009790, Response filed Aug. 26, 2013 to Office Action dated Jun. 26, 2013", w/English Claims, 11 pgs.
"Korean Application Serial No. 10-2013-7010143, Office Action dated May 28, 2013", w/English Translation, 5 pgs.
"Korean Application Serial No. 10-2013-7010143, Response filed Jul. 24, 2013 to Office Action dated May 28, 2013", w/English Claims, 14 pgs.
Ferreira, Antoine, et al., "A Survey of Modeling and Control Techniques for Micro- and Nanoelectromechanical Systems", IEEE Transactions on Systems, Man and Cybernetics—Part C: Applications and Reviews vol. 41, No. 3., (May 2011), 350-364.
Fleischer, Paul E, "Sensitivity Minimization in a Single Amplifier Biquad Circuit", IEEE Transactions on Circuits and Systems. vol. Cas-23, No. 1, (1976), 45-55.
Reljin, Branimir D, "Properties of SAB filters with the two-pole single-zero compensated operational amplifier", Circuit Theory and Applications: Letters to the Editor. vol. 10, (1982), 277-297.
Sedra, Adel, et al., "Chapter 8.9: Effect of Feedback on the Amplifier Poles", Microelectronic Circuits, 5th edition, (2004), 836-864.
Song-Hee, Cindy Paik, "A MEMS-Based Precision Operational Amplifier", Submitted to the Department of Electrical Engineering and Computer Sciences MIT, [Online]. Retrieved from the Internet: <URL: http://dspace.mit.edu/bitstream/handle/1721.1/16682/57138272.pdf?. . .>, (Jan. 1, 2004), 123 pgs.
U.S. Appl. No. 14/023,869, filed Sep. 11, 2013, Through Silicon via Including Multi-Material Fill.
"U.S. Appl. No. 13/362,955, Final Office Action dated Nov. 19, 2014", 5 pgs.
"U.S. Appl. No. 13/821,586, Response filed Nov. 24, 2014 to Restriction Requirement dated Sep. 22, 2014", 6 pgs.
"U.S. Appl. No. 13/821,598, Non Final Office Action dated Nov. 20, 2014", 9 pgs.
"U.S. Appl. No. 13/821,609, Restriction Requirement dated Dec. 15, 2014", 7 pgs.
"U.S. Appl. No. 13/821,612, Notice of Allowance dated Dec. 10, 2014", 8 pgs.
"U.S. Appl. No. 13/821,853, Response filed Dec. 1, 2014 to Non Final Office Action dated Jul. 30, 2014", 10 pgs.
"Chinese Application Serial No. 201180055029.4, Response filed Nov. 14, 2014 to Office Action dated Jul. 2, 2014", w/English Claims, 23 pgs.
"European Application Serial No. 11826071.0, Examination Notification Art. 94(3) dated Dec. 11, 2014", 4 pgs.
"European Application Serial No. 11827384.6, Extended European Search Report dated Nov. 12, 2014", 6 pgs.
"U.S. Appl. No. 13/362,955, Response filed Aug. 15, 2014 to Non Final Office Action dated May 15, 2014", 13 pgs.
"U.S. Appl. No. 13/363,537, Examiner Interview Summary dated Sep. 29, 2014", 3 pgs.
"U.S. Appl. No. 13/363,537, Final Office Action dated Jun. 27, 2014", 8 pgs.
"U.S. Appl. No. 13/363,537, Notice of Allowance dated Nov. 7, 2014", 5 pgs.
"U.S. Appl. No. 13/363,537, Response filed Sep. 29, 2014 to Final Office Action dated Jun. 27, 2014", 9 pgs.
"U.S. Appl. No. 13/742,942, Notice of Allowance dated Jan. 28, 2014", 8 pgs.
"U.S. Appl. No. 13/755,841, Supplemental Notice of Allowability dated Jun. 27, 2014", 2 pgs.
"U.S. Appl. No. 13/821,586, Restriction Requirement dated Sep. 22, 2014", 4 pgs.
"U.S. Appl. No. 13/821,598, Response filed Oct. 15, 2014 to Restriction Requirement dated Aug. 15, 2014", 8 pgs.
"U.S. Appl. No. 13/821,598, Restriction Requirement dated Aug. 15, 2014", 11 pgs.
"U.S. Appl. No. 13/821,612, Non Final Office Action dated Jul. 23, 2014", 8 pgs.
"U.S. Appl. No. 13/821,612, Response filed Oct. 23, 2014 to Non Final Office Action dated Jul. 23, 2014", 6 pgs.
"U.S. Appl. No. 13/821,853, Non Final Office Action dated Jul. 30, 2014", 10 pgs.
"U.S. Appl. No. 13/860,761, Non Final Office Action dated Aug. 19, 2014", 13 pgs.
"Chinese Application Serial No. 2010800423190, Response filed Aug. 11, 2014 to Office Action dated Mar. 26, 2014", w/English Claims, 11 pgs.
"Chinese Application Serial No. 201180054796.3, Office Action dated Sep. 4, 2014", w/English Claims, 11 pgs.
"Chinese Application Serial No. 201180054796.3, Response filed Jun. 30, 2014 to Office Action dated Jan. 16, 2014", w/English Claims, 3 pgs.
"Chinese Application Serial No. 201180055029.4, Office Action dated Jul. 2, 2014", w/English Translation, 5 pgs.
"Chinese Application Serial No. 201180055309.5, Response filed Aug. 13, 2014 to Office Action dated Mar. 31, 2014", w/English Claims, 27 pgs.
"Chinese Application Serial No. 201310118845.6, Office Action dated Sep. 9, 2014", 8 pgs.
"Chinese Application Serial No. 201310119472.4, Office Action dated Sep. 9, 2014", w/English Translation, 11 pgs.
"Chinese Application Serial No. 201380007588.7, Notification to Make Rectification dated Aug. 18, 2014", w/English Translation, 2 pgs.
"Chinese Application Serial No. 201380007615.0, Notification to Make Rectification dated Aug. 18, 2014", w/English Translation, 2 pgs.
"European Application Serial No. 10806751.3, Response filed Jul. 24, 2014 to Office Action dated Jan. 24, 2014", 26 pgs.
"European Application Serial No. 11826043.9, Office Action dated May 6, 2013", 2 pgs.
"European Application Serial No. 11826043.9, Response filed Nov. 4, 2013 to Office Action dated May 6, 2013", 6 pgs.
"European Application Serial No. 11826067.8, Extended European Search Report dated Oct. 6, 2014", 10 pgs.
"European Application Serial No. 11826068.6, Extended European Search Report dated Jul. 16, 2014", 10 pgs.
"European Application Serial No. 11826070.2, Response filed Sep. 19, 2014 to Office Action dated Mar. 12, 2014", 11 pgs.
"European Application Serial No. 11826071.0, Response filed Sep. 19, 2014 to Office Action dated Mar. 12, 2014", 20 pgs.
"European Application Serial No. 11827347.3, Office Action dated May 2, 2013", 6 pgs.
"European Application Serial No. 11827347.3, Response filed Oct. 30, 2013 to Office Action dated May 2, 2013", 9 pgs.

(56) References Cited

OTHER PUBLICATIONS

"European Application Serial No. 13001695.9, European Search Report dated Oct. 5, 2014", 6 pgs.
"European Application Serial No. 13001719.7, Extended European Search Report dated Jun. 24, 2014", 10 pgs.
"International Application Serial No. PCT/US2013/021411, International Preliminary Report on Patentability dated Aug. 14, 2014", 7 pgs.
"International Application Serial No. PCT/US2013/023877, International Preliminary Report on Patentability dated Aug. 14, 2014", 7 pgs.
"International Application Serial No. PCT/US2013/024138, International Preliminary Report on Patentability dated Aug. 14, 2014", 6 pgs.
"International Application Serial No. PCT/US2013/024149, International Preliminary Report on Patentability dated Aug. 14, 2014", 6 pgs.
Dunn, C, et al., "Efficient linearisation of sigma-delta modulators using single-bit dither", Electronics Letters 31(12), (Jun. 1995), 941-942.
Kulah, Haluk, et al., "Noise Analysis and Characterization of a Sigma-Delta Capacitive Silicon Microaccelerometer", 12th International Conference on Solid State Sensors, Actuators and Microsystems, (2003), 95-98.
Sherry, Adrian, et al., "AN-609 Application Note: Chopping on Sigma-Delta ADCs", Analog Devices, [Online]. Retrieved from the Internet: <URL: http://www.analog.com/static/imported-files/application_notes/AN-609.pdf>, (2003), 4 pgs.
Xia, Guo-Ming, et al., "Phase correction in digital self-oscillation drive circuit for improve silicon MEMS gyroscope bias stability", Solid-State and Integrated Circuit Technology (ICSICT), 2010 10TH IEEE International Conference on, IEEE, (Nov. 1 2010), 1416-1418.
"U.S. Appl. No. 13/362,955, Notice of Allowance dated Feb. 25, 2015", 8 pgs.
"U.S. Appl. No. 13/362,955, Response filed Jan. 16, 2015 to Final Office Action dated Nov. 19, 2014", 9 pgs.
"U.S. Appl. No. 13/363,537, Corrected Notice of Allowance dated Jan. 28, 2015", 2 pgs.
"U.S. Appl. No. 13/742,994, Non Final Office Action dated May 1, 2015", 20 pgs.
"U.S. Appl. No. 13/755,953, Response filed May 4, 2015 to Restrictiion Requirement dated Mar. 3, 2015", 7 pgs.
"U.S. Appl. No. 13/755,953, Restriction Requirement dated Mar. 3, 2015", 6 pgs.
"U.S. Appl. No. 13/765,068, Notice of Allowance dated May 7, 2015", 12 pgs.
"U.S. Appl. No. 13/813,443, Restriction Requirement dated Apr. 29, 2015", 6 pgs.
"U.S. Appl. No. 13/821,586, Non Final Office Action dated Jan. 15, 2015", 8 pgs.
"U.S. Appl. No. 13/821,598, Response filed Feb. 20, 2015 to Non Final Office Action dated Nov. 20, 2014", 12 pgs.
"U.S. Appl. No. 13/821,609, Notice of Allowance dated Mar. 23, 2015", 11 pgs.
"U.S. Appl. No. 13/821,609, Response filed Feb. 13, 2015 to Restriction Requirement dated Dec. 15, 2014", 6 pgs.
"U.S. Appl. No. 13/821,842, Non Final Office Action dated Mar. 18, 2015", 20 pgs.
"U.S. Appl. No. 13/821,853, Non Final Office Action dated Feb. 18, 2015", 15 pgs.
"U.S. Appl. No. 13/860,761, Advisory Action dated Mar. 25, 2015", 3 pgs.
"U.S. Appl. No. 13/860,761, Final Office Action dated Jan. 15, 2015", 14 pgs.
"U.S. Appl. No. 13/860,761, Notice of Allowance dated Apr. 28, 2015", 8 pgs.
"U.S. Appl. No. 13/860,761, Response filed Mar. 16, 2015 to Final Office Action dated Jan. 16, 2015", 12 pgs.
"U.S. Appl. No. 13/860,761, Response filed Apr. 16, 2015 to Advisory Action dated Mar. 25, 2015", 11 pgs.
"U.S. Appl. No. 13/860,761, Response filed Dec. 19, 2014 to Non Final Office Action dated Aug. 19, 2014", 12 pgs.
"U.S. Appl. No. 14/658,579, Prliminary Amendment filed Mar. 18, 2015", 8 pgs.
"Chinese Application Serial No. 2010800423190, Office Action dated Dec. 3, 2014", 3 pgs.
"Chinese Application Serial No. 2010800423190, Response filed Feb. 15, 2015", 3 pgs.
"Chinese Application Serial No. 201180054796.3, Office Action dated Jan. 30, 2015", with English translation of claims, 5 pgs.
"Chinese Application Serial No. 201180054796.3, Response filed Nov. 19, 2014 to Office Action dated Sep. 4, 2014", with English translation of claims, 7 pgs.
"Chinese Application Serial No. 201180054796.3, Response filed Apr. 14, 2015 to Office Action dated Jan. 30, 2015", w/ English Claims, 30 pgs.
"Chinese Application Serial No. 201180055309.5, Office Action dated Jan. 8, 2015", with English translation of claims, 5 pgs.
"Chinese Application Serial No. 201180055309.5, Response filed Jan. 14, 2015 to Office Action dated Jan. 8, 2015", 8 pgs.
"Chinese Application Serial No. 201180055630.3, Office Action dated Dec. 22, 2014", with English translation of claims, 10 pgs.
"Chinese Application Serial No. 201180055630.3, Response filed Apr. 20, 2015 to Office Action dated Dec. 22, 2014", w/ English Claims, 10 pgs.
"Chinese Application Serial No. 201180055792.7, Office Action dated Dec. 22, 2014", with English translation of claims, 10 pgs.
"Chinese Application Serial No. 201180055794.6, Office Action dated Dec. 17, 2014", with English translation of claims, 9 pgs.
"Chinese Application Serial No. 201180055823.9, Office Action dated Mar. 19, 2015", w/ English Claims, 8 pgs.
"Chinese Application Serial No. 201180055845.5, Office Action dated Mar. 4, 2015", w/ English Claims, 8 pgs.
"Chinese Application Serial No. 2013101188456, Response filed Jan. 21, 2015", with English translation of claims, 16 pgs.
"Chinese Application Serial No. 201310119472.4, Response filed Jan. 21, 2015", with English translation of claims, 16 pgs.
"Chinese Application Serial No. 201380007588.7, Response filed Oct. 24, 2014", with English translation, 3 pgs.
"Chinese Application Serial No. 201380007615.0, Response filed Oct. 24, 2014", with English translation, 3 pgs.
"European Application Serial No. 11826067.8, Response filed Apr. 27, 2015 to Extended European Search Report dated Oct. 6, 2014", 32 pgs.
"European Application Serial No. 11826068.6, Response filed Feb. 9, 2015", 30 pgs.
"European Application Serial No. 11826071.0, Response filed Apr. 13, 2015 to Examination Notification Art. 94(3) dated Dec. 11, 2014", 5 pgs.
"European Application Serial No. 13001695.9, Extended European Search Report dated Jan. 22, 2015", 8 pgs.
"European Application Serial No. 13001719.7, Response filed Jan. 21, 2015", 29 pgs.
U.S. Appl. No. 14/804,691, filed Jul. 21, 2015, Multi-Die MEMS Package.
U.S. Appl. No. 14/658,579, filed Mar. 16, 2015, MEMS Proof Mass With Split Z-Axis Portions.
"U.S. Appl. No. 13/742,942, Supplemental Notice of Allowability dated Apr. 10, 2014", 3 pgs.
"U.S. Appl. No. 13/742,994, Response filed Jul. 31, 2015 to Non Final Office Action dated May 1, 2015", 12 pgs.
"U.S. Appl. No. 13/755,953, Non Final Office Action dated May 14, 2015", 11 pgs.
"U.S. Appl. No. 13/755,953, Response filed Sep. 15, 2015 to Non Final Office Action dated May 14, 2015", 10 pgs.
"U.S. Appl. No. 13/813,443, Non Final Office Action dated Jun. 10, 2015", 10 pgs.
"U.S. Appl. No. 13/813,443, Response filed May 22, 2015 to Restriction Requirement dated Apr. 29, 2015", 7 pgs.
"U.S. Appl. No. 13/813,443, Response filed Oct. 13, 2015 to Non Final Office Action dated Jun. 10, 2015", 7 pgs.

(56) References Cited

OTHER PUBLICATIONS

"U.S. Appl. No. 13/821,586, Notice of Allowance dated Jun. 5, 2015", 6 pgs.
"U.S. Appl. No. 13/821,586, Response filed May 15, 2015 to Non Final Office Action dated Jan. 15, 2015", 12 pgs.
"U.S. Appl. No. 13/821,598, Non Final Office Action dated Jul. 7, 2015", 9 pgs.
"U.S. Appl. No. 13/821,598, Response filed Oct. 7, 2015 to Non Final Office Action dated Jul. 7, 2015", 10 pgs.
"U.S. Appl. No. 13/821,619, Ex Parte Quayle Action dated Jul. 16, 2015", 8 pgs.
"U.S. Appl. No. 13/821,619, Non Final Office Action dated Oct. 13, 2015", 11 pgs.
"U.S. Appl. No. 13/821,619, Response filed Sep. 16, 2015 to Ex Parte Quayle Action dated Jul. 16, 2015", 11 pgs.
"U.S. Appl. No. 13/821,793, Non Final Office Action dated Jul. 27, 2015", 14 pgs.
"U.S. Appl. No. 13/821,842, Corrected Notice of Allowance dated Oct. 19, 2015", 2 pgs.
"U.S. Appl. No. 13/821,842, Examiner Interview Summary dated Sep. 15, 2015", 3 pgs.
"U.S. Appl. No. 13/821,842, Notice of Allowance Received dated Sep. 15, 2015", 13 pgs.
"U.S. Appl. No. 13/821,842, Response filed Jun. 18, 2015 Non Final Office Action dated Mar. 18, 2015", 11 pgs.
"U.S. Appl. No. 13/821,842, Supplemental Notice of Allowability dated Sep. 28, 2015", 2 pgs.
"U.S. Appl. No. 13/821,853, Final Office Action dated Jun. 18, 2015", 7 pgs.
"U.S. Appl. No. 13/821,853, Response filed May 18, 2015 to Non Final Office Action dated Feb. 18, 2015", 12 pgs.
"U.S. Appl. No. 13/821,853, Response filed Oct. 19, 2015 to Final Office Action dated Jun. 18, 2015", 8 pgs.
"U.S. Appl. No. 13/857,349, Non Final Office Action dated Oct. 8, 2015", 10 pgs.
"U.S. Appl. No. 14/023,869, Non Final Office Action dated Jun. 15, 2015", 15 pgs.
"U.S. Appl. No. 14/658,579, Final Office Action dated Oct. 21, 2015", 10 pgs.
"U.S. Appl. No. 14/658,579, Non Final Office Action dated Jul. 1, 2015", 9 pgs.
"U.S. Appl. No. 14/658,579, Response filed Oct. 1, 2015 to Non Final Office Action dated Jul. 1, 2015", 11 pgs.
"Chinese Application Serial No. 201180044919.5, Office Action dated Jun. 25, 2015", w/ English Translation, 8 pgs.
"Chinese Application Serial No. 201180054796.3, Office Action dated Jun. 4, 2015", w/ English Translation, 7 pgs.
"Chinese Application Serial No. 201180055630.3, Office Action dated Jul. 10, 2015", w/ English Claims, 8 pgs.
"Chinese Application Serial No. 201180055630.3, Response filed Sep. 25, 2015 to Office Action dated Jul. 10, 2015", w/ English Claims, 14 pgs.
"Chinese Application Serial No. 201180055792.7, Office Action dated Jul. 21, 2015", w/ English Translation, 5 pgs.
"Chinese Application Serial No. 201180055792.7, Response filed May 5, 2015 to Office Action dated Dec. 22, 2014", w/ English Claims, 15 pgs.
"Chinese Application Serial No. 201180055794.6, Response filed May 4, 2015 to Office Action dated Dec. 17, 2014", w/ English Claims, 15 pgs.
"Chinese Application Serial No. 201180055823.9,Response filed Aug. 3, 2015 to Office Action dated Mar. 19, 2015", w/ English Translation, 14 pgs.
"Chinese Application Serial No. 201180055845.5, Office Action dated Aug. 5, 2015", w/ English Translation, 5 pgs.
"Chinese Application Serial No. 201180055845.5,Response filed Jul. 13, 2015 to Office Action dated Mar. 4, 2015", w/ English Translation, 17 pgs.
"Chinese Application Serial No. 201310115550.3, Office Action dated May 22, 2015", w/ English Claims, 8 pgs.
"Chinese Application Serial No. 201310119730.9, Office Action dated May 4, 2015", w/ English Claims, 8 pgs.
"Chinese Application Serial No. 201310119806.8, Office Action dated Jul. 3, 2015", w/ English Claims, 12 pgs.
"Chinese Application Serial No. 201310119986.X, Office Action dated May 12, 2015", w/ English Claims, 14 pgs.
"Chinese Application Serial No. 201310127961.4, Office Action dated May 6, 2015", w/ English Claims, 7 pgs.
"Chinese Application Serial No. 201310127961.4, Response filed Sep. 2, 2015 to Office Action dated May 6, 2015", w/ English Claims, 19 pgs.
"Chinese Application Serial No. 201310128046.7, Office Action dated Jul. 23, 2015", w/ English Translation, 7 pgs.
"Chinese Application Serial No. 201310415336.X, Office Action dated Jul. 3, 2015", w/ English Claims, 9 pgs.
"Chinese Application Serial No. 201380007588.7, Office Action dated Jun. 10, 2015", w/ English Claims, 7 pgs.
"Chinese Application Serial No. 201380007615.0, Office Action dated May 6, 2015", w/ English Claims, 7 pgs.
"European Application Serial No. 11826069.4, Extended European Search Report dated Jul. 23, 2015", 8 pgs.
"European Application Serial No. 11827347.3, Extended European Search Report dated Jul. 31, 2015", 6 pgs.
"European Application Serial No. 11827357.2, Extended European Search Report dated Aug. 26, 2015", 4 pgs.
"European Application Serial No. 13001720.5, Extended European Search Report dated Aug. 20, 2015", 7 pgs.
"U.S. Appl. No. 13/742,994, Final Office Action dated Nov. 24, 2015", 11 pgs.
"U.S. Appl. No. 13/742,994, Response filed Jan. 8, 2016 to Final Office Action dated Nov. 24, 2015", 8 pgs.
"U.S. Appl. No. 13/755,953, Notice of Allowance dated Oct. 28, 2015", 5 pgs.
"U.S. Appl. No. 13/813,443, Notice of Allowance dated Feb. 4, 2016", 7 pgs.
"U.S. Appl. No. 13/821,598, Final Office Action dated Jan. 21, 2016", 9 pgs.
"U.S. Appl. No. 13/821,793, Notice of Allowance dated Nov. 24, 2015", 5 pgs.
"U.S. Appl. No. 13/821,793, Response filed Oct. 27, 2015 to Non Final Office Action dated Jul. 27, 2015", 12 pgs.
"U.S. Appl. No. 13/821,853, Final Office Action dated Jan. 25, 2016", 6 pgs.
"U.S. Appl. No. 13/821,853, Response filed Apr. 25, 2016 to Final Office Action dated Jan. 25, 2016", 7 pgs.
"U.S. Appl. No. 13/857,349, Response filed Jan. 8, 2016 to Non Final Office Action dated Oct. 8, 2015", 10 pgs.
"U.S. Appl. No. 13/857,377, Non Final Office Action dated Apr. 27, 2016".
"U.S. Appl. No. 13/860,780, Non Final Office Action dated Apr. 14, 2016", 25 pgs.
"U.S. Appl. No. 14/023,869 Response Filed Apr. 15, 2016 to Final Office Action dated Dec. 15, 2015", 12 pgs.
"U.S. Appl. No. 14/023,869, Examiner Interview Summary dated Apr. 19, 2016", 3 pgs.
"U.S. Appl. No. 14/023,869, Final Office Action dated Dec. 15, 2015", 14 pgs.
"U.S. Appl. No. 14/023,869, Notice of Allowance dated May 4, 2016", 8 pgs.
"U.S. Appl. No. 14/023,869, Preliminary Amendment filed Dec. 4, 2013", 3 pgs.
"U.S. Appl. No. 14/023,869, Response filed Nov. 16, 2015 to Non Final Office Action dated Jun. 15, 2015", 12 pgs.
"U.S. Appl. No. 14/658,579, Non Final Office Action dated Mar. 16, 2016", 5 pgs.
"U.S. Appl. No. 14/658,579, Response filed Feb. 22, 2016 to Final Office Action dated Oct. 21, 2015", 11 pgs.
"U.S. Appl. No. 14/804,691, Non Final Office Action dated Apr. 22, 2016", 13 pgs.
"Chinese Application Serial No. 201180055630.3, Office Action dated Dec. 7, 2015", W/ English Translation, 5 pgs.

(56) References Cited

OTHER PUBLICATIONS

"Chinese Application Serial No. 201180055630.3, Response filed Feb. 19, 2016 to Office Action dated Dec. 7, 2015", W/ English Translation of Claim, 10 pgs.

"Chinese Application Serial No. 201180055823.9, Office Action dated Nov. 17, 2015", w/ English Translation, 8 pgs.

"Chinese Application Serial No. 201180055823.9, Response filed Feb. 2, 2016 to Office Action dated Nov. 17, 2015", (English Translation of Claims), 15 pgs.

"Chinese Application Serial No. 201180055845.5, Response filed Nov. 20, 2015 to Office Action dated Aug. 5, 2015", With English Claims, 9 pgs.

"Chinese Application Serial No, 201310115550.3, Response filed Sep. 30, 2015 to Office Action dated May 22, 2015", w/ English Claims, 15 pgs.

"Chinese Application Serial No. 201310119730,9, Office Action dated Jan. 29, 2016", w/ English Translation, 7 pgs.

"Chinese Application Serial No. 201310119806.8, Response filed Jan. 18, 2016 to Office Action dated Jul. 3, 2015", (English Translation of Claims), 11 pgs.

"Chinese Application Serial No. 201310119986.X, Office Action dated Dec. 18, 2015", w/ English Translation, 6 pgs.

"Chinese Application Serial No. 201310119986,X, Response filed Apr. 29, 2016 to Office Action dated Dec. 18, 2015", (English Translation of Claims), 14 pgs.

"Chinese Application Serial No. 201310119986.X, Response filed Sep. 25, 2015 to Office Action dated May 12, 2015", w/ English Claims, 7 pgs.

"Chinese Application Serial No. 201310120172.8, Office Action dated Nov. 3, 2015", w/ English Translation, 11 pgs.

"Chinese Application Serial No. 201310128046.7, Response filed Oct. 14, 2015 to Office Action dated Jul. 23, 2015", w/ English Claims, 23 pgs.

"Chinese Application Serial No. 201310415336.X, Office Action dated Apr. 26, 2016", w/ English Translation, 11 pgs.

"Chinese Application Serial No, 201310415336.X, Response filed Jan. 18, 2016 to Office Action dated Jul. 3, 2015", (English Translation of Claims), 11 pgs.

"Chinese Application Serial No. 201380007523.2, Office Action dated Dec. 31, 2015", w/ English Translation, 12 pgs.

"Chinese Application Serial No. 201380007577.9, Office Action dated Dec. 21, 2015", w/ English Translation, 9 pgs.

"Chinese Application Serial No. 201380007577.9, Response filed May 5, 2016 to Office Action dated Dec. 21, 2015", w/ English Claims, 17 pgs.

"Chinese Application Serial No. 201380007588.7, Response filed Oct. 26, 2015 to Office Action dated Jun. 10, 2015", w/ English Claims, 9 pgs.

"Chinese Application Serial No. 201380007615.0, Response filed Jan. 5, 2016 to Office Action dated May 6, 2015", w/ English Claims, 13 pgs.

"Chinese Application Serial No. 201380007615.0, Response filed Nov. 23, 2015 to Office Action dated May 6, 2015", With English Claims, 15 pgs.

"European Application Serial No. 11826043.9, Extended European Search Report dated Feb. 23, 2016", 6 pgs.

"European Application Serial No, 11826069.4, Response filed Feb. 22, 2016 to Extended European Search Report dated Jul. 23, 2015", W/ English Translation, 26 pgs.

"European Application Serial No. 13001694.2, Extended European Search Report dated Oct. 2, 2015", 8 pgs.

"European Application Serial No. 13001695.9, Response filed Aug. 24, 2015 to Extended European Search Report dated Jan. 22, 2015", 9 pgs.

"European Application Serial No. 13001917.7, Extended European Search Report dated Apr. 11, 2016", 5 pgs.

"European Application Serial No. 13001918.5, Extended European Search Report dated Dec. 3, 2015", 8 pgs.

"Korean Application Serial No. 2012-7005729, Office Action dated May 3, 2016", w/ English Claims, 11 pgs.

"U.S. Appl. No. 13/742,994, Notice of Allowability dated Sep. 1, 2016", 7 pgs.

"U.S. Appl. No. 13/742,994, Notice of Allowance dated Jun. 21, 2016", 8 pgs.

"U.S. Appl. No. 13/821,598, Examiner Interview Summary dated Jul. 21, 2016", 2 pgs.

"U.S. Appl. No. 13/821,598, Examiner Interview Summary dated Jul. 28, 2016", 2 pgs.

"U.S. Appl. No. 13/821,853, Notice of Allowance dated May 20, 2016", 8 pgs.

"U.S. Appl. No. 13/857,349, Notice of Allowance dated May 6, 2016", 9 pgs.

"U.S. Appl. No. 13/857,363, Non Final Office Action dated Aug. 5, 2016", 8 pgs.

"U.S. Appl. No. 13/857,363, Notice of Allowance dated Dec. 2, 2016", 8 pgs.

"U.S. Appl. No. 13/857,363, Response filed Nov. 7, 2016 to Non Final Office Action dated Aug. 5, 2016", 12 pgs.

"U.S. Appl. No. 13/857,377, Non Final Office Action dated Oct. 13, 2016", 23 pgs.

"U.S. Appl. No. 13/857,377, Response filed Jul. 27, 2016 to Non Final Office Action dated Apr. 27, 2016", 14 pgs.

"U.S. Appl. No. 13/860,780, Final Office Action dated Aug. 18, 2016", 25 pgs.

"U.S. Appl. No. 13/860,780, Response filed Jul. 14, 2016 to Non Final Office Action dated Apr. 14, 2016", 12 pgs.

"U.S. Appl. No. 13/860,780, Response Filed Nov. 18, 2016 to Final Office Action dated Aug. 18, 2016", 7 pgs.

"U.S. Appl. No. 14/658,579, Advisory Action datead Oct. 26, 2016", 3 pgs.

"U.S. Appl. No. 14/658,579, Final Office Action dated Jul. 14, 2016", 6 pgs.

"U.S. Appl. No. 14/658,579, Notice of Allowance dated Nov. 2, 2016", 5 pgs.

"U.S. Appl. No. 14/658,579, Response filed Oct. 14, 2016 to Final Office Action dated Jul. 14, 2016", 9 pgs.

"U.S. Appl. No. 14/658,579, Response Filed Jun. 16, 2016 to Non-Final Office Action dated Mar. 16, 2016", 9 pgs.

"U.S. Appl. No. 14/658,579, Response filed Oct. 20, 2016 to Final Office Action dated Jul. 14, 2016", 9 pgs.

"U.S. Appl. No. 14/804,691, Notice of Allowance dated Nov. 21, 2016", 10 pgs.

"U.S. Appl. No. 14/804,691, Response filed Jul. 22, 2016 to Non Final Office Action dated Apr. 22, 2016", 9 pgs.

"U.S. Appl. No. 15/005,783 Preliminary Amendment Filed May 26, 2016", 9 pgs.

"U.S. Appl. No. 15/218,852, Preliminary Amendment filed Jul. 27, 2016", 7 pgs.

"Chinese Application Serial No. 201180044919.5, Office Action dated Apr. 25, 2016", w/ English Translation, 7 pgs.

"Chinese Application Serial No. 201180044919.5, Response filed May 12, 2016 to Office Action dated Apr. 25, 2016", w/ English Translation, 13 pgs.

"Chinese Application Serial No. 201180055630.3, Office Action dated May 16, 2016", (English Translation), 9 pgs.

"Chinese Application Serial No. 201180055630.3, Response filed Sep. 26, 2016 to Office Action dated May 16, 2016", (With English Translation), 15 pgs.

"Chinese Application Serial No. 201180055794.6, Voluntary Amendment filed Jul. 7, 2015", with English translation of claims, 9 pgs.

"Chinese Application Serial No. 201180055823.9, Office Action dated May 10, 2016", w/ English Translation, 8 pgs.

"Chinese Application Serial No. 201180055823.9, Response filed Jul. 5, 2016 to Office Action dated May 10, 2016", with English translation of claims, 17 pgs.

"Chinese Application Serial No. 201310119730.9, Office Action dated Oct. 10, 2016", W/ English Translation, 8 pgs.

"Chinese Application Serial No. 201310119730.9, Response filed Jun. 13, 2016 to Office Action dated Jan. 29, 2016", with English translation of claims, 19 pgs.

"Chinese Application Serial No. 201310119806.8, Office Action dated May 13, 2016", with English translation of claims, 11 pgs.

(56) References Cited

OTHER PUBLICATIONS

"Chinese Application Serial No. 201310119806.8, Response filed Sep. 28, 2016 to Office Action dated May 13, 2016", with English translation of claims, 13 pgs.

"Chinese Application Serial No. 201310120172.8, Office Action dated Aug. 1, 2016", with English translation of claims, 19 pgs.

"Chinese Application Serial No. 201310120172.8, Response filed May 18, 2016 to Office Action dated Nov. 3, 2015", with English translation of claims, 21 pgs.

"Chinese Application Serial No. 201310120172.8, Response filed Oct. 17, 2016 to Office Action dated Aug. 1, 2016", with English translation of claims, 20 pgs.

"Chinese Application Serial No. 201310415336.X, Response filed Sep. 12, 2016 to Office Action dated Apr. 26, 2016", W/ English Translation of Claims, 13 pgs.

"Chinese Application Serial No. 201380007523.2, Office Action dated Oct. 9, 2016", with English translation of claims, 7 pgs.

"Chinese Application Serial No. 201380007523.2, Response filed May 31, 2016 to Office Action dated Dec. 31, 2015", with English translation of claims, 16 pgs.

"Chinese Application Serial No. 201380007577.9, Office Action dated Aug. 18, 2016", with English translation of claims, 7 pgs.

"Chinese Application Serial No. 201380007577.9, Response filed Nov. 2, 2016 to Office Action dated Aug. 18, 2016", 5 pgs.

"Definition of baseband signal downloaded from "Tech Terms"", (Jul. 15, 2016), 1 pg.

"European Application Serial No. 11827357.2, Communication under Rule 71(3) dated Apr. 25, 2016", 36 pgs.

"European Application Serial No. 13001694.2, Communication Pursuant to Article 94(3) EPC dated Nov. 2, 2016", 5 pgs.

"European Application Serial No. 13001694.2, Response filed Apr. 26, 2016 to Office Action dated Oct. 2, 2015", 18 pgs.

"European Application Serial No. 13001719.7, Commnunication Pursuant to Article 94(3) EPC dated Jul. 4, 2016", 4 pgs.

"European Application Serial No. 13001719.7, Response filed Nov. 9, 2016 to Communication Pursuant to Article 94(3) EPC dated Jul. 4, 2016", 14 pgs.

"European Application Serial No. 13001917.7, Response filed Nov. 8, 2016 to Office Action dated Apr. 11, 2016", 16 pgs.

"European Application Serial No. 13001918.5, Response filed Jul. 8, 2016 tp Office Action dated Dec. 3, 2015", 36 pgs.

"Explanation of phase shifters from "Microwaves 101"", (Aug. 4, 2016), 5 pgs.

"Korean Application Serial No. 2012-7005729, Response filed Jun. 29, 2016 to Office Action dated May 3, 2016", (English Translation of Claims), 29 pgs.

U.S. Appl. No. 15/218,852, filed Jul. 25, 2016, Through Silicon via Including Multi-Material Fill.

* cited by examiner

SEALED PACKAGING FOR MICROELECTROMECHANICAL SYSTEMS

CLAIM OF PRIORITY AND RELATED APPLICATIONS

The present application is a U.S. National Stage Filing under 35 U.S.C. 371 from International Patent Application Serial No. PCT/US2011/052060 filed on Sep. 18, 2011, and published on Mar. 22, 2012 as WO 2012/037537 A2, which claims the benefit of priority of U.S. Provisional Patent Application Ser. No. 61/384,242, entitled "STACKED PACKAGING OF MEMS DEVICES," filed Sep. 18, 2010; U.S. Provisional Patent Application Ser. No. 61/384,244, entitled "PACKAGE STRESS RELIEF STRUCTURE," filed Sep. 18, 2010 and U.S. Provisional Patent Application Ser. No. 61/384,243, entitled "STRESSLESS HERMETIC SEAL," filed Sep. 18, 2010, each of which are incorporated by reference in its entirety.

The present application is related to U.S. patent application Ser. No. 12/849,742, entitled "MICROMACHINED INERTIAL SENSOR DEVICES," filed Aug. 3, 2010; U.S. patent application Ser. No. 12/849,787, entitled "MICROMACHINED DEVICES AND FABRICATING THE SAME," filed Aug. 3, 2010 and U.S. Provisional Patent Application Ser. No. 61/384,240, entitled "MICROMACHINED MONOLITHIC 6-AXIS INERTIAL SENSOR," filed Sep. 18, 2010, each of which is incorporated by reference in its entirety.

BACKGROUND

Microelectromechanical systems ("MEMS") designers face a number of design considerations. For example, reducing the footprint of a chip is an ever-present goal in microelectromechanical systems ("MEMS") design. One problem that is often encountered is the need for a MEMS and an integrated circuit such as an application specific integrated circuit ("ASIC") chip to act together. In some instances, performance is improved if the MEMS and the ASIC are located near to one another. Accordingly, it is desirable to package these components near one another.

Another goal of MEMS design is reducing the influence of undesired stress on the MEMS. A major source of package stress on MEMS devices is a mismatch of the coefficient of thermal expansion ("CTE") between device materials. This is commonly seen in the CTE mismatch between an organic substrate material such as FR-4 and a silicon device. FR-4 has a CTE of ~14 ppm/° C. while silicon has a CTE of 2.9 ppm/° C. Such a CTE mismatch induces stress when the temperature changes if these two materials are adhered to each other using a stiff solder.

A critical feature of many MEMS devices is a hermetic seal that prevents the flow of water into the device. If water or water vapor seeps into a MEMS package, capacitances that affect performance of the MEMS can vary uncontrollably, negatively impacting function. Accordingly, it is desirably to seal MEMS from the environment.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Stacking components can reduce the size of a MEMS device, such as an inertial sensor that uses an oscillating proof-mass to measure motion. For example, stacking a MEMS onto an ASIC can reduce the package footprint. However, without a reliable method of connecting an electrical signal from one side of the ASIC to the other, there are few configurations that enable stacking. The MEMS could be placed on top of the ASIC and wire-bonding used to connect the two chips, but this requires wire bonding, which slows down the assembly process, and requires additional die space to be set aside to ensure the ASIC is sufficiently bigger than the MEMS to allow the wire bonding equipment to safely connect the two chips. This adds cost and increases the size of the system.

One MEMS packaging approach involves placing the ASIC under the MEMS device, bumping the ASIC to the MEMS, and the MEMS to the PCB. This package design does eliminate the need for side by side chip placement, but creates problems relating to packaging stresses because the MEMS is directly bumped to the PCB. Another alternative uses a silicon interposer bumped to the PCB with the MEMS bumped on top of the interposer and the ASIC bumped below the interposer. Certain designs disclosed herein solves the package stress issues encountered using the previously mentioned package concept, but increases the package stack height by adding a third wafer. Including a third wafer in the package adds cost and increases assembly complexity, lowering yield. Both high cost and low yield are major problems for consumer products.

The present subject matter provides a new IC processing technology, through silicon via ("TSV"), which enables the transfer of an electrical signal from one side of an ASIC to the other. This provides is a novel package structure in which a MEMS device is placed directly on top of an ASIC, which is then mounted to a printed circuit board ("PCB"). This package reduces or minimizes the required footprint of the overall system, improves performance, and introduces fewer or no components for packaging purposes only. These advantages enable new applications, and improve existing applications by making them smaller and lowering their cost.

In an example, a MEMS device is bump bonded to an ASIC, which is bump bonded to a PCB. Because wire bonding is not needed, this package can be very quickly assembled using chip scale processing.

Another advantage of the designed package is the ability to use wafer level packaging, where many MEMS and ASIC devices are packaged at once at the wafer level. This greatly improves process throughput and allows engineers to take advantage of wafer level processing techniques, further lowering cost and improving functionality.

Figure 1:
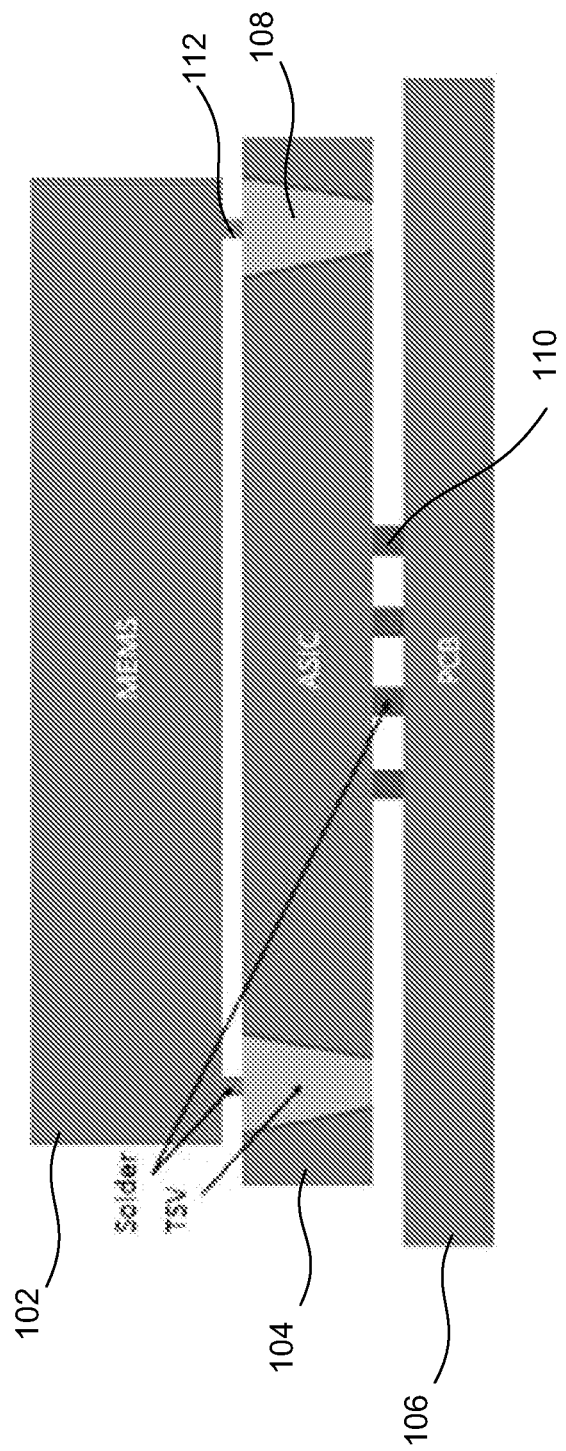
FIG. 1 illustrates an MEMS stacked onto an ASIC, according to an example.

FIG. 1 illustrates an MEMS stacked onto an ASIC, according to an example. In an example, a PCV 106 is coupled with an ASIC 104, such as via a cluster of solder connections 110. In an example, the cluster of solder connections 110 both electrically connects the PCB to the ASIC and physically connects the PCB to the ASIC. Although a cluster is illustrates, as few as one solder connection may be used. In an example, a cluster approach for solder connections provides for less stress on the ASIC, as set forth herein.

In an example, the ASIC 104 includes one or more through-silicon-vias 108 disposed through the ASIC. In an example, the one or more through-silicon-vias 108 are in electrical communication with one or more of the solder connections 110. In an examples, one or more solder connections 112 couple a MEMS to the ASIC. In an example, the one or more solder connections connecting the MEMS to the ASIC directly connect to a through-silicon-via 108, such both electrically connecting the MEMS to the ASIC and physically connecting the MEMS to the ASIC.

Figure 2:
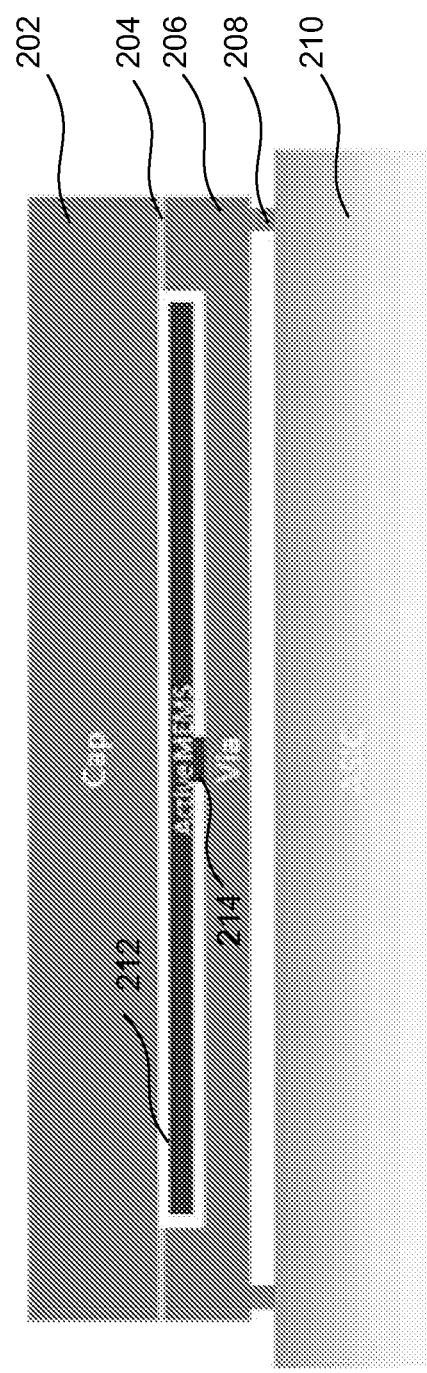
FIG. 2 illustrates a cross-section of a MEMS system, according to an example.

FIG. 2 illustrates a cross-section of a MEMS system, according to an example. In an example, a MEMS device 212 is stacked on an ASIC 210, which is optionally mounted onto a PCB. In an example, the MEMS 212 is attached to the ASIC 210 by solder interconnects 208 on the top side of the ASIC 210. In an example, the MEMS 210 is enclosed between a via wafer 206 and a cap 202. In an example, the cap 202 is soldered to the via 206. Other examples adhere the cap 202 to the via 204 or otherwise join. Such an enclosure can provide one or both of an environmental enclosure for the MEMS and stiff mechanical support to ensure that packaging stresses do not impact critical MEMS components within the enclosure. In an example, the solder joints 208 between the via 206 & ASIC wafers 210 are located on the outer edges of the via wafer 208. Such a location of the solder joints 208 can reduce or minimize the impact of the stress generated by the PCB such as through thermal expansion.

Reducing or minimizing the impact of packaging stresses is critical for MEMS device performance. Many package stress relief tools exist, like soft solder balls, soft die attach, stress boundary layers, and package designs aimed at reducing or minimizing the amount of stress generated by temperature change. However, many of these technologies are expensive, implemented within the package, and achieve limited stress relief and reduction. If the solder bumps are placed directly below critical MEMS components, any small amount of stress generated in the solder bumps or on the PCB can harm the performance of those critical components.

On the other hand, there are device level concepts for reducing the impact of package stresses. Reducing or minimizing the size and/or number of anchors and moving anchors for critical moving parts to the center of the package encourages or ensures symmetry and reduces the stress on the floating device components, but these only address stress problems for the moving parts, in an example. They can only address the anchor problems to a certain degree and they cannot address stress deformation problems on unanchored device elements like parallel plate sense electrodes that are embedded in the via wafer. Another limitation is that most MEMS devices user or require multiple components that are anchored separately. In an example, these components will move and stress differently because they are anchored to different parts of a bending via wafer. In an example, one may limit the effect of packaging stresses by moving these anchors closer together, but to achieve high performance specifications like very low packaging stress effects, better stress relief is desired.

Because of the limitations in current device and package level stress relief capabilities, existing stress relief features do not sufficiently isolate the entire MEMS system from packaging stresses well enough to achieve high performance packaging stress specifications.

Accordingly, the present technology provides advantages in the reduction of the impact of packaging stresses on the MEMS device. In an example, the ASIC provides a layer of separation between the MEMS device, which is susceptible to packaging stresses, and the source of those stresses, such as a PCB substrate. The provision of such a layer is an important advantage when considering sensitive high performance MEMS devices, like gyroscopes, where small packaging stresses result in large error signals.

In an example, package stress relief structures discussed herein separate a micromachined mechanical device from substrate packaging stresses. In an example, a device for which stress is reduced is a 6-degree-of-freedom inertial sensor. However, the Package Stress Relief Structure can easily be implemented in many other MEMS devices requiring low package stresses.

In an example, the present subject matter provides structure built into one or more MEMS silicon layers that separates critical device components from packaging stresses. In an example, the solder interconnects are placed away from critical components. In an example, stress relief features are etched into the silicon that connects those interconnects to the critical components to generate flexible regions that absorb deformation and stress generated by the mismatched thermal expansion of the silicon and the substrate.

Figure 3:
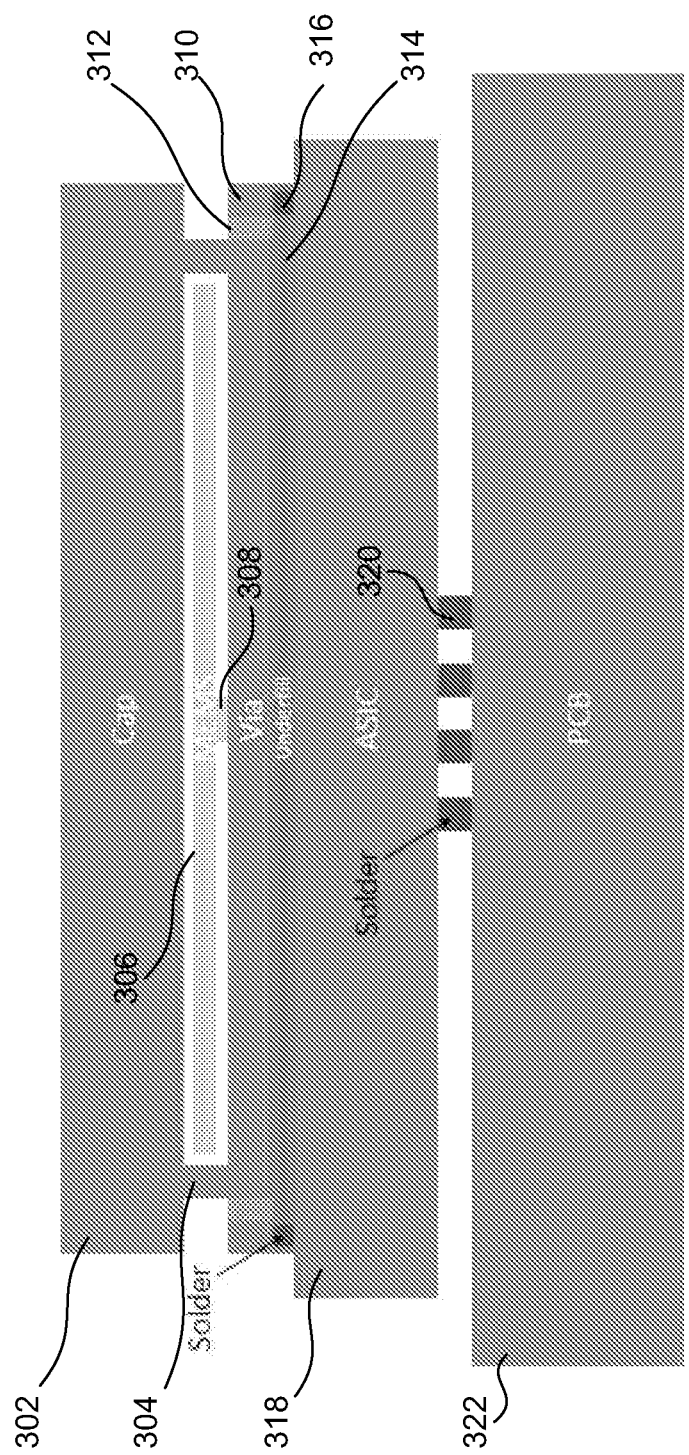
FIG. 3 illustrates a cross-section of a MEMS system, including a printed circuit board ("PCB"), according to an example.

FIG. 3 illustrates a cross-section of a MEMS system, including a printed circuit board ("PCB"), according to an example. In an example, an ASIC 318 is coupled to a PCB 322, such as with a cluster of solder interconnects 320. In an example, a via layer or via 310 is coupled to the ASIC 318, such as with solder connections 316. In an example, the solder connections are disposed on a stress reduction member, with a gap or groove 312 defined between a main body of the via 310 and the stress reduction member such as a flexible arm. In an example, a MEMS 306 is coupled to the via 310 via an anchor 308. A cap 302 is coupled to the via 310 in an example. In an example, a gap 306 is disposed between the cap 302 and the MEMS 306. In an example, a gap 306 is disposed between the via 310 and the MEMS 306. In an example, the gap is hermetically sealed. In an example, a gas is disposed in the gap. In an example, the gas is other than atmosphere. In an example, the gap is at a pressure lower than ambient atmosphere.

An example of a package stress relief structure is shown in FIG. 3. In this structure, a MEMS device 306 is stacked on an ASIC 318, which is then mounted onto a PCB 322, the substrate. The MEMS 306 is attached to the ASIC 318 by solder interconnects 316 on the flexible arms of the package stress relief structure used to protect the active MEMS device 306 from packaging stresses. These arms freely deform under stress and do not transfer undesired deformation or stress to critical MEMS device components.

In an example, because mechanical deformation and stress on the ASIC does not harm ASIC performance, the ASIC can be used as an additional layer of separation between the silicon MEMS device and the organic substrate to further reduce the stress on the MEMS device. In an example, the ASIC/PCB interconnections 320 are clustered as closely as possible at the center of the ASIC to limit the distance over which the silicon and FR-4 substrate are connected. Because packaging stress arises due to differences in thermal expansion and contraction, the shorter the distance, the shorter the expansion mismatch and the smaller the stress generated.

In an example, the moving MEMS device is enclosed between a via wafer 310 and a cap 302 to provide both an environmental enclosure for the MEMS and stiff mechanical support to ensure stress does not impact the critical MEMS components within the enclosure. In an example, the via wafer also contains critical sense electrodes that measure the displacement of the moving mass. In an example, solder joints 316 between the via 310 and ASIC 318 wafers are located on a flexible region of the via wafer outside the enclosing box to allow stress and deformation to relax without impacting the enclosed MEMS device 306. In an example, the ASIC 318 is attached to the PCB 322 at its center to limit the area over which CTE mismatched materials are connected.

Figure 4:
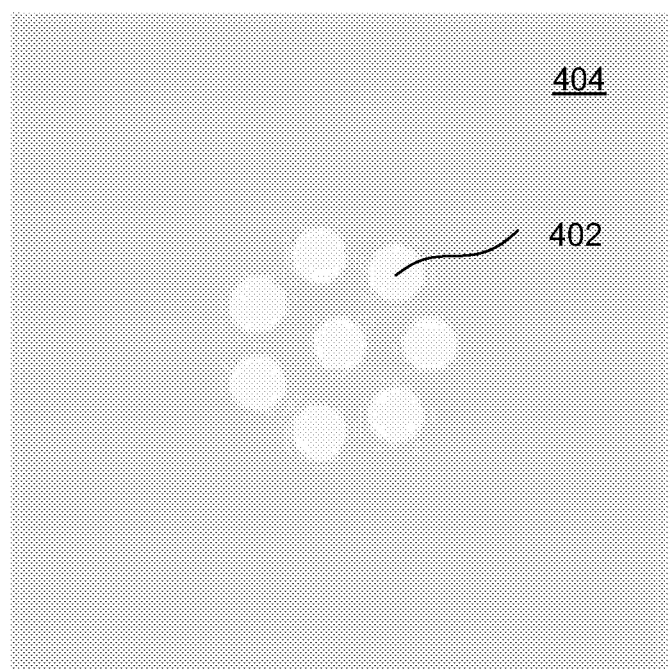
FIG. 4 illustrates interconnects for connecting a first electric component to a second electric component.

FIG. 4 illustrates interconnects for connecting a first electric component to a second electric component. In an example, the figure illustrates interconnects between components of a packaged MEMS device. In an example, the figure illustrates ASIC to PCB solder joint configuration. The bumps 402 are clustered together as closely as possible in the center of the device 404 to limit the distance over which the CTE mismatch acts. This results in minimal package stress generation, and minimized the packaging stress that must be absorbed by the stress reduction mechanisms.

Figure 5:
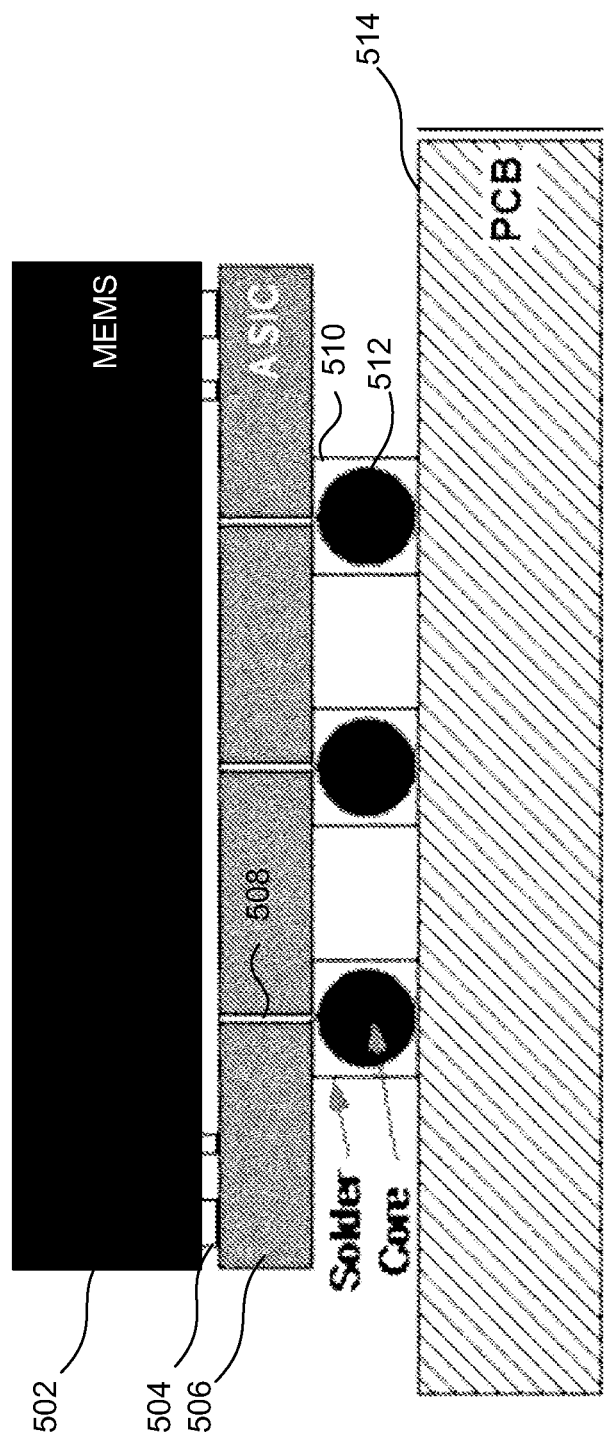
FIG. 5 illustrates a cross section of a MEMS system stacked onto an ASIC and onto a PCB, with polymer core interconnects, according to an example.

FIG. 5 illustrates a cross section of a MEMS system stacked onto an ASIC and onto a PCB, with polymer core interconnects, according to an example. Various materials may be used to interconnect one component to another. For example, various materials can connect an ASIC 504 to a PCB 514. Materials contemplated include, but are not limited to, SAC, Sn—Ag, and a polymer core 512 copper interconnect 510 that utilizes a low stiffness polymer core 512. In some examples, the copper interconnect 510 also includes a low stiffness stress boundary layer (SBL) on one or both the silicon and substrate sides of the interconnect to reduce the stress translated from the substrate to the silicon. In an example, this interconnect is more flexible and reduces the stress transferred to the ASIC 506 and the MEMS 502. The illustrated example shows a via 508 extending through the ASIC 506 to copper interconnect 510, but the present subject matter is not so limited.

The illustrated example shows a sealing ring 504 to seal an interior space between the MEMS 502 and the ASIC 506, but the present subject matter is not so limited. The material used in the ring, such as a solder ring, varies among examples.

Various examples provide a stress reduced or stressless seal such as a hermetic seal. Such a seal can be implemented with different chip level solder stress relaxation mechanisms as set forth herein. By way of several examples, such a stress reduced or stressless hermetic seal is shown both connected and unconnected (designated by an apostrophe suffix) to each solder stress relaxation mechanism. In each of the examples, a stress relaxation mechanism may be for use in interconnecting an ASIC to a MEMS device. In some examples, a stress relaxation mechanism can be used to connect another component to a MEMS device, such as a cap or a via. Several examples are provided in FIGS. 6-12, but the present subject matter is not so limited.

Figure 6A:
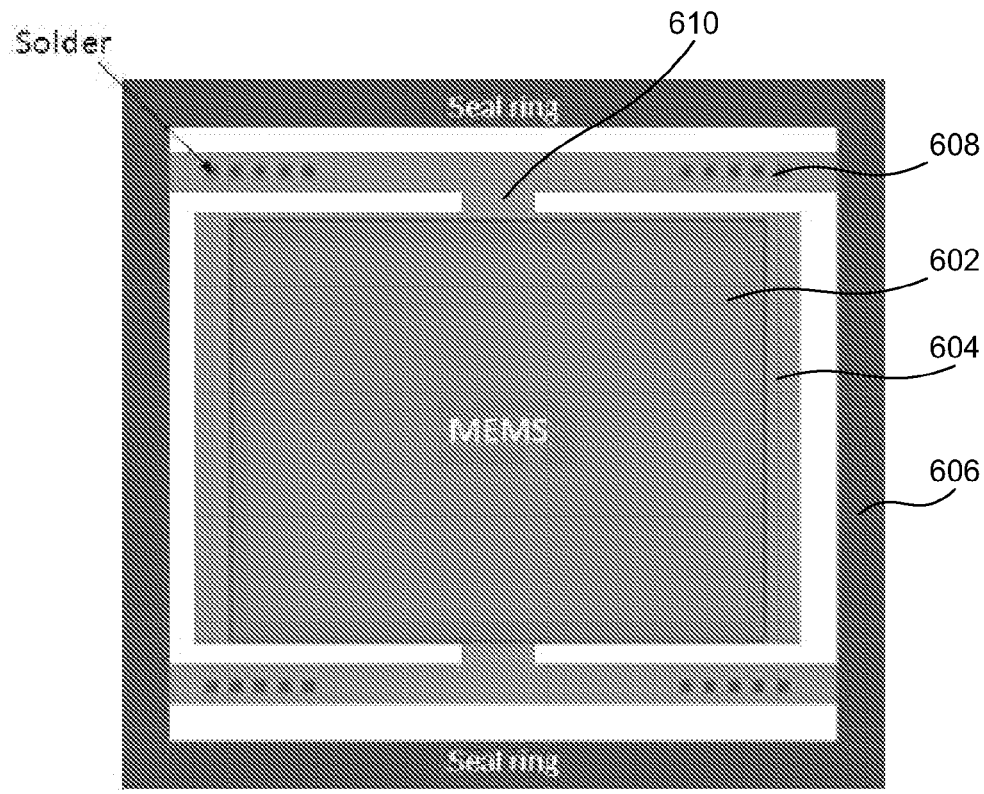
FIG. 6A illustrates a component including T-shaped stress-reducing elements coupled with an optional seal, according to an example.
Figure 6B:
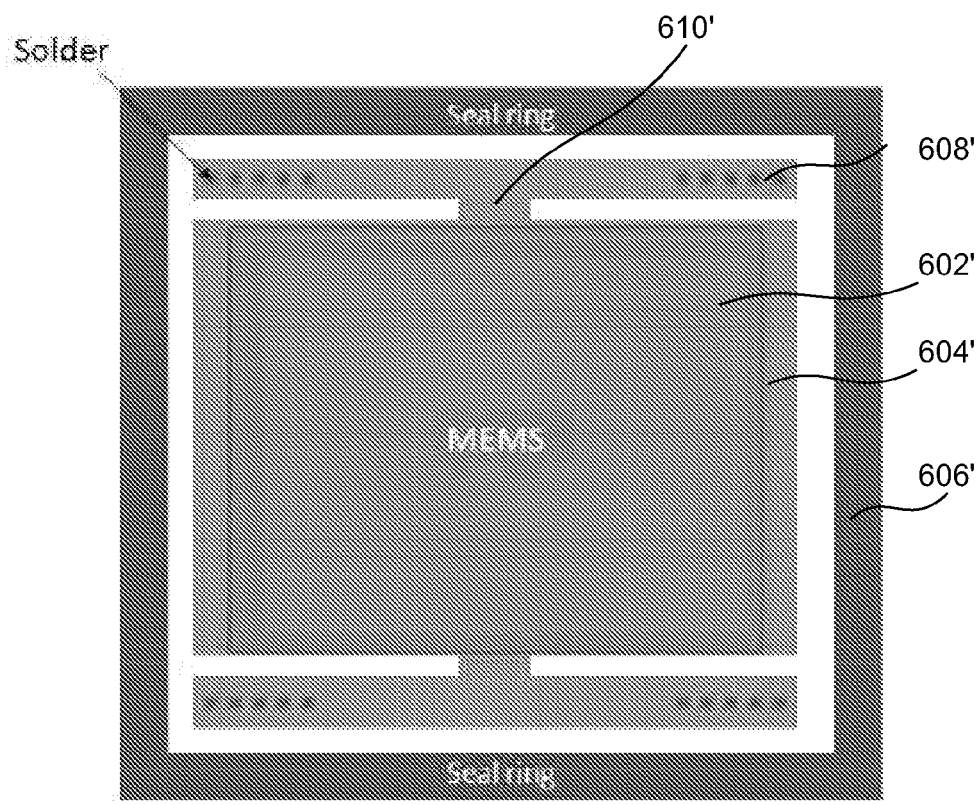
FIG. 6B illustrates a component including T-shaped stress-reducing elements and an optional seal, according to an example.

FIG. 6A illustrates a component including T-shaped or wing stress-reducing elements coupled with an optional seal, according to an example. FIG. 6B illustrates a component including T-shaped stress-reducing elements and an optional seal, according to an example. In various examples, it is possible for stress relief features to be etched into the ASIC 604. FIGS. 6A-B, as well as others discussed herein, illustrate potential stress relief designs.

In the illustrated configuration, the ASIC 604 to PCB bumps 608 are placed on flexible arms 610 away from the MEMS 602 to flex and reduce the stress transfer from the PCB to the MEMS 602. This allows more flexibility for the bump arms and improves symmetry.

In an example, the bumps 608 are moved to the outside and the connections from the flexible arms 610 to the MEMS 602 are moved to the center of the flexible arms. This allows more flexibility for the bump arms and improves symmetry. In an example, a seal ring 606 surrounds the MEMS 602 and the ASIC 604. In an example, the seal ring is disposed between the ASIC 604 and another device, such as an MEMS, a PCB or a via. The seal ring can optionally be implemented as part of a MEMS assembly cap, as taught herein.

Figure 7A:
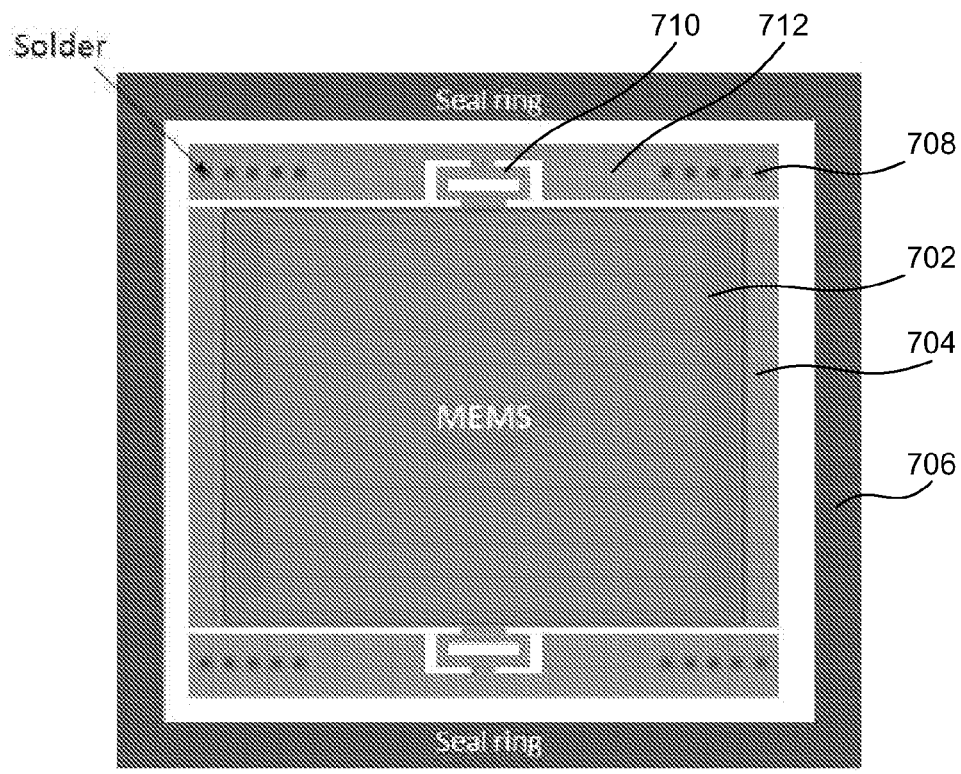
FIG. 7A illustrates a component including stress-reducing elements defining a void and coupled with an optional seal, according to an example.
Figure 7B:
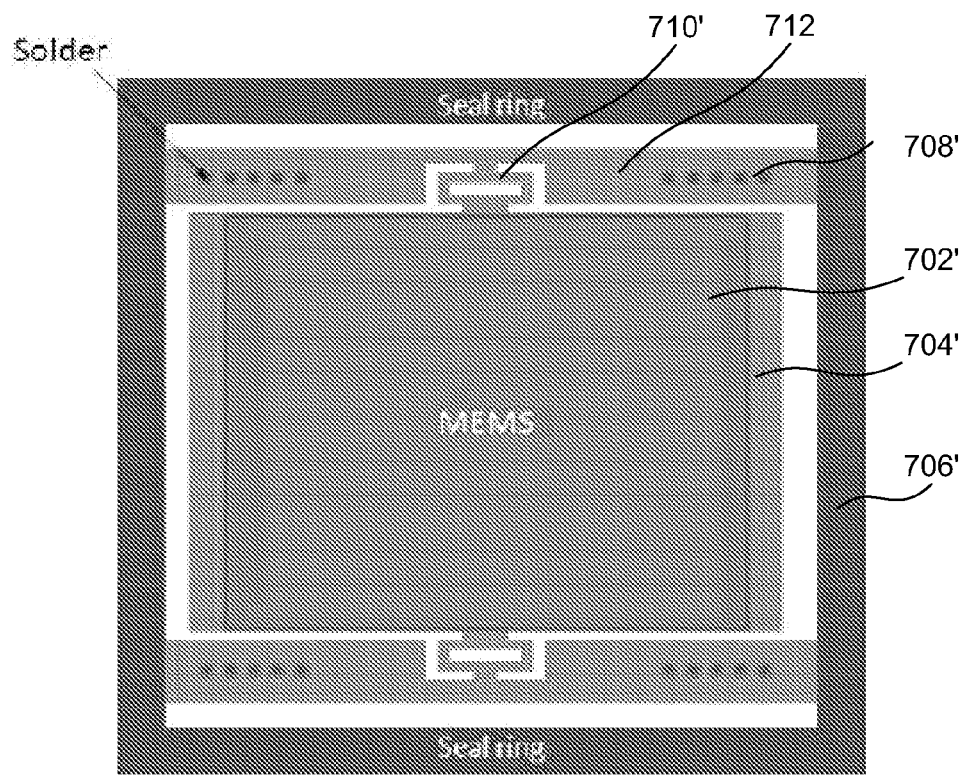
FIG. 7B illustrates a component including stress-reducing elements defining a void and an optional seal, according to an example.

FIG. 7A illustrates a component including stress-reducing elements defining a void and coupled with an optional seal, according to an example. FIG. 7B illustrates a component including stress-reducing elements defining a void and an optional seal, according to an example. In an example, compliant features 710 are implemented on the flexible arms 712 to reduce the impact of packaging stresses on the active MEMS components 702. In an examples, solder interconnects 708 are placed at a distal end of each arm 710. In an example, the compliant features disposed between an arm 712 and the ASIC 704 defines a void. In an example, the void is an elongate rectangle disposed lengthwise in parallel with a length of the arm 712. In an example, the compliant feature 710 is centered on a side of the ASIC 704. In an example, a seal ring 706 surrounds the MEMS 702 and the ASIC 704. In an example, the seal ring is disposed between the ASIC 704 and another device, such as an MEMS, a PCB or a via.

Figure 8A:
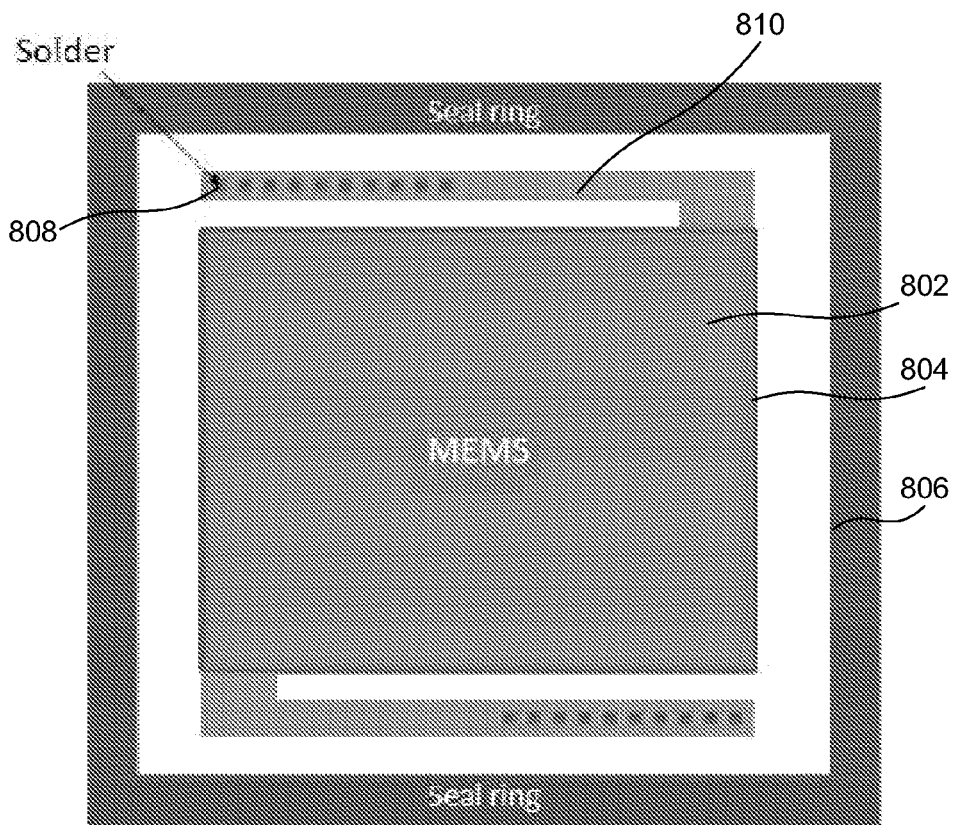
FIG. 8A illustrates a component including corner-coupled stress-reducing elements coupled with an optional seal, according to an example.
Figure 8B:
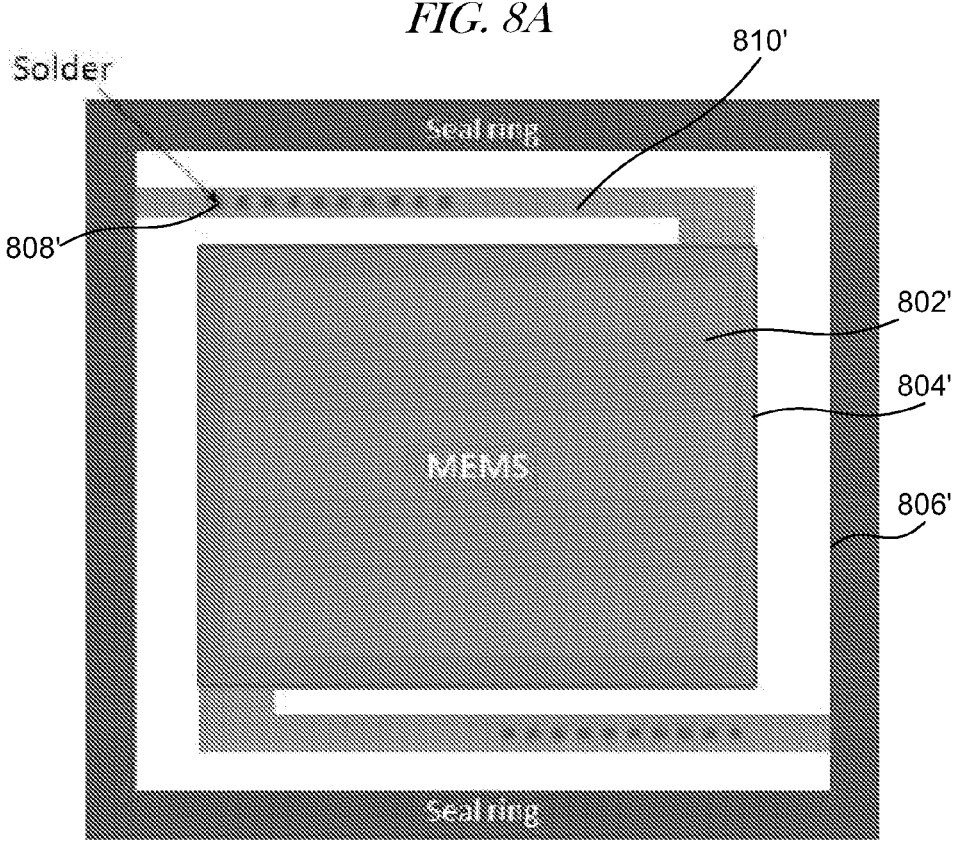
FIG. 8B illustrates a component including corner-coupled stress-reducing elements and an optional seal, according to an example.

FIG. 8A illustrates a component including corner-coupled stress-reducing elements coupled with an optional seal, according to an example. FIG. 8B illustrates a component including corner-coupled stress-reducing elements and an optional seal, according to an example. In this configuration, the flexible arms 810 dispose solder joints 808 away from the connection of the arm to the MEMS enclosure 802. In an example, each arm is coupled proximal a corner of a side of an ASIC 804, and extends along the side of the ASIC 804. In an example, the arm extends along the side of the ASIC 804 parallel to the ASIC 804. In an example, the arm 810 has a rectangular cross section consistent along its length, but the present subject matter is not so limited. In an example, a seal ring 806 surrounds the MEMS 802 and the ASIC 804. In an example, the seal ring is disposed between the ASIC 804 and another device, such as an MEMS, a PCB or a via.

Figure 9A:
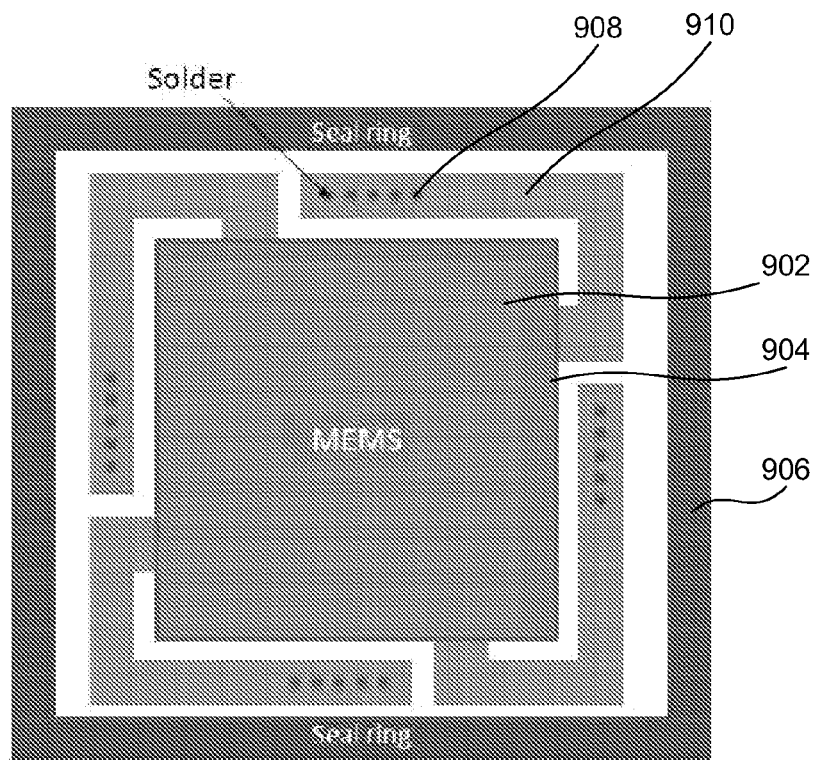
FIG. 9A illustrates a component including wrap-around stress-reducing elements coupled with an optional seal, according to an example.
Figure 9B:
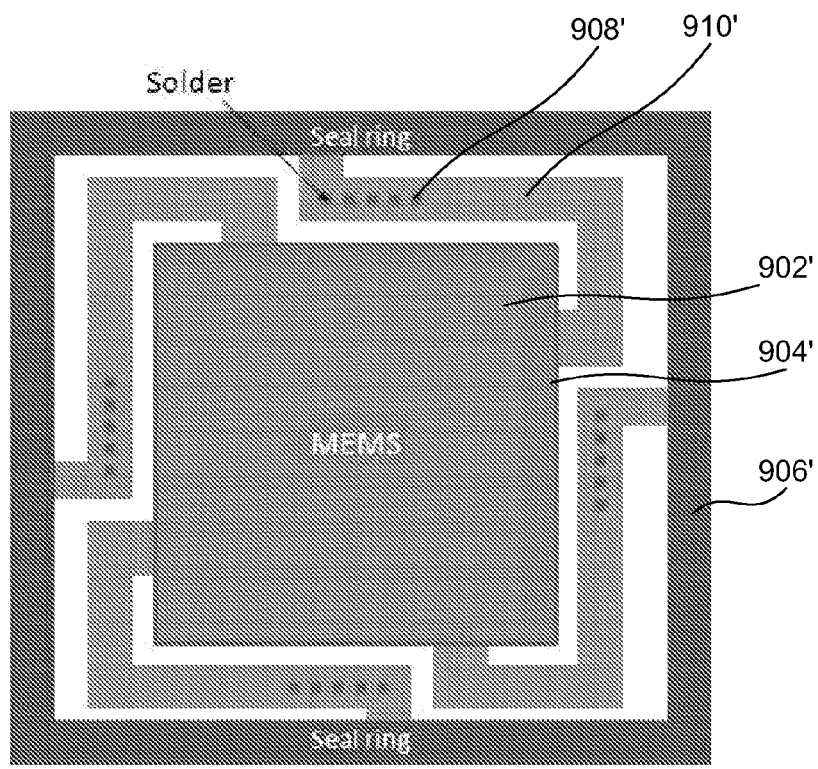
FIG. 9B illustrates a component including wrap-around stress-reducing elements and an optional seal, according to an example.

FIG. 9A illustrates a component including wrap-around stress-reducing elements coupled with an optional seal, according to an example. FIG. 9B illustrates a component including wrap-around stress-reducing elements and an optional seal, according to an example. In this example, the bumps 908 are placed on bent arms 910 to further improve flexibility and reduce the stress transferred from the substrate to the MEMS 902. In this configuration, the bent arms 910 dispose solder joints 908 away from the connection of the arm to the MEMS enclosure 902. In an example, each arm is coupled proximal a corner of a side of an ASIC 904, and extends along the side and an adjacent side of the ASIC 904. In an example, the arm extends along the side and an adjacent side of the ASIC 904 parallel to the side along the side and parallel to the adjacent side along the adjacent side of the ASIC 904. In an example, the arm 910 has a rectangular cross section consistent along its length, but the present subject matter is not so limited. In an example, a seal ring 906 surrounds the MEMS 902 and the ASIC 904. In an example, the seal ring is disposed between the ASIC 904 and another device, such as an MEMS, a PCB or a via.

Figure 10A:
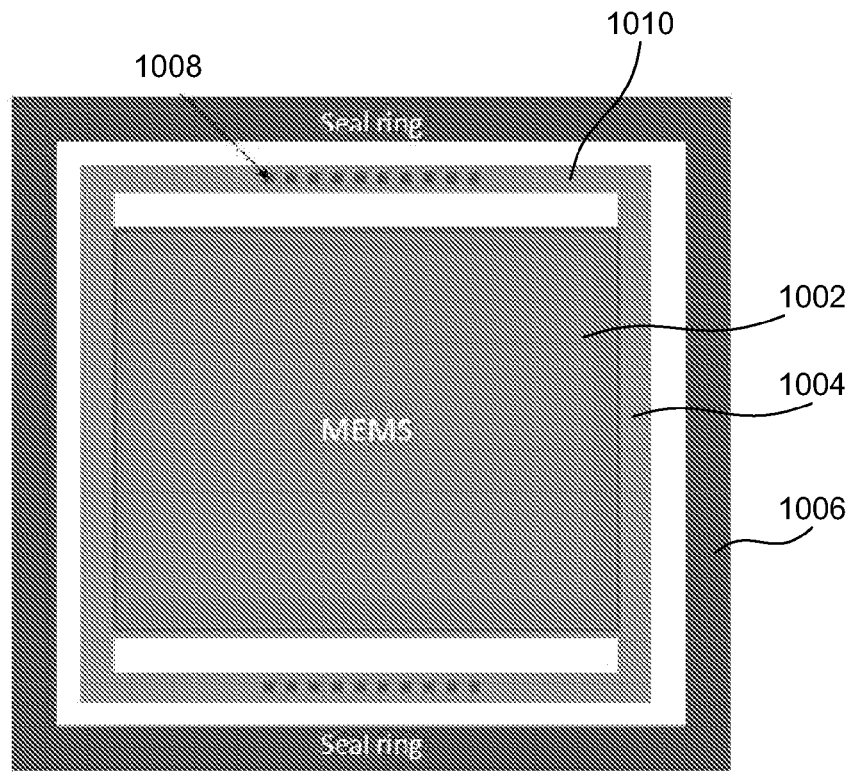
FIG. 10A illustrates a component including wrap-around stress-reducing elements coupled with an optional seal, according to an example.
Figure 10B:
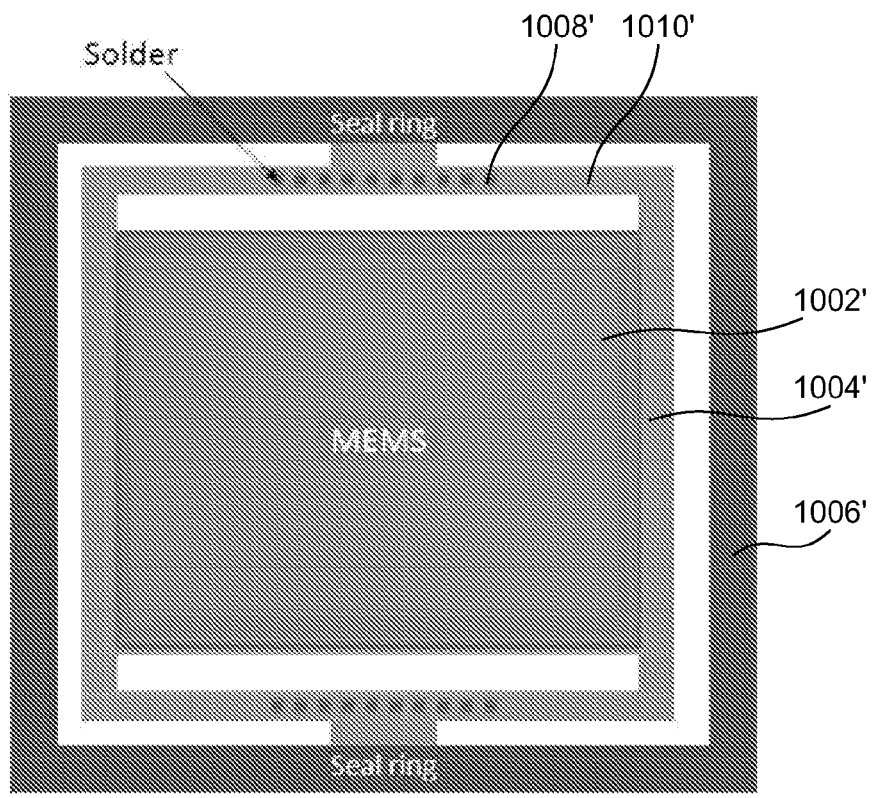
FIG. 10B illustrates a component including wrap-around stress-reducing elements and an optional seal, according to an example.

FIG. 10A illustrates a component including wrap-around stress-reducing elements coupled with an optional seal, according to an example. FIG. 10B illustrates a component including wrap-around stress-reducing elements and an optional seal, according to an example. In an example, a groove is etched into the via wafer or ASIC 1004 to separate the solder joints 1008 from the active MEMS elements 702. In an example, this allows the solder joints 1008 to move significantly without stressing on critical elements such as the MEMS 1002, reducing the impact of package stresses on device performance.

In an example, a seal ring 1006 surrounds the entire device and is connected to the stress relief groove-defining member 1010. In an example, the seal ring 1006 is mostly or completely unconnected to the solder stress relief arms 1010. In an example, this allows for more flexibility in both the seal ring 1006 and the solder stress relief arms 1010.

Figure 11A:
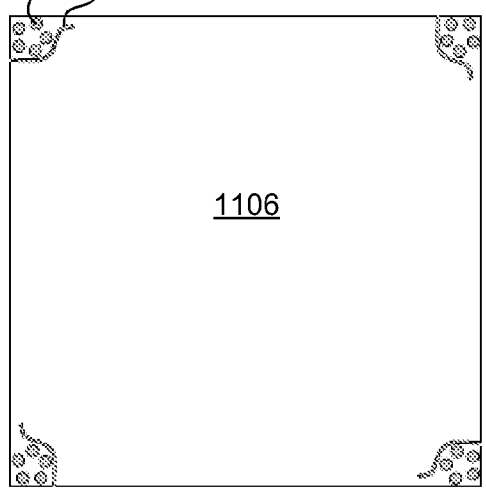
FIG. 11A illustrates a component including stress-reducing elements set in a corner, according to an example.

FIG. 11A illustrates a component including stress-reducing elements set in a corner, according to an example. In an example, a device 1106 includes a cluster 1102 of interconnects in each of four corners, although fewer corners may be used, or the cluster 1102 may be disposed elsewhere on the device 1106. In an example, a gap is defined in the device 1106 between a flexure bearing portion and a main body. In an example, the gap extends around the cluster 1102, starting proximal a first side, and curving around the cluster 1102 to an adjacent side. In an example, the gap also extends briefly along the adjacent side.

Figure 11B:
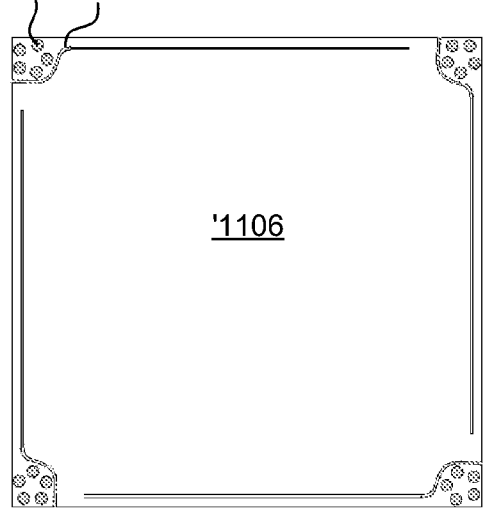
FIG. 11B illustrates a component including stress-reducing elements set in a corner, according to an example.

FIG. 11B illustrates a component including stress-reducing elements set in a corner, according to an example. In an example, a device '1106 includes a cluster '1102 of interconnects in each of four corners, although fewer corners may be used, or the cluster '1102 may be disposed elsewhere on the device '1106. In an example, a gap is defined in the device '1106 between a flexure bearing portion and a main body. In an example, the gap extends around the cluster '1102, starting proximal a first side, and curving around the cluster '1102 to an adjacent side. In an example, the gap also extends along most of the adjacent side.

Figure 11C:
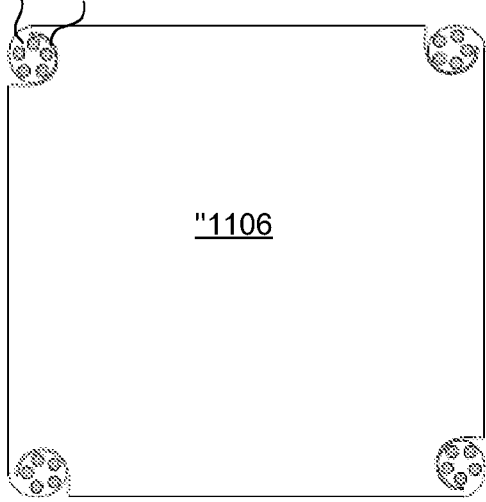
FIG. 11C illustrates a component including stress-reducing elements set in a corner, according to an example.

FIG. 11C illustrates a component including stress-reducing elements set in a corner, according to an example. In an example, a device "1106 includes a cluster "1102 of interconnects in each of four corners, although fewer corners may be used, or the cluster "1102 may be disposed elsewhere on the device "1106. In an example, a gap is defined in the device "1106 between a flexure bearing portion and a main body. In an example, the gap extends around the cluster "1102, starting proximal a first side, and curving around the cluster "1102 to an adjacent side.

Figure 11D:
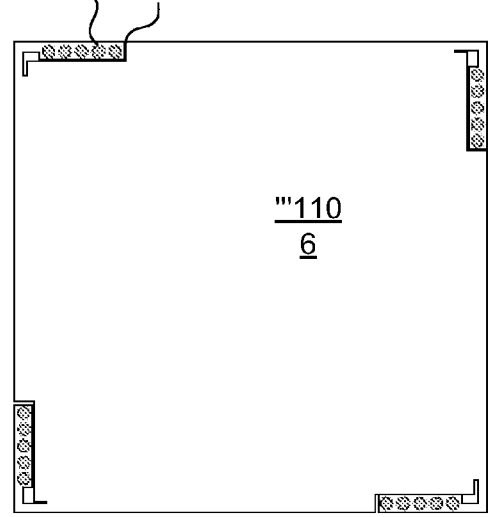
FIG. 11D illustrates a component including stress-reducing elements set in a corner, according to an example.

FIG. 11D illustrates a component including stress-reducing elements set in a corner, according to an example. In an example, a device '''1106 includes a line '''1102 of interconnects in each of four corners, although fewer corners may be used, or the line '''1102 may be disposed elsewhere on the device '''1106. In an example, a gap is defined in the device '''1106 between a flexure bearing portion and a main body. In an example, the gap extends perpendicular a side, then around the line of interconnects '''1102, then perpendicular to and proximal an adjacent side.

Presented above are 4 different options for placing the bumps at the four corners of the ASIC, reducing the impact of the package stress relief structure on overall die size.

Figure 12:
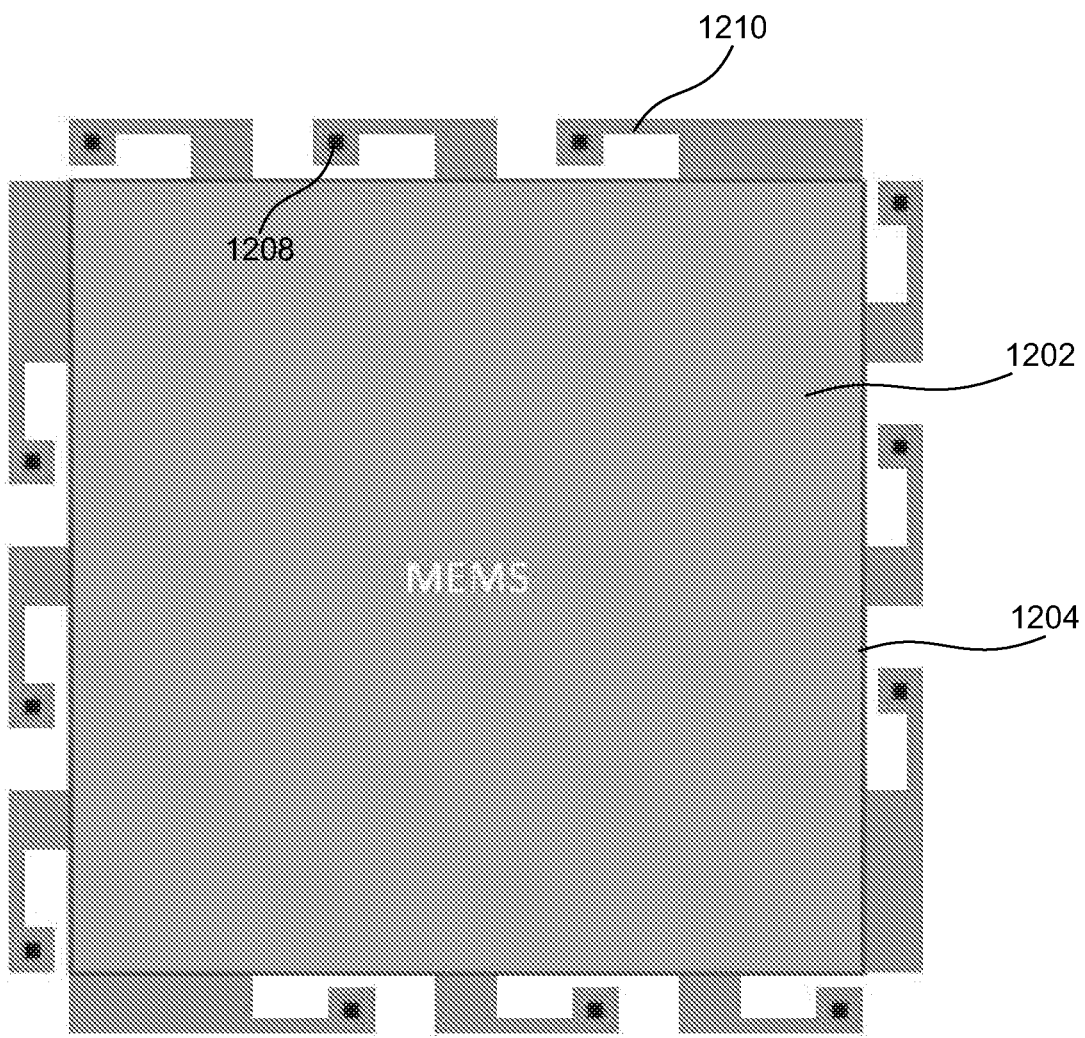
FIG. 12 illustrates a component including wrap-around multiple stress-reducing elements disposed around a perimeter, according to an example.

FIG. 12 illustrates a component including wrap-around multiple stress-reducing elements disposed around a perimeter, according to an example. In this example, each solder bump 1208 is individually supported by a flexible springs or flexure bearing. This configuration helps to reduce compounding stresses from multiple bumps seen in other configurations. In this configuration, the bumps 1208 are placed on bent arms 1210 to further improve flexibility and reduce the stress transferred from the substrate to the MEMS 1202. In this configuration, the bent arms 1210 dispose a solder joint 1208 away from the connection of the arm to the MEMS enclosure 1202. In an example, each arm is coupled to a side of an ASIC 1204, and extends along the side of the ASIC 1204. In an example, the arm extends along the side of the ASIC 1204 parallel to the side along the side. In an example, the arm 1210 has a rectangular cross section consistent along its length, but the present subject matter is not so limited.

Figure 13A:
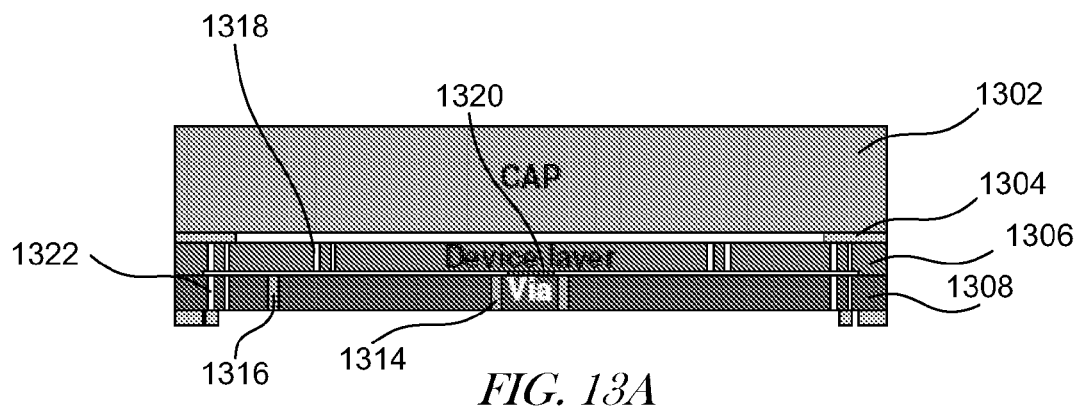
FIG. 13A illustrates a device with a seal and a groove in a via wafer, according to an example.
Figure 13B:
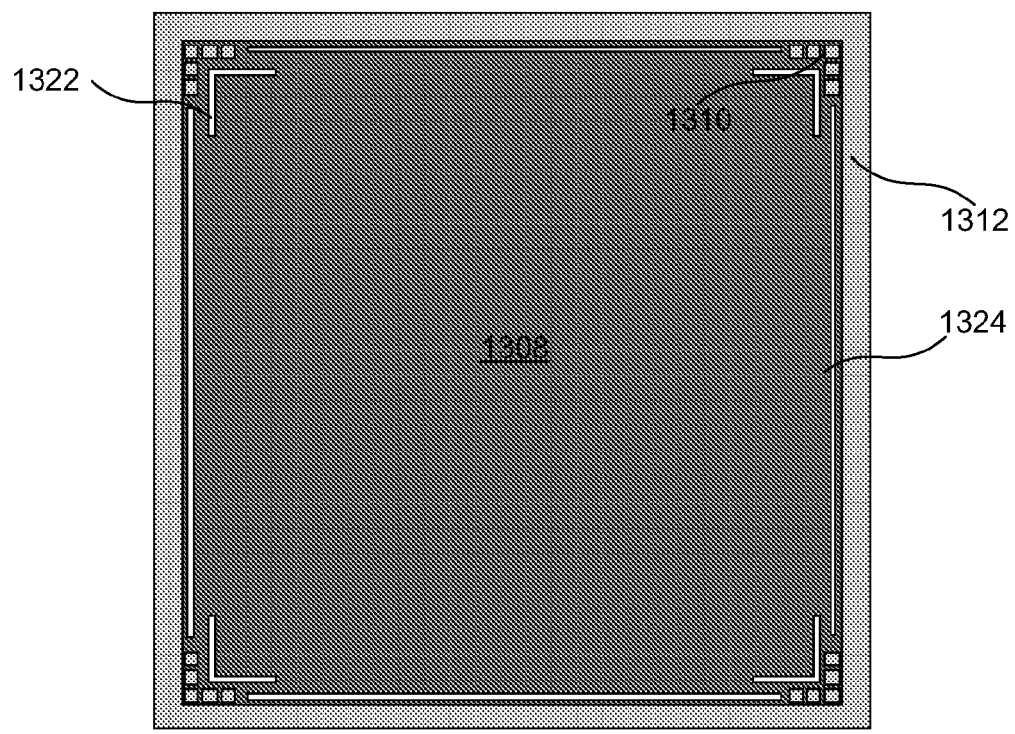
FIG. 13B is a bottom view of the device in FIG. 13A, showing a void disposed between stress-reducing members and a via wafer, according to an example.

FIG. 13A illustrates a device with a seal and a groove in a via wafer, according to an example. FIG. 13B is a bottom view of the device in FIG. 13A, showing a void disposed between stress-reducing members and a via wafer, according to an example. This example reduces the die size and changes the compliance mechanism between the seal ring 1312 and active MEMS 1308. In the example, solder interconnects 1310 are to interconnect a via 1308 to a substrate such as a PCB. In an example, a gap 1322 is disposed in the via along tow adjacent sides in a corner to allow for a PCB to via 130 CTE mismatch. In an example, another gap 1324 extends along each side. In an example, additional gaps are disposed in the via 1308, such as around a connection point to an anchor 1320 for a MEMS device layer 1306. In an example, an adhesive or solder 1304 coupled a cap 1302 to the device layer 1306. In an example, the MEMS device layer 1306 includes one or more gaps 1318, such as to enable function of the MEMS device layer 1306, such as in instances where a portion of the MEMS device layer oscillates, and/or to further isolate mismatches in thermal expansion.

Figure 14A:
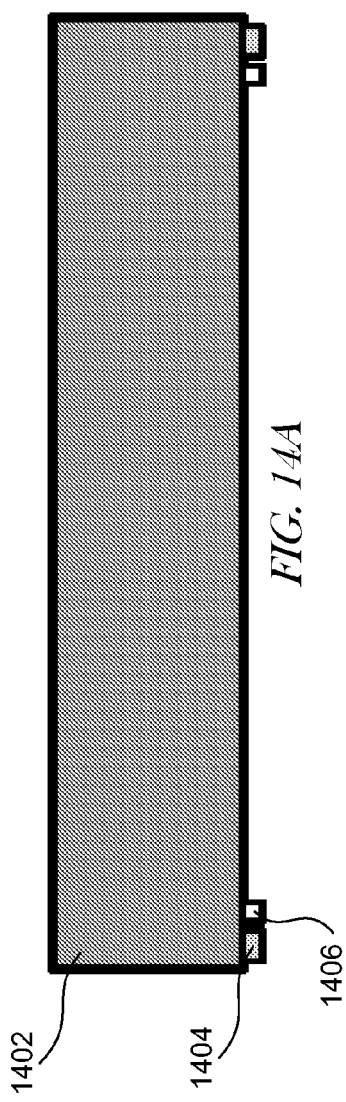
FIG. 14A illustrates a device with a seal, according to an example.
Figure 14B:
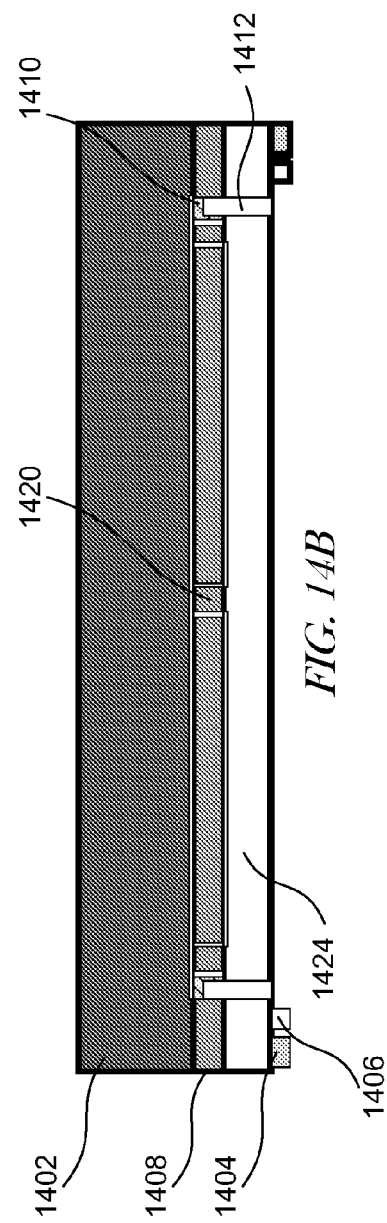
FIG. 14B is a cross-section of the device in FIG. 14A, showing a void disposed between stress-reducing members and a MEMS and an via wafer, according to an example.

FIG. 14A illustrates a device with a seal, according to an example. FIG. 14B is a cross-section of the device in FIG. 14A, showing a void disposed between stress-reducing members and a MEMS and a via wafer, according to an example.

In this configuration, the compliance mechanism 1412 between the solder interconnects 1406 and the active MEMS device 1402 utilizes both the via wafer 1408 and the device layer 1402 instead of just the via wafer 1408. The via wafer 1408 includes a connection portion 1410 that is less thick than a remainder of the via wafer 1408, in an example. This allows an out of plane compliance mechanism to be implemented, improving stress rejection. In an example, other configurations of the package stress relief structure are built in the via wafer 1408 only. This modification allows for improved flexibility because of the added degree of freedom, in an example.

In this configuration, the compliance mechanism 1412 between the seal ring 1404 and the active components 1402 utilizes both the via wafer 1408 and the device layer 1402 instead of just the via wafer 1408. In an example, this allows an out of plane compliance mechanism to be implemented, improving stress rejection.

In an example, the reduced stress or stressless hermetic seal can be implemented in multiple package configurations. It is a component of the MEMS chip, and not a function of overall package configuration or geometry. Herein are shown package configurations that can leverage the stressless hermetic seal technology. FIGS. 15-24 show several seal examples.

Figure 15A:
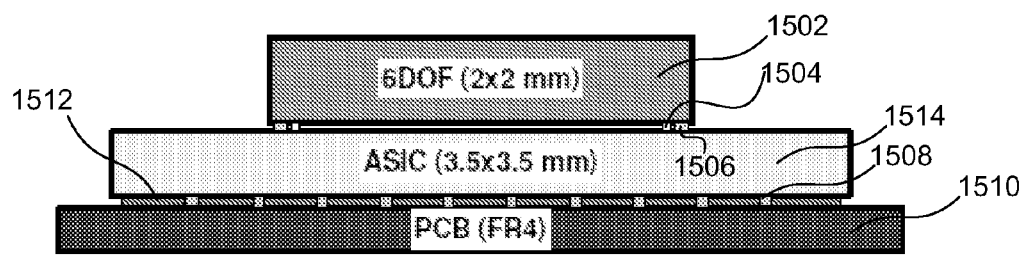
FIG. 15A illustrates a device with a seal, according to an example.
Figure 15B:
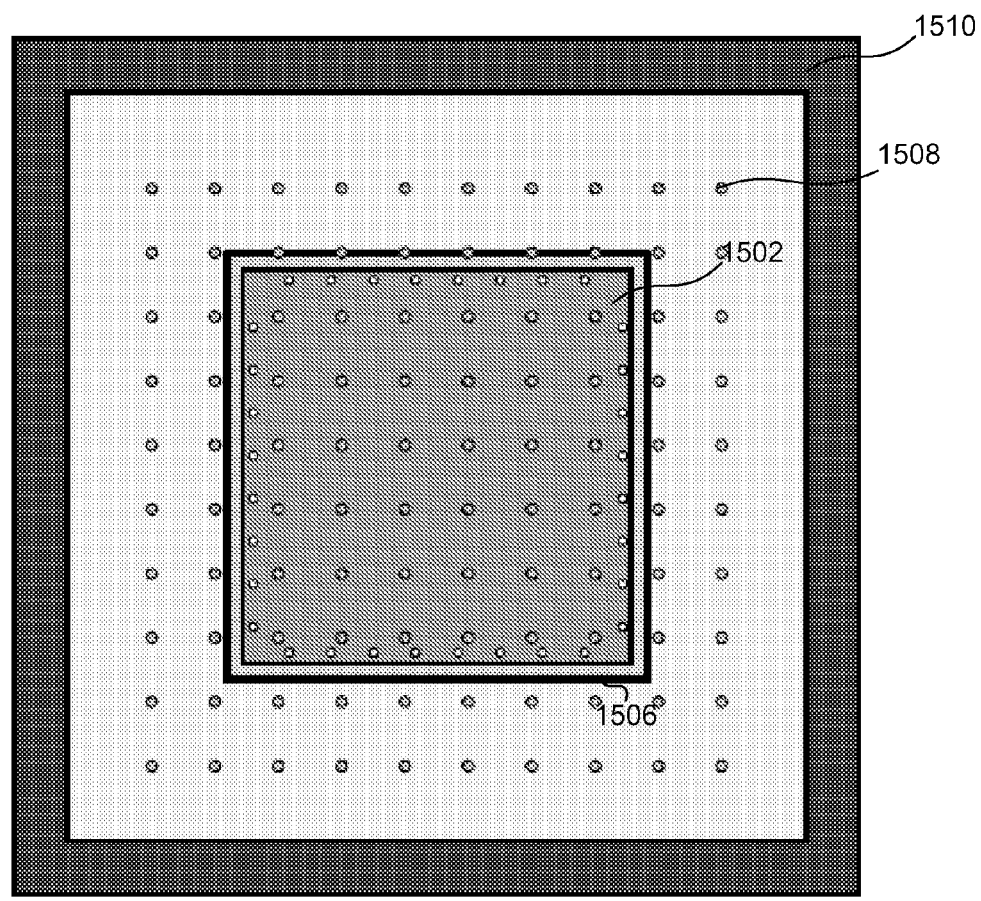
FIG. 15B is a bottom view schematic of the device in FIG. 15A, showing an array of connection points.

FIG. 15A illustrates a device with a seal, according to an example. FIG. 15B is a bottom view schematic of the device in FIG. 15A, showing an array of connection points. The illustration shows a bump configuration for the stacked package with many ASIC to PCB bumps, illustrating the possibility of implementing the package stress relief structure with multiple different ASICs. In the example, a MEMS device 1502, such as a 6-degree of freedom inertial sensor, sits atop an ASIC 1514, with solder interconnects 1504 connecting them, and with a seal ring 1506 providing a seal, such as to protect a sealed interior from the environment. The ASIC is coupled to PCB 1510 such as FR-4 with a plurality of solder interconnects 1508. In the example, underfill 1512 is disposed between the ASIC 1514 and the PCB 1510.

Figure 16A:
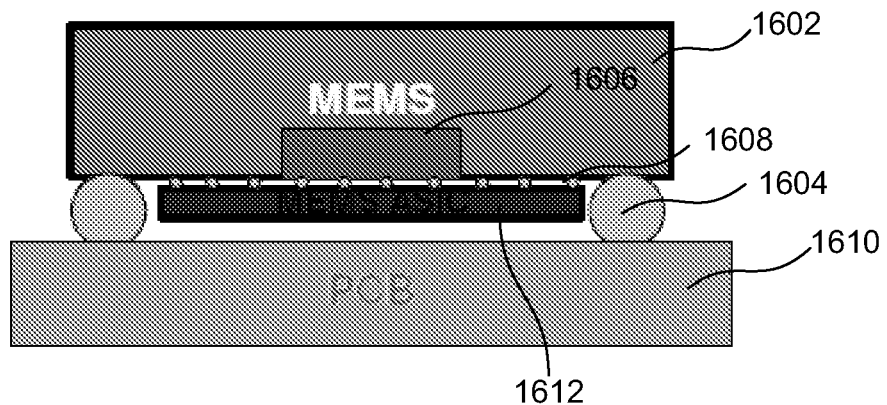
FIG. 16A illustrates a device including a high voltage component disposed on an ASIC alongside a MEMS device that includes interconnects coupled to a PCB, according to an example.
Figure 16B:
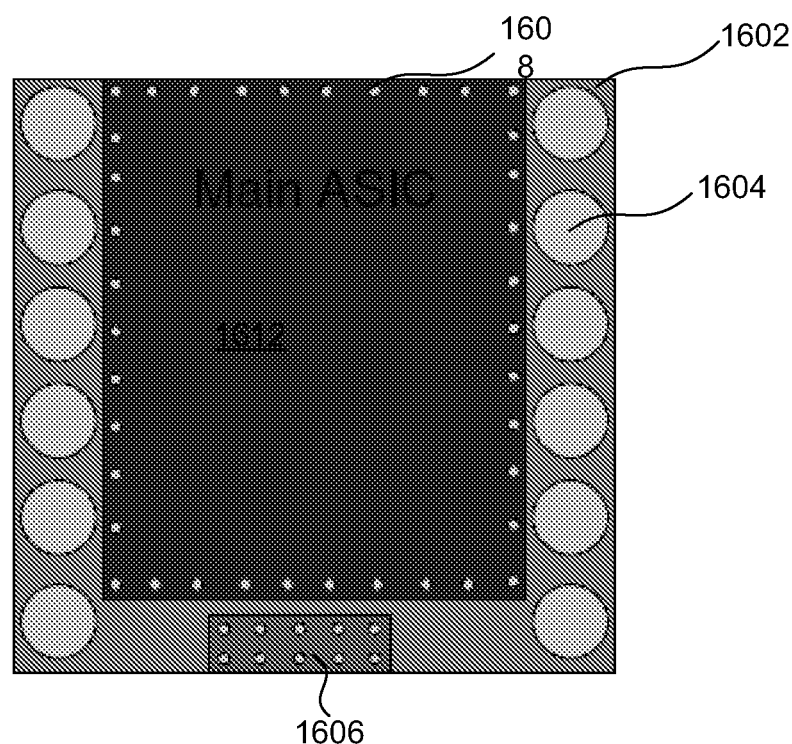
FIG. 16B is a bottom view of the device in FIG. 16A, showing an array of connection points.

FIG. 16A illustrates a device including a high voltage component disposed on an ASIC alongside a MEMS device that includes interconnects coupled to a PCB, according to an example. FIG. 16B is a bottom view of the device in FIG. 16A, showing an array of connection points. In an example, this package configuration improves stack height by bumping the MEMS 1602 directly to the PCB 1610 and using a smaller ASIC 1612 bumped to the MEMS in the cavity between the MEMS 1602 and PCB 1610. This configuration can be implemented with one or more die under the MEMS 1602 including an ASIC 1612, a high voltage ASIC 1606, a pressure sensor, and/or any other sensor or chip that will fit in the cavity between the MEMS 1602 and the PCB 1610.

Alternatively, if the ASIC 1612 is bigger than the MEMS 1602, the MEMS 1602 and ASIC 1612 can easily switch places, where the ASIC 1612 is bumped to the PCB 1610 and one or more die, including the MEMS 1602, are bumped to the ASIC 1612 in the cavity under the ASIC 1612. In an example, this configuration alleviates the need for TSV technology.

Figure 17A:
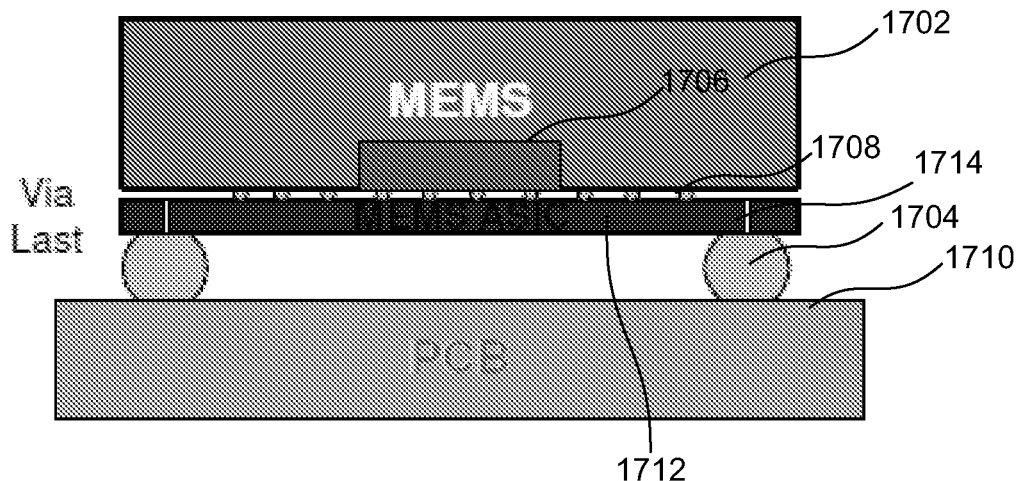
FIG. 17A illustrates a device including a high voltage component disposed on an ASIC alongside a MEMS device that includes interconnects coupled to the ASIC, according to an example.
Figure 17B:
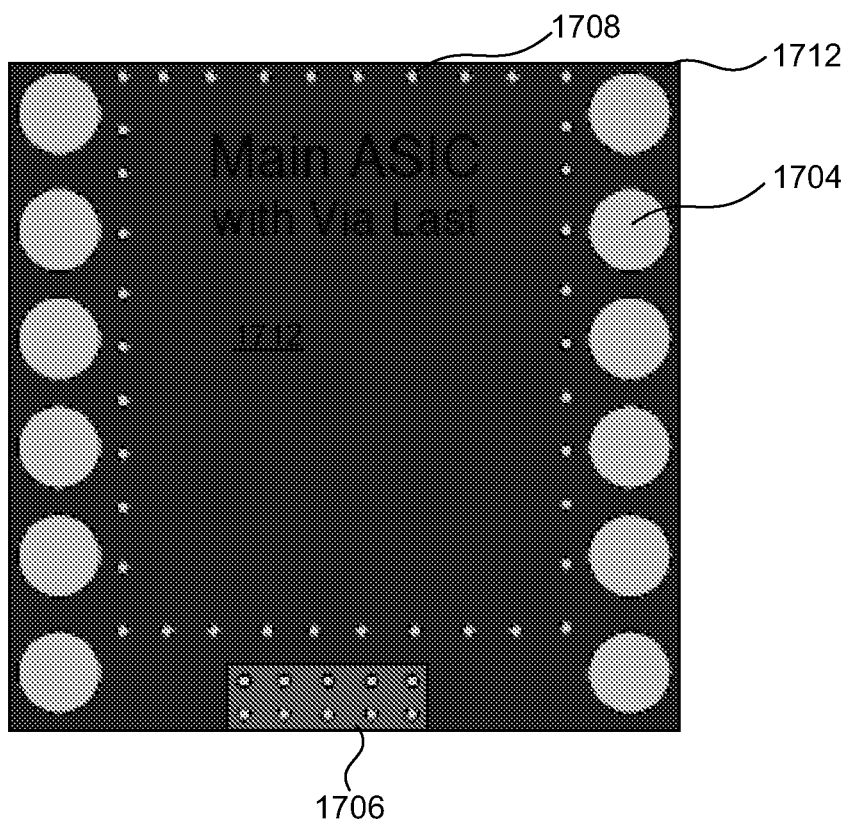
FIG. 17B is a bottom view of the device in FIG. 16A, showing an array of connection points.

FIG. 17A illustrates a device including a high voltage component disposed on an ASIC alongside a MEMS device that includes interconnects coupled to the ASIC, according to an example. FIG. 17B is a bottom view of the device in FIG. 16A, showing an array of connection points. In this example configuration, the MEMS die 1702 is bumped atop a main ASIC 1712 along with a second high voltage capable ASIC 1716. Via last 1714 has been added to the main ASIC 1712 to transfer electrical signals from one side of the main ASIC 1712 to the other. The main ASIC 1712 is bumped onto the PCB 1710. This is similar to the configuration with the addition of a high voltage ASIC 1706 bumped onto the main ASIC 1711 2 and replacement of the solder bumps. Other sensors or chips can be added to the configuration as area on the main ASIC 1712 permits. In an example, a seal ring 1708 provides the moisture barrier for the cavity between the MEMS and ASIC.

Figure 18A:
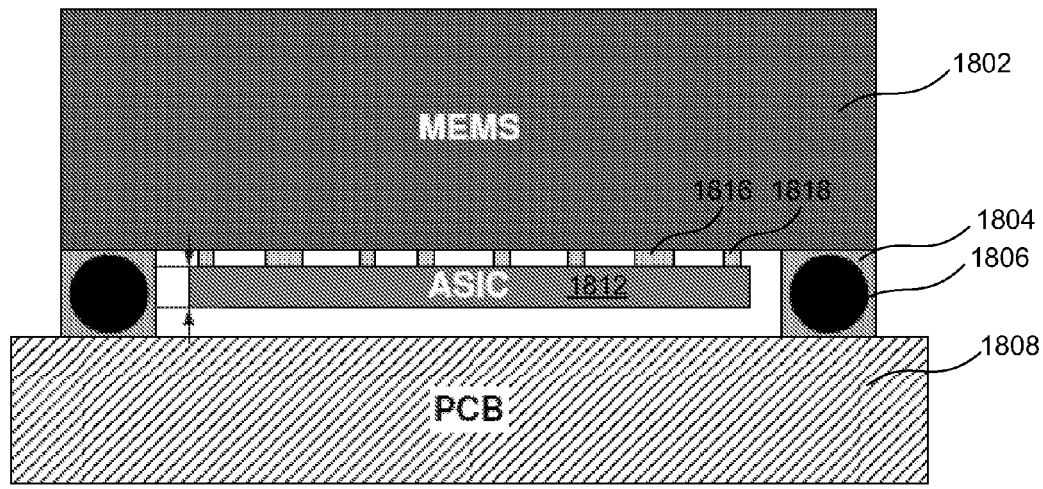
FIG. 18A illustrates a device with a seal, with a MEMS suspending an ASIC, according to an example.
Figure 18B:
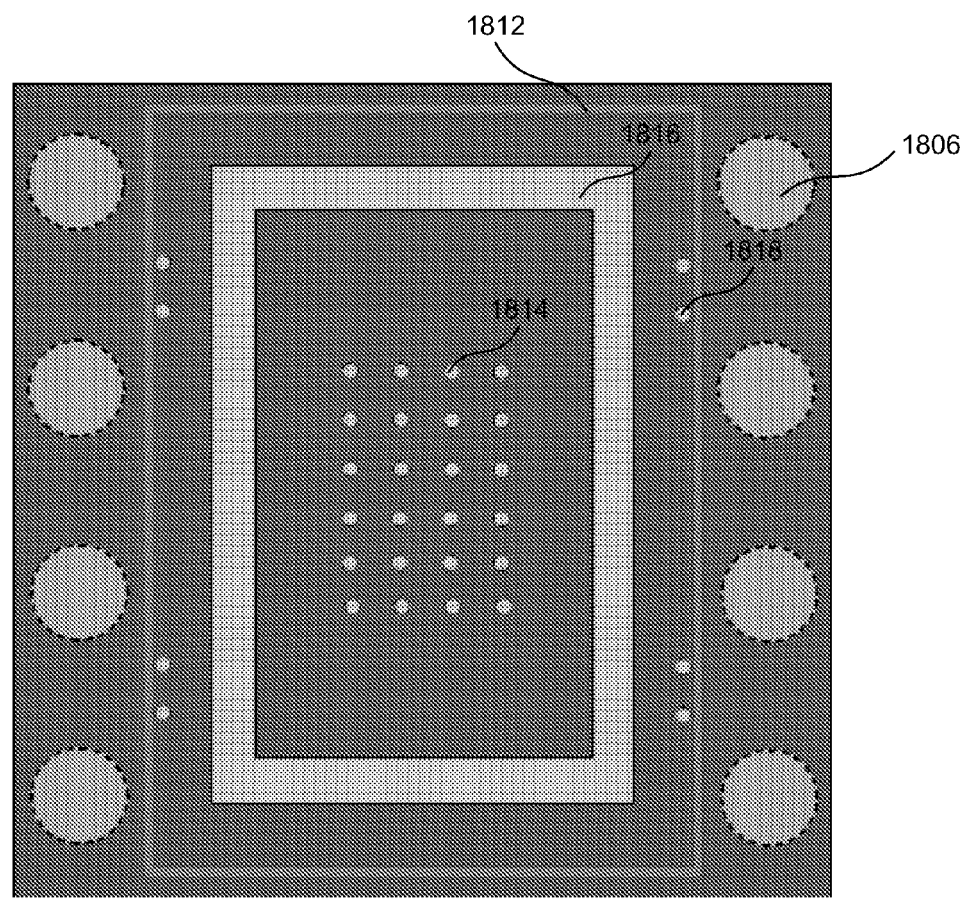
FIG. 18B is a bottom view schematic of the device in FIG. 18A, showing an array of connection points.

FIG. 18A illustrates a device with a seal, with a MEMS suspending an ASIC, according to an example. FIG. 18B is a bottom view schematic of the device in FIG. 18A, showing an array of connection points. This example improves the package stack height by bumping the MEMS 1802 directly to the PCB 1808 and using a smaller ASIC 1812 bumped to the MEMS 1802 in the cavity between the MEMS 1802 and PCB 1808. This configuration can be implemented with one or more die under the MEMS 1802 including an ASIC 1812, a separate high voltage ASIC 1812, a pressure sensor, and/or any other sensor or chip that will fit in the cavity between the MEMS 1802 and the PCB 1808. In an example, if the ASIC 1812 is bigger than the MEMS 1802, the MEMS 1802 and ASIC 1812 can easily switch places, where the ASIC 1812 is bumped to the PCB 1808 and multiple die, including the MEMS 1802, are bumped to the ASIC 1812 in the cavity under the ASIC 1812. In an example, a polymer core 1806 copper conductor 1804 interconnects the MEMS 1802 to the PCB 1808. In an example, copper interconnects 1814, 1818 interconnect the MEMS 1802 to the ASIC 1812. This example configuration reduces or eliminates the need for TSV technology. In an example, the package can be implemented with different bump configurations. If a hermetic seal is desires, this can be achieved using a solder ring 1816 enclosing certain parts, or with a moisture resistant underfill providing the hermetic seal.

Figure 19:
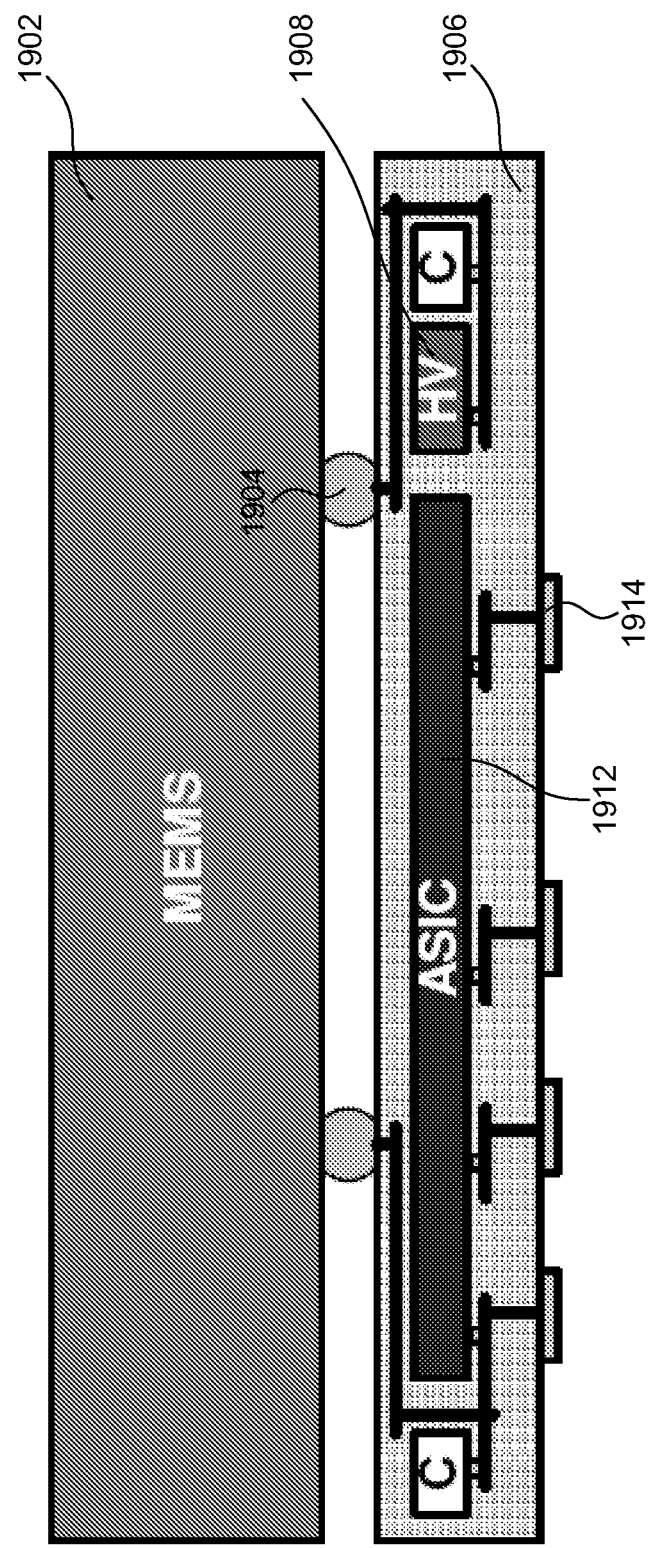
FIG. 19 illustrates a MEMS coupled to a substrate, with an ASIC disposed in the substrate, according to an example.

FIG. 19 illustrates a MEMS 1902 coupled to a substrate via interconnects 1904, with an ASIC 1912 disposed in the substrate, according to an example. In the example configuration, the ASIC 1912 and high voltage ASIC 1908 are embedded in a substrate 1906 such as a polymer substrate which routes electrical signals from the MEMS 1902 to the ASIC 1912 and PCB at 1914. This example can reduce or eliminate the need for a Through Silicon Via (TSV) on the ASIC.

Figure 20A:
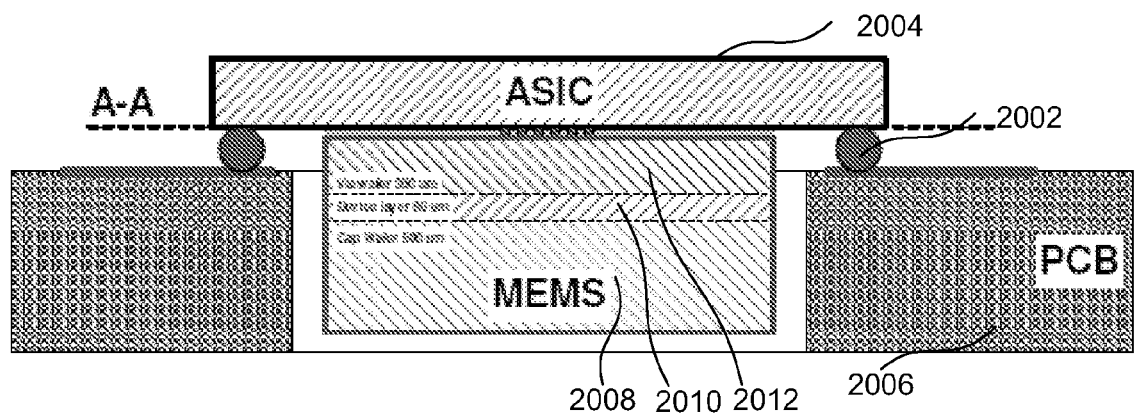
FIG. 20A illustrates a device with a seal, with a MEMS suspending an ASIC inside a void in a PCB, according to an example.
Figure 20B:
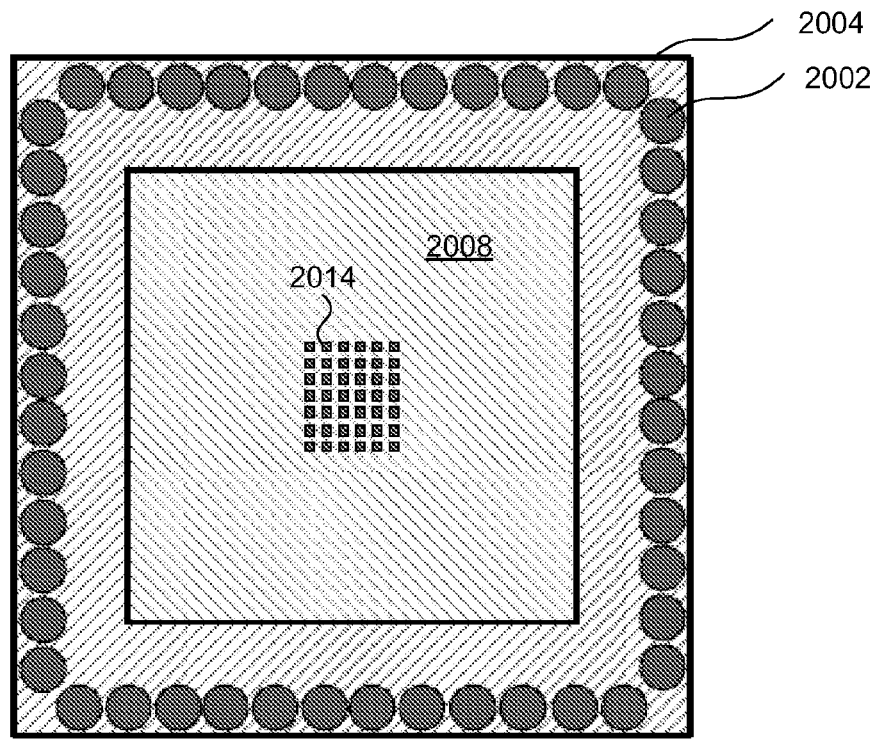
FIG. 20B is a bottom view schematic of the device in FIG. 18A, showing an array of connection points.

FIG. 20A illustrates a device with a seal, with a MEMS suspending an ASIC inside a void in a PCB, according to an example. FIG. 20B is a bottom view schematic of the device in FIG. 18A, showing an array of connection points. In this configuration, the PCB 2006 is stamped with a hole for the MEMS to fit into, and the ASIC 2004 with MEMS attached is flipped and bumped onto the PCB 2006. This configuration does not require TSV in the ASIC, and it relaxes constraints on the MEMS die height because the MEMS is placed in a hole made in the thicker PCB 2006. In the example, the MEMS includes a cap 2008, a device layer 2010 and a via layer 2012. In an example, cluster of interconnects 2014 located centrally on the MEMS interconnects the MEMS to the ASIC 2004.

Figure 21:
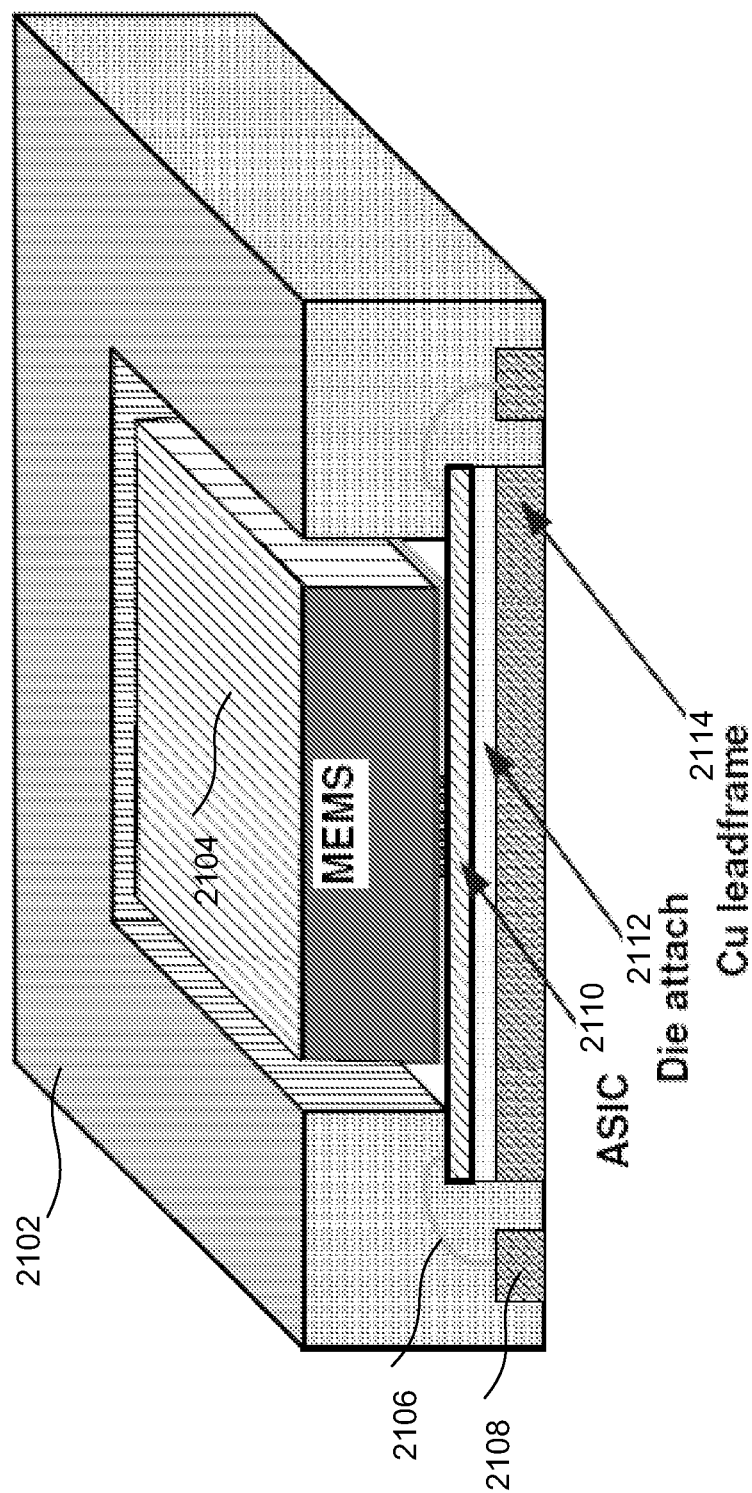
FIG. 21 illustrates a perspective view of a packaged MEMS system that is open, according to an example.

FIG. 21 illustrates a perspective view of a packaged MEMS system that is open, according to an example. The package stress relief structure can easily be implemented on a MEMS chip which is then placed in a standard open quad-flat no leads ("QFN") package. In an example, an ASIC 2110 is wire bonded to pads 2108 of the package. A plastic encapsulation 2102 locates the pads 2108 and the MEMS assembly. The MEMS assembly includes an ASIC 2110. A die attach 2112 is used to coupled to the ASIC 2110 to the remainder of the chip. Certain examples include a copper leadframe 2114.

Figure 22:
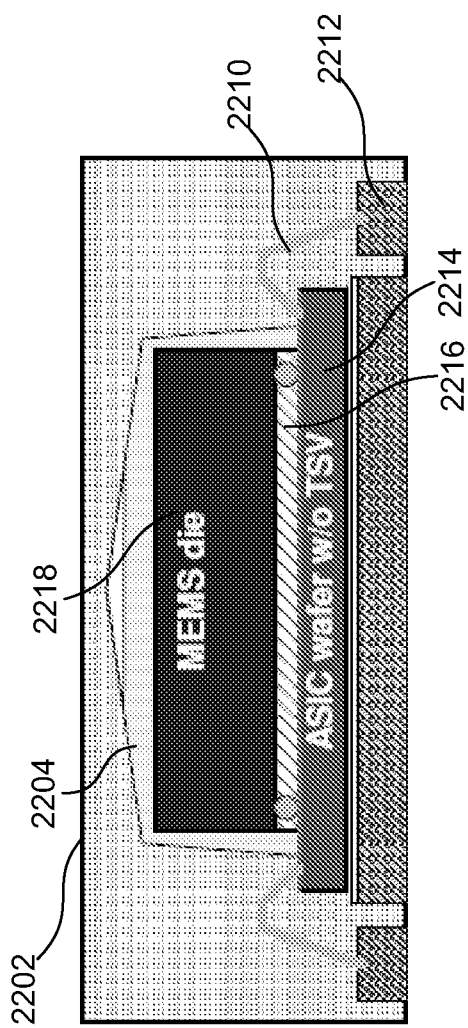
FIG. 22 illustrates a cross-section view of a packaged MEMS system that is closed, according to an example.

FIG. 22 illustrates a cross-section view of a packaged MEMS system that is closed, according to an example. The package stress relief structure can easily be implemented on a MEMS chip which is then placed in a closed quad-flat no leads ("QFN") package. In an example, an ASIC 2214 is wire bonded to pads 2212 of the package. A plastic encapsulation 2202 locates the pads 2212 and the MEMS assembly. The MEMS assembly includes an ASIC 2214. The package stress relief structure can also be implemented in an enclosed QFN package with silicone gel 2204. The silicone gel 2204 is used as a barrier to prevent the plastic from coming in contact with the MEMS device. Underfill 2216 is optionally disposed between the ASIC and the MMES dies 2218, although another sealing technique, such as a sealing ring, can be used.

Figure 23B:
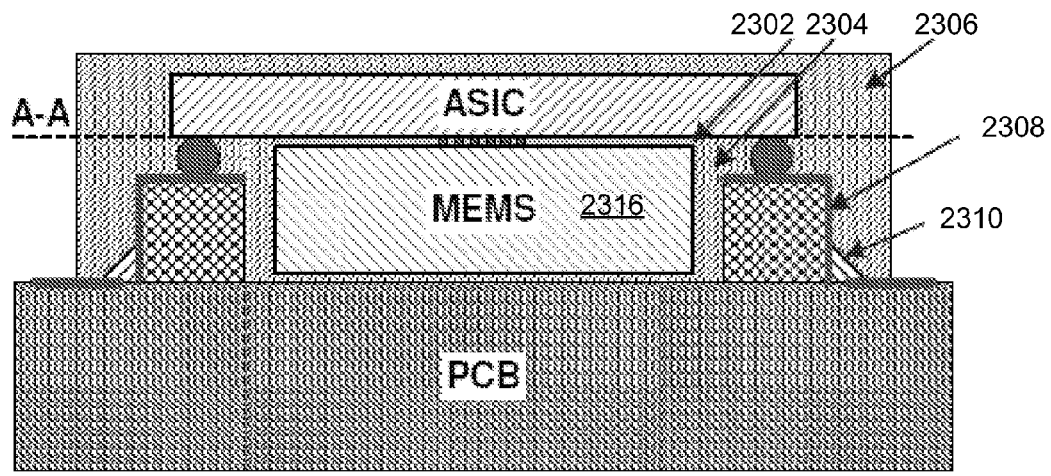
FIG. 23B is a bottom view schematic of the device in FIG. 18A, showing an array of connection points.
Figure 23A:
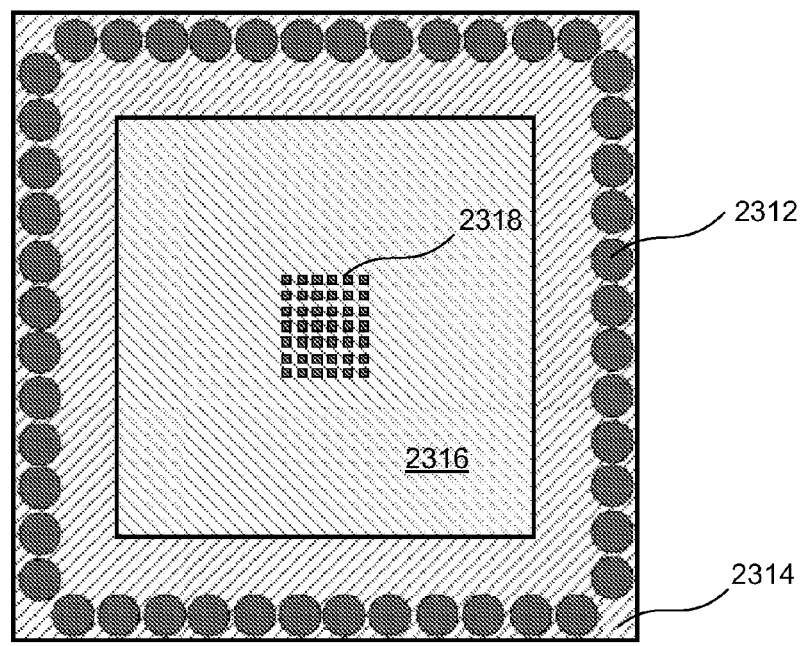
FIG. 23A illustrates a device with a seal, with a ASIC suspending a MEMS, according to an example.

FIG. 23A illustrates a device with a seal, with a ASIC suspending a MEMS, according to an example. FIG. 23B is a bottom view schematic of the device in FIG. 18A, showing an array of connection points. In this example configuration, the MEMS 2316 is bumped to the ASIC, which is then bumped on top of an interposer frame 2308. The interposer frame 2308 provides an additional layer of separation between the active MEMS elements and the PCB to further reduce the stress on critical components. In the example, a gap 2304 is disposed between the MEMS 2316 and the interposer frame 2308. In an example, plastic encapsulation 2306 is disposed over the interposer frame 2308, the ASIC and the MEMS. In an example, solder 2310 couples pads of the PCB to the interposer frame 2308 in some examples. In an example, underfill 2302 is disposed between the MEMS 2316 and the ASIC, although a seal ring can be used. In an example a cluster of interconnects 2318 interconnect the ASIC and the MEMS.

Figure 24A:
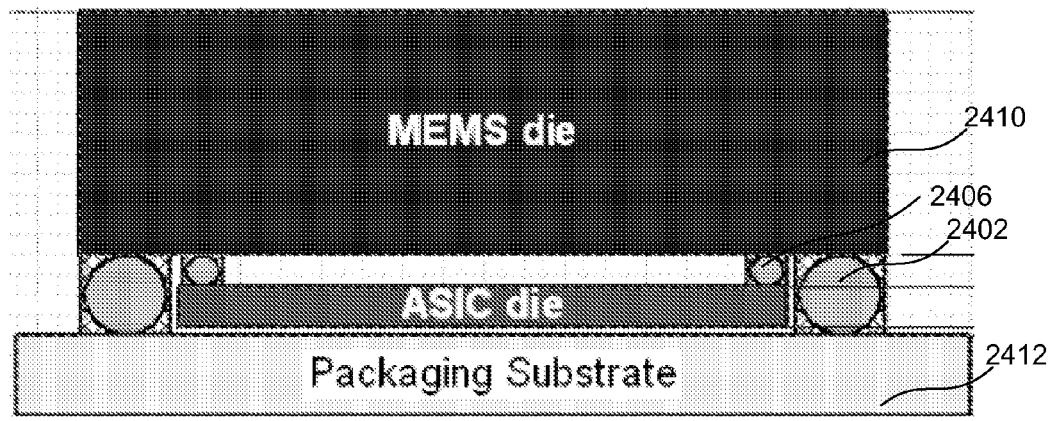
FIG. 24A illustrates a MEMS suspending an ASIC, according to an example.
Figure 24B:
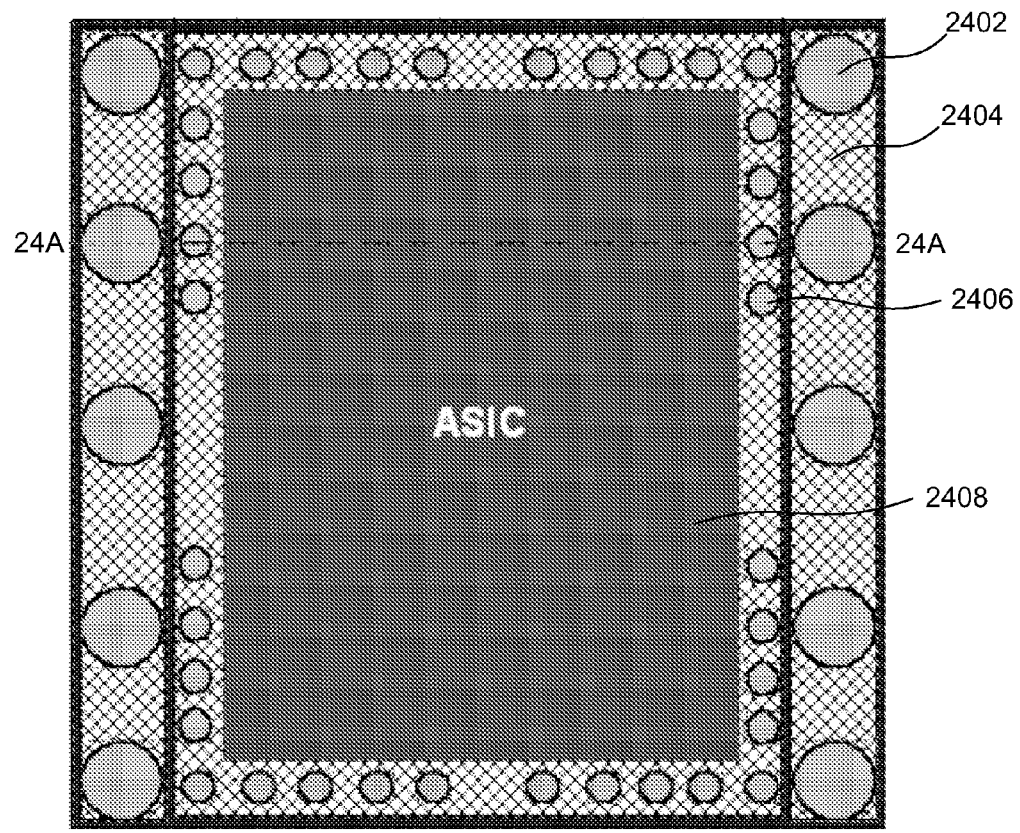
FIG. 24B is a bottom view schematic of the device in FIG. 18A, showing an array of connection points.

FIG. 24A illustrates a MEMS suspending an ASIC, according to an example. FIG. 24B is a bottom view schematic of the device in FIG. 18A, showing an array of connection points. The above figure shows bump configuration that can be implemented in the possum package. In this configuration, an underfill 2404 is localized around the solder bumps 2402 to provide a hermetic seal while to keeping critical MEMS components protected. In the example, a MEMS 2410 is coupled to a packaging substrate 2412 with bumps that include underfill to define a seal. An ASIC 2408 is coupled to the MEMS 2410 with bumps that include underfill to define a seal.

An important feature of many MEMS devices is a hermetic seal that prevents the flow of water into the device. This is especially important in MEMS devices that are solder bumped onto an ASIC. Capacitances across the gap between the MEMS and ASIC are critical to system performance. If water or water vapor seeps into the cavity between the MEMS and the ASIC, these capacitances vary uncontrollably and negatively impact the system.

Protection from packaging stress is equally important. Packaging stress causes critical MEMS components to bend and flex, changing capacitance gaps and flexing springs, resulting in capacitance read out errors and natural frequency shifts. The major source of package stress on MEMS devices is a mismatch of the coefficient of thermal expansion (CTE) between device materials. This is most commonly seen in the CTE mismatch between an organic substrate material (typically FR-4) and a Silicon device. FR-4 has a CTE of ~14 ppm/° C. while Silicon has a CTE of 2.9 ppm/° C. If these two materials are adhered to each other, this CTE mismatch will create stress when the temperature changes.

There are two main ways to protect devices from moisture: inject moisture rejecting epoxy into critical cavities, or completely enclose those critical cavities with a hermetic seal ring. Both of these methods induce significant thermal packaging stresses on critical MEMS components. If an epoxy underfill is used, the epoxy typically doesn't have a good CTE match with Silicon. This introduces thermal stress on the MEMS device. This effect can be somewhat mitigated through the use of Silicon Oxide filler to adjust the overall CTE of the underfill. However, the filler stiffens the underfill which exacerbates a second problem, that a stiff underfill filling the cavity between the MEMS & ASIC creates a hard connection from the MEMS to the ASIC. This transfers all ASIC stresses and deformations to the MEMS, which is a significant problem that greatly harms device performance.

A seal ring eliminates the need for an underfill material, but introduces the same problems in other ways. A hermetic seal ring is a thick metal ring placed under the outer edge of the MEMS device. This large metal ring has a different CTE than Silicon, inducing stress and deformation on the MEMS device under temperature change. The metal ring also provides a hard connection between the MEMS and ASIC. Again, this causes any stress or deformation on the ASIC to transfer to the MEMS, and impacting performance.

For high performance devices that require a hermetic seal that does not impart packaging stress, neither of these solutions is sufficient. A lower stress mechanism is needed.

The disclosed stress reducing or stressless hermetic seal provides a moisture barrier to prevent water from leaking into critical capacitance gaps and impairing the performance of capacitance gaps. The novel design accomplishes this without inducing large packaging stresses as other sealing methods do. The current application in use is a 6 degree of freedom inertial sensor. However, the stressless hermetic seal can easily be implemented in many other MEMS devices requiring a moisture barrier.

One common way to protect this cavity from moisture is to deposit a ring of solder between the MEMS & ASIC surrounding critical device components. However, if there are any package stresses on the ASIC, these stresses will translate to the critical MEMS components unless the stressless hermetic seal stress relief structure is incorporated between the seal ring and the critical components.

By way of several examples, the present subject matter provides structure built into one or more of the MEMS device silicon layers that separates critical device components from any stresses that arise at the interface between the silicon and the seal ring. The seal ring is located away from critical components and stress relief features are etched into the silicon to generate flexible regions that reduce the impact of the mismatched thermal expansion. Examples of the seal are shown in FIGS. 25-27 and other FIGS. that reference a seal.

Figure 25:
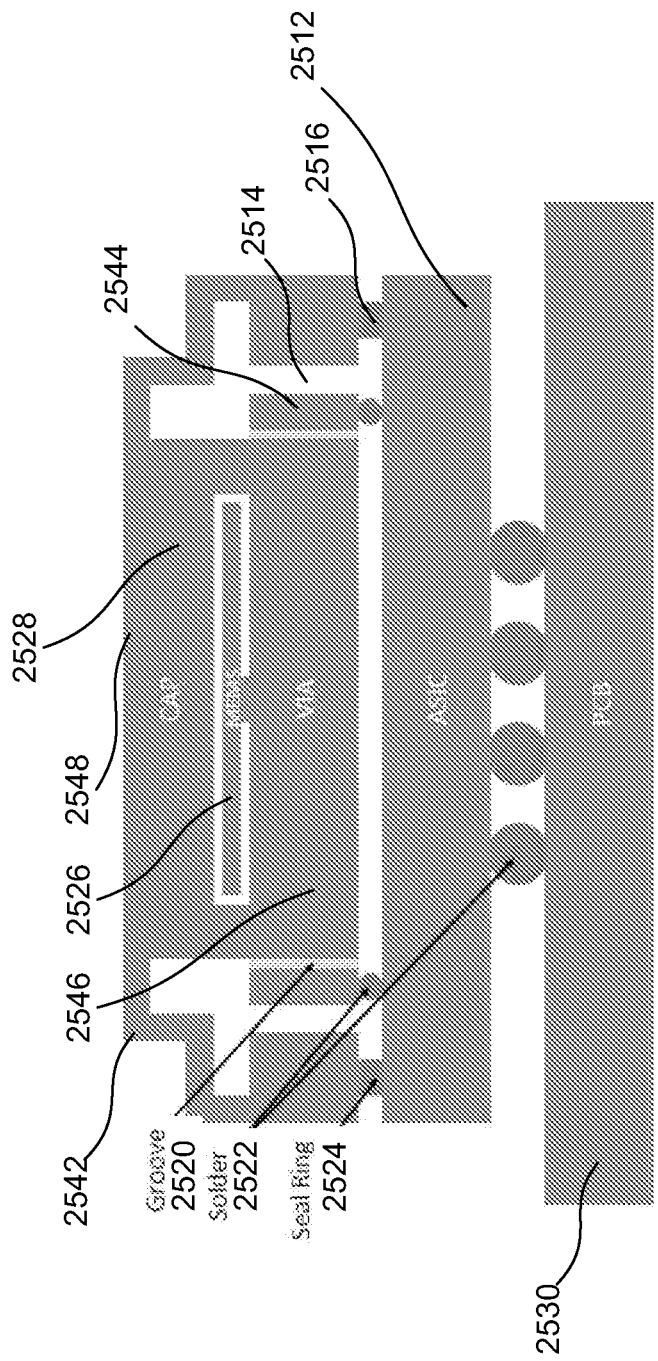
FIG. 25 illustrates a cross-section of a cap including stress-reducing members, according to an example.

FIG. 25 illustrates a cross-section of a cap including stress-reducing members, according to an example. In the example, a MEMS device 2526 is stacked on an ASIC 2512. Stress reduction members are used to interconnect the VIA of the MEMS to the ASIC. Stress reduction members are discussed herein, and define a groove 2520 disposed between the solder interconnects and the main center portion of the via. In an example, the ASIC 2512 is mounted onto the PCB 2530. The stressless hermetic seal is implemented as a flexible bent membrane 2542 manufactured out of multiple layers of silicon.

The MEMS 2526 is attached to the ASIC 2512 so that the stressless hermetic seal provides a moisture barrier without imparting stress onto the active MEMS device. The MEMS/ASIC interconnects can be placed on flexible arms 2544 away from critical MEMS device elements 2526. In an example, the seal ring 2524 surrounds components, including those flexible arms 2544. These arms 2544 freely deform under stress and do not transfer undesired deformation or stress to critical MEMS device components. The seal ring 2524 surrounds desired components and provides hermeticity in the cavity under the MEMS, and the Stressless Hermetic Seal protects the MEMS from any stresses generated in or transferred through the seal ring.

Because mechanical deformation and stress on the ASIC does not harm ASIC performance, the ASIC can be used as an additional layer of separation between the silicon MEMS device and the substrate 2530, such as organic substrate, to further reduce the stress on the MEMS device. Because the stress arises due to differences in thermal expansion and contraction, it is helpful to limit the distance over which the Silicon and FR-4 substrate are connected. To this end, the ASIC/PCB interconnections are clustered as closely as possible at the center of the ASIC, as taught herein.

In an example, the MEMS device is enclosed between a Via wafer 2546 and a cap 2548 to provide both an environmental enclosure for the MEMS and stiff mechanical support to ensure package stresses do not impact the critical MEMS components 2526 within the enclosure. In an example, the solder joints between the via & ASIC wafers are located outside the enclosing box on flexible arms 2544 etched into the via wafer to allow stress and deformation to relax without impacting the enclosed MEMS device. In an example, the seal ring 2524 is attached to a flexible multilayer membrane surrounding the MEMS and flexible arms.

In an example, the stressless hermetic seal uses an etched cap wafer. In an example, these etches provide compliance in both the vertical and horizontal directions to ensure the stress on the seal ring can relax without significant impact on the active MEMS components. Accordingly, any of the interconnection systems disclosed herein, such as stress reducing interconnection systems can be combined with any of the sealing systems disclosed herein.

Figure 26A:
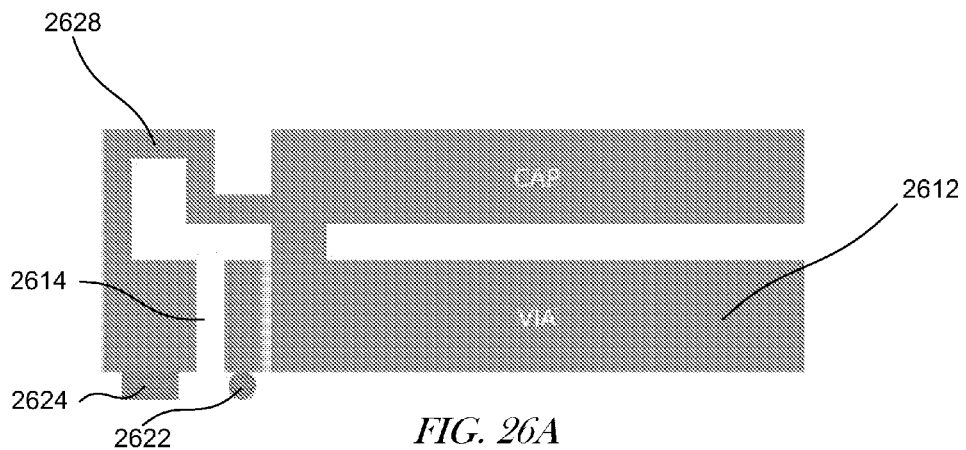
FIG. 26A illustrates a cross-section of a cap including stress-reducing members, according to an example.
Figure 26B:
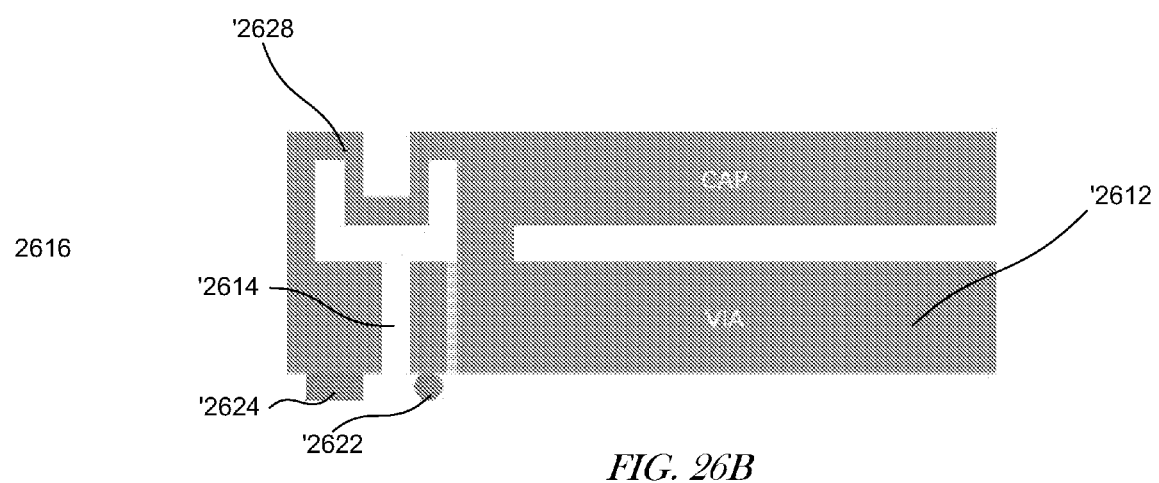
FIG. 26B illustrates a cross-section of a cap including stress-reducing members, according to an example.
Figure 27:
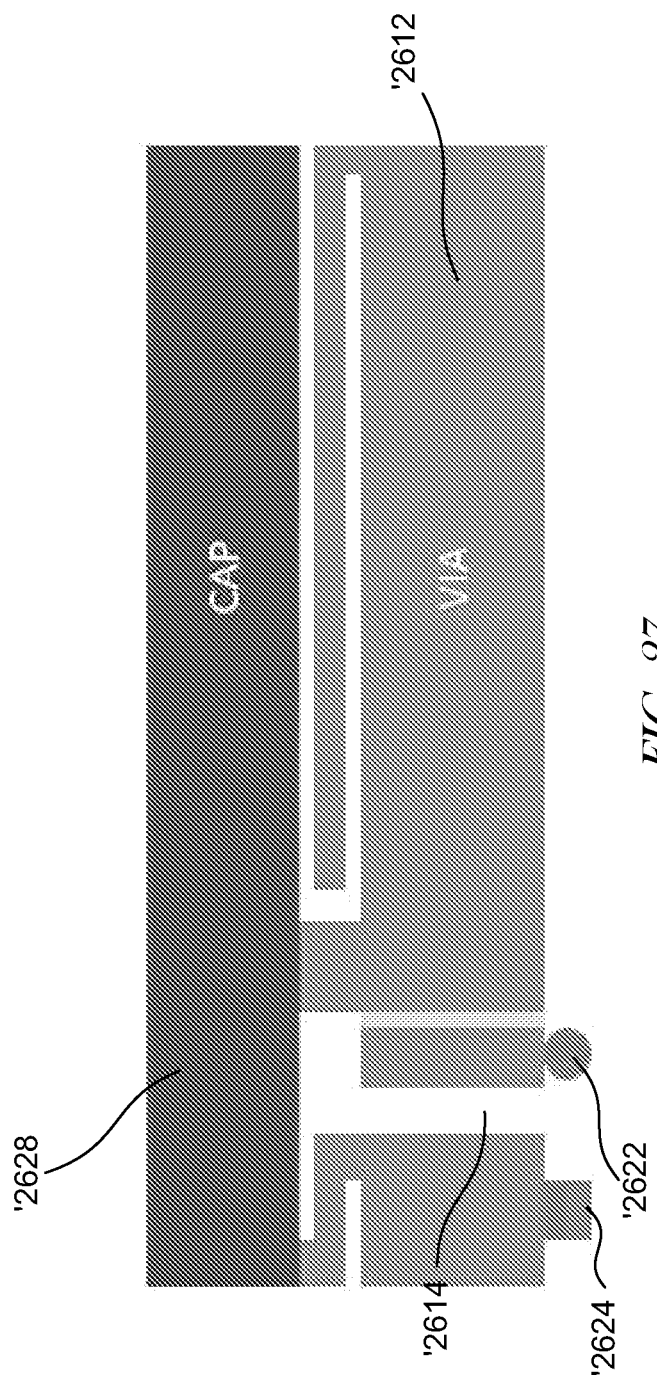
FIG. 27 illustrates a cross-section of a cap coupled to one or more stress-reducing members, according to an example.

FIG. 26A illustrates a cross-section of a cap including stress-reducing members, according to an example. FIG. 26B illustrates a cross-section of a cap including stress-reducing members, according to an example. In an example, this seal ring configuration requires etching of the cap wafer. This configuration enhances the level of compliance by lengthening and increasing the number of flexing sections 2528 of the membrane. A seal ring 2624 is to couple to an ASIC or another components, defining a groove 2614 between the portion of the cap coupled to the sealing ring 2624 and the via 2612. Flexible arms are used to couple solder interconnects 2622 to the via 1612. In an example, this configuration enhances the level of compliance of the previous configuration by adding yet another flexing section to the membrane. In an example, the flexing member extends horizontally away from the cap, vertically up, away from the cap again, and down to the sealing ring.

FIG. 27 illustrates a cross-section of a cap coupled to one or more stress-reducing members, according to an example. This configuration utilizes existing process steps to eliminate the need for additional etching of the cap wafer, while still maintaining vertical and torsional compliance. This configuration enhances the level of compliance by lengthening and increasing the number of flexing sections 2528 of the membrane. A seal ring '2624 is to couple to an ASIC or another components, defining a groove '2614 between the portion of the cap coupled to the sealing ring '2624 and the via '2612. Flexible arms are used to couple solder interconnects '2622 to the via 1612. In an example, this configuration enhances the level of compliance of the previous configuration by adding yet another flexing section to the membrane. In an example, the flexing member extends horizontally away from the cap, vertically down, away from the cap again, vertically up, horizontally away again and down to the sealing ring.

Additional Notes

The present subject matter may be explained by way of example. Example 1 includes an apparatus, comprising an integrated circuit including at least one electrical interconnect disposed on an elongate arm extending away from a main portion of the integrated circuit and a microelectromechanical layer including an oscillating portion, the microelectromechanical layer coupled to the main portion of the integrated circuit.

Example 2 includes the apparatus of example 1, wherein the microelectromechanical layer is bumped onto the integrated circuit.

Example 3 includes the apparatus of any one of examples 1-2, wherein the microelectromechanical layer includes at least one electrical interconnect disposed on a microelectromechanical layer elongate arm extending away from a main portion of the microelectromechanical layer.

Example 4 includes the apparatus of any one of examples 1-3, wherein the microelectromechanical layer includes a via layer that includes the microelectromechanical layer elongate arm, with a slideable microelectromechanical proof-mass coupled to the via.

Example 5 includes the apparatus of any one of examples 1-4, comprising a cluster of electrical interconnects disposed on the integrated circuit to couple the integrated circuit to a substrate.

Example 6 includes the apparatus of example 5, wherein the cluster is centrally disposed on the integrated circuit.

Example 7 includes the apparatus of example 5, wherein the cluster is disposed at a corner of the integrated circuit.

Example 8 includes the apparatus of example 1, comprising a cluster of electrical interconnects centrally disposed on the microelectromechanical layer to couple the microelectromechanical layer to the integrated circuit.

Example 9 includes the apparatus of example 1, wherein the elongate arm is etched and the at least one electrical interconnect includes polymer-core copper.

Example 10 includes the apparatus of example 1, wherein the elongate arm is part of a plurality of elongate arms, wherein for each respective elongate arm on a side of the integrated circuit, there is an opposing elongate are on an opposite side of the integrated circuit.

Example 11 includes a method that includes forming a through-silicon-via in an integrated circuit, stacking the integrated circuit onto a substrate and electrically and physically coupling the integrated circuit to the substrate using a plurality of electrical interconnects, stacking a microelectromechanical layer onto the integrated circuit and electrically and physically coupling the microelectromechanical layer to the integrated circuit such that the microelectromechanical layer is electrically coupled to the substrate via the through-silicon-via.

Example 12 includes the method of example 11, comprising excising a void in the substrate and disposing the microelectromechanical layer at least partially in the void.

Example 13 includes the method of any one of examples 11-12, comprising disposing a seal between the microelectromechanical layer and the integrated circuit to define a hermetically sealed void between the microelectromechanical layer and the integrated circuit.

Example 14 includes the method of example 13, wherein disposing a seal comprising soldering a solder ring.

Example 15 includes the method of example 13, wherein disposing a seal includes disposing underfill.

Example 16 includes an integrated circuit including at least one electrical interconnects disposed on an elongate are extending away from a main portion of the integrated circuit and a microelectromechanical layer including an oscillating portion, the microelectromechanical layer coupled to the main portion of the integrated circuit, wherein the microelectromechanical layer includes a cap comprising a membrane that extends to the integrated circuit.

Example 17 includes the apparatus of example 16, wherein the microelectromechanical layer includes at least one electrical interconnect disposed on a microelectromechanical layer elongate arm extending away from a main portion of the microelectromechanical layer.

Example 18 includes the apparatus of example 18, wherein the microelectromechanical layer includes a via layer that includes the microelectromechanical layer elongate arm, with a slideable microelectromechanical proof-mass coupled to the via.

Example 19 includes the apparatus of any one of examples 16-18, comprising a cluster of electrical interconnects disposed on the integrated circuit to couple the integrated circuit to a substrate.

Example 20 includes the apparatus of example 16, comprising a cluster of electrical interconnects centrally disposed on the microelectromechanical layer to couple the microelectromechanical layer to the integrated circuit.

Example 21 includes the apparatus of example 16, wherein the elongate arm is part of a plurality of elongate arms, wherein for each respective elongate arm on a side of the integrated circuit, there is an opposing elongate are on an opposite side of the integrated circuit.

Example 22 includes the apparatus of example 16, comprising a solder ring disposed between the cap and the integrated circuit to define a hermetic seal between the integrated circuit and the microelectromechanical layer.

Example 23 includes a method that includes forming a through-silicon-via in an integrated circuit, stacking the integrated circuit onto a substrate, electrically and physically coupling the integrated circuit to the substrate using a plurality of electrical interconnects, stacking a microelectromechanical layer onto the integrated circuit and electrically and physically coupling the microelectromechanical layer to the integrated circuit such that the microelectromechanical layer is electrically coupled to the substrate via the through-silicon-via and disposing a seal between the microelectromechanical layer and the integrated circuit to define a hermetically sealed void between the microelectromechanical layer and the integrated circuit.

Example 24 includes the method of example 23, comprising etching a cap of the microelectromechanical layer such that a membrane of the cap extends to a bottom major surface of the microelectromechanical layer and is flush with the bottom major surface.

Example 25 includes the method of example 23, comprising disposing a seal between the membrane and the integrated circuit.

Example 26 includes the method of any one of examples 23-25, comprising etching the integrated circuit to define a plurality of elongate arms that extend away from a main portion of the integrated circuit to which the microelectromechanical layer is coupled, wherein electrically and physically coupling the integrated circuit to the substrate using a plurality of electrical interconnects includes electrically and physically coupling the integrated circuit to the substrate using the plurality of elongate arms.

Example 27 includes the method of example 23, comprising excising a void in the substrate and disposing the microelectromechanical layer at least partially in the void.

Example 28 includes the method of example 23, comprising disposing a seal between the microelectromechanical layer and the integrated circuit to define a hermetically sealed void between the microelectromechanical layer and the integrated circuit.

Example 29 includes the method of example 28, wherein disposing a seal comprising soldering a solder ring.

Example 30 includes the method of example 28, wherein disposing a seal includes disposing underfill.

In the above examples, one or more of a stress reducing feature, a sealing feature or a size reducing feature may be used in combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus, comprising:
a via wafer including a main portion and an elongate arm extending away from the main portion;
a microelectromechanical layer including an oscillating portion, the microelectromechanical layer coupled to the main portion of the via wafer using a central anchor, wherein the central anchor is configured to dispose the microelectromechanical layer away from the via wafer by a gap;
an application specific integrated circuit (ASIC) attached to the elongate arm of the via wafer using a solder interconnect; and
a cap, coupled to the via wafer, configured to enclose the microelectromechanical layer between the cap and the via wafer, wherein the elongate arm is configured to protect the microelectromechanical layer from deformation or stress.

2. The apparatus of claim 1, wherein the ASIC is coupled to a substrate using a cluster of electrical interconnects centrally disposed between the ASIC and the substrate.

3. The apparatus of claim 1, wherein the elongate arm is part of a plurality of elongate arms, wherein for each respective elongate arm on a side of the via wafer, there is an opposing elongate arm on an opposite side of the via wafer.

4. The apparatus of claim 1, comprising a solder ring disposed between the cap and the via wafer to define a hermetic seal between the via wafer and the microelectromechanical layer.

5. The apparatus of claim 1, wherein the microelectromechanical layer is disposed away from the cap by a gap.

6. The apparatus of claim 1, wherein the cap is coupled to the main portion of the via wafer.

7. The apparatus of claim 6, wherein the elongate arm is located outside of the cap.

8. The apparatus of claim 1, wherein the main portion of the via wafer is coplanar to the elongate arm of the via wafer.

9. The apparatus of claim 1, wherein the ASIC separates the microelectromechanical layer from the via wafer.

10. An apparatus, comprising:
a via wafer including a main portion and an elongate arm extending away from the main portion;

a microelectromechanical layer including an oscillating portion, the microelectromechanical layer coupled to the main portion of the via wafer using a central anchor, wherein the central anchor is configured to dispose the microelectromechanical layer away from the via wafer by a gap;

an application specific integrated circuit (ASIC) attached to the elongate arm of the via wafer using a solder interconnect; and a cap, coupled to the via wafer, configured to enclose the microelectromechanical layer between the cap and the via wafer, wherein the elongate arm is configured to protect the microelectromechanical layer from deformation or stress, wherein the elongate arm is part of a plurality of elongate arms, wherein for each respective elongate arm on a side of the via wafer, there is an opposing elongate arm on an opposite side of the via wafer.

11. The apparatus of claim 10, wherein the ASIC is coupled to a substrate using a cluster of electrical interconnects centrally disposed between the ASIC and the substrate.

12. The apparatus of claim 10, comprising a solder ring disposed between the cap and the via wafer to define a hermetic seal between the via wafer and the microelectromechanical layer.

13. The apparatus of claim 10, wherein the microelectromechanical layer is disposed away from the cap by a gap.

14. The apparatus of claim 10, wherein the cap is coupled to the main portion of the via wafer.

15. The apparatus of claim 14, wherein the elongate arm is located outside of the cap.

16. The apparatus of claim 10, wherein the main portion of the via wafer is coplanar to the elongate arm of the via wafer.

17. The apparatus of claim 10, wherein the ASIC separates the microelectromechanical layer from the via wafer.

18. An apparatus, comprising:
a via wafer including a main portion and an elongate arm extending away from the main portion;

a microelectromechanical layer including an oscillating portion, the microelectromechanical layer coupled to the main portion of the via wafer using a central anchor, wherein the central anchor is configured to dispose the microelectromechanical layer away from the via wafer by a gap;

an application specific integrated circuit (ASIC) attached to the elongate arm of the via wafer using a solder interconnect; and a cap, coupled to the via wafer, configured to enclose the microelectromechanical layer between the cap and the via wafer, wherein the elongate arm is configured to protect the microelectromechanical layer from deformation or stress, wherein the ASIC is coupled to a substrate using a cluster of electrical interconnects centrally disposed between the ASIC and the substrate.

19. The apparatus of claim 18, wherein the microelectromechanical layer is disposed away from the cap by a gap, and wherein the cap is coupled to the main portion of the via wafer.

20. The apparatus of claim 18, wherein the elongate arm is part of a plurality of elongate arms, wherein for each respective elongate arm on a side of the via wafer, there is an opposing elongate arm on an opposite side of the via wafer, and wherein the ASIC is coupled to a substrate using a cluster of electrical interconnects centrally disposed between the ASIC and the substrate.

* * * * *